United States Patent
Kusunoki et al.

(10) Patent No.: US 6,471,929 B1
(45) Date of Patent: Oct. 29, 2002

(54) PHOTOCATALYST, MANUFACTURING METHOD THEREFOR, AND GAS DECOMPOSITION METHOD

(75) Inventors: Misao Kusunoki, Kanagawa; Tomikazu Watanabe, Tokyo; Shigehide Yamamichi, Kanagawa; Masafumi Ata, Kanagawa; Shinichi Mizuno, Kanagawa; Matthias Ramm, Kanagawa, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/597,147

(22) Filed: Jun. 20, 2000

(30) Foreign Application Priority Data

Jun. 25, 1999 (JP) .......................................... 11-179291
Jan. 14, 2000 (JP) ....................................... 2000-005116

(51) Int. Cl.[7] ................................................. B01J 8/00
(52) U.S. Cl. ............ 423/245.3; 423/247; 423/DIG. 39; 423/DIG. 40; 502/185
(58) Field of Search .......................... 423/245.1, 245.3, 423/246, 247, 445 B, DIG. 39, DIG. 40; 422/186.3, 211, 232; 502/185, 326, 522, 527.11

(56) References Cited

FOREIGN PATENT DOCUMENTS

| JP | 0545 079 A1 | 6/1993 | .......... C01B/31/02 |
|----|---|---|---|
| JP | 408059220 A | * 8/1994 | .......... C01B/31/02 |
| JP | 11010006 | 1/1999 | .......... B01J/35/02 |
| JP | 11092120 | 4/1999 | .......... B01J/21/18 |
| JP | 11157819 | 6/1999 | .......... B01J/19/12 |
| JP | 2991195 | 2/2000 | ............. A61L/9/00 |

* cited by examiner

Primary Examiner—Steven P. Griffin
Assistant Examiner—Maribel Medina Sanabria
(74) Attorney, Agent, or Firm—Sonneschein, Nath & Rosenthal

(57) ABSTRACT

A photocatalyst having superior durability; a manufacturing method for the photocatalyst and a method and apparatus for decomposing a gas, where a film which is fullerene-based but different from the evaporated fullerene film is used. The photocatalyst has a fullerene polymer film layered on a substrate. There may be carried fine metal particles on the fullerene polymer film. These fine metal particles are carried by sputtering, evaporation or coating on the fullerene polymer film. The apparatus for decomposing the gas includes a light source and a fullerene polymer film. In effecting gas decomposition, the gas to be processed is contacted with the fullerene polymer film under light illumination.

26 Claims, 46 Drawing Sheets

MOLECULAR STRUCTUR OF $C_{60}$

MOLECULAR STRUCTUR OF $C_{60}$

MOLECULAR STRUCTUR OF $C_{70}$

VACUUM DEPOSITION DEVICE

[2+2] 1, 2-$(C_{60})_2$ BY CYCLE ADDITION REACTION $D_{2h}$- SYMMETRICAL $C_{116}$

C₁₂₀(b)

$C_{120}(c)$

C_{120} (d)

$C_{118}$ $C_{116}$

MOST STABLE INITIAL POLYMER $C_{70}$
STRUCTURE BY [2+2] CYCLOADDITION REACTION

MORE STABLE $C_{136}$ MOLECULAR
STRUCTURE GENERATED IN
STRUCTURE RELAXATION PROCESS $C_{140}$ (a)

C_{140} (b)

$C_{140}$ (c)

$C_{140}$ (d)

$C_{140}$ (e)

C_{140} (f)

$C_{140}$ (g)

$C_{140}$ (h)

C₁₄₀ (i) (D₂₃ SYM)

C_{136} (a)

$C_{136}$ (b)

C_{136} (c)

$C_{136}$ (d)

C₁₃₆ (e)

C₁₃₆ (f)

C<sub>136</sub> (g)

C_{136} (h)

C_136 (i)

APPARATUS FOR YIELDING
FULLERENE MOLECULES BASED
ON ARC DISCHARGE METHOD

VACUUM DEPOSITION HIGH FREQUENCY PLASMA POLYMERIZATION APPARATUS

HIGH FREQUENCY PLASMA POLYMERIZATION APPARATUS

ELECTROLYTIC POLYMERIZATION APPARATUS

PHOTOCATALYST, MANUFACTURING METHOD THEREFOR, AND GAS DECOMPOSITION METHOD

RELATED APPLICATION DATA

The present application claims priority to Japanese Application No. P11-179291 filed Jun. 25, 1999 and Japanese Patent Application P2000-005116 filed Jan. 14, 2000 which applications are incorporated herein by reference to the extent permitted by law.

BACKGROUND OF THE INVENTION

1. Field of the Invention

This invention relates to a photocatalyst, employing fullerene as a material, a manufacturing method for the photocatalyst, and a gas decomposition method and apparatus employing the photocatalyst.

2. Description of Prior Art

For reducing harmful ingredients in air, such as aldehyde or carbon monoxide, a photocatalyst composed of fullerene as a main material has recently been developed.

That is, evaporated film of fullerene is known to exhibit a catalytic action of decomposing harmful ingredients on light irradiation.

However, this fullerene is not fully satisfactory mainly with respect to durability. Before explaining the reason therefor, it is felt to be necessary to consider the historical background of development of the material fullerene.

Fullerene is a series of carbon compounds composed only of carbon atoms, as is diamond or graphite. The existence of fullerene was confirmed in the eighties. That is, it was found in 1985 in a mass analysis spectrum of a cluster beam by laser ablation of carbon. It was, however, five years later that the manufacturing method in reality was established. Specifically, a manufacturing method for fullerene (C60) by arc discharge of a carbon electrode was first found in 1990. Since then, fullerene is attracting notice as a carbonaceous semiconductor material (see Kratschmer, W., Fostiropoulos, K, Huffman D. R. Chem. Phys. Lett. 1990, 170, 167. Kratschmer, W. Lamb L. D., Fostiropoulod. K, Huffman, D. R. Nature 1990, 347,354).

Fullerene is a spherical carbon Cn (n=60, 709, 76, 78, 80, 82,84, . . . ) which is a molecular aggregate resulting from spherical aggregation of an even number not less than 60 of carbon atoms. Representative of the fullerenes is C60 with 60 carbon atoms as aforesaid and C70 with 70 carbon atoms. Of these, the C60 fullerene is of a polyhedral structure termed frusto-icosahedron obtained on cutting off the apices of the regular icosahedron to yield a regular pentagon. Thus, the C60 fullerene has a molecular structure of what may be termed a soccer ball type in which its 60 apices are all occupied by carbon atoms. On the other hand, C70 has what may be termed a rugby ball type molecular structure.

In a C60 crystal, C60 molecules are arranged in a face-centered cubic structure. It has a band gap of approximately 1.6 eV and may be deemed as a semiconductor. In an intrinsic state, it has an electrical resistance of approximately 1014 $\Omega$/cm at 500° C. It has a vapor pressure of approximately 1 mm Torr and, on sublimation, it is capable of vapor depositing a thin film. Not only C60 but other forms of the fullerene are readily vaporized in vacuum or under reduced pressure and hence are able to yield an evaporated film easily.

However, the molecules of fullerene forms, such as C60 or C70, the most mass-producible, are of zero dipole moment, such that evaporated films produced therefrom are fragile in strength, because only the Van der Waals force acts between its molecules. Thus, if the evaporated film is exposed to air, molecules of oxygen or water tend to be diffused and intruded into the gap between the fullerene molecules (FIG. 2), as a result of which the evaporated film is not only deteriorated in structure but adverse effects may be occasionally produced in its electronic properties.

This fragility of the fullerene poses a problem that is not negligible mainly in durability when the film is utilized for a photocatalyst discussed above.

OBJECT AND SUMMARY OF THE INVENTION

It is therefore an object of the present invention to provide a photocatalyst, having superior durability, ascribable to the use of a film belonging to the fullerene series but different from the evaporated film, a manufacturing method for the photocatalyst, and a gas decomposition method and apparatus employing the photocatalyst.

The present invention provides a photocatalyst having a fullerene polymer film.

The present invention also provides a method for producing a photocatalyst including forming the fullerene polymer film by polymerizing fullerene molecules by electron beam polymerization, electromagnetic wave polymerization or electronic polymerization, and getting fine metal particles carried by sputtering, evaporation or coating on the surface of the fullerene polymer film.

The present invention also provides a method for producing a fullerene polymer including evaporating fullerene molecules, and illuminating electromagnetic waves, such as RF plasma, thereon, to polymerize the fullerene molecules, and a manufacturing method for a functional element employing the fullerene polymer film as a functional element constituting layer.

The present invention also provides a gas decomposition apparatus including a light source, and a fullerene polymer film contacted with a gas for decomposition.

The present invention also provides a gas decomposition method including contacting a gas for decomposition with a fullerene polymer film under light illumination.

The fullerene polymer film employed in the present invention is formed from fullerene molecules as a starting material, by e.g., electromagnetic polymerization method, such as plasma polymerization or microwave polymerization, as later explained. The fullerene molecules are polymerized through the state of electronic excitation.

This fullerene polymer film has a film structure in which fullerene molecules are strongly bonded together by covalent bonds, as shown in FIGS. 3 and 4, and is appreciably higher in strength than the fullerene polymer film, while being dense and pliable. If the film is exposed to air, oxygen or water molecules can hardly be intruded into the inside of the film in distinction from the evaporated film. Therefore, the fullerene polymer film is a fullerene based material having superior durability. The evaporated film tends to lose its properties, evaluated in air, in approximately one day, whereas, if the evaporated film is polymerized, its properties are hardly changed even after lapse of one month.

Also, with the fullerene polymer, functional element and the method for producing the fullerene polymer or the functional element, according to the present invention, an evaporated film of fullerene molecules is first formed and polymerized on irradiation of electromagnetic waves. Thus, the thickness of the evaporated film can be measured with a film thickness meter to control the evaporation conditions, such as evaporation temperature, based on the measured information, to form a desired evaporated film at all times. Therefore, the film thickness of the fullerene polymer film by irradiation of electromagnetic waves can be easily and correctly controlled to realize a desired film thickness at all times.

Moreover, since the evaporated fullerene film undergoes polymerization, on irradiation with the electromagnetic waves, as the structure of the fullerene molecules of the evaporated film is maintained, it is possible to realize a fullerene polymer film of a neat structure having the fullerene molecule skeleton. If an organic film is present in the underlying layer, it is not damaged by the evaporated film formed thereon. In addition, due to the presence of the evaporated film, the underlaying layer can also be protected against radiation of the electromagnetic waves.

Similarly to the evaporated fullerene film, the fullerene polymer film is made up of fullerene molecules, so that the fullerene polymer film exhibits the catalytic action by light irradiation.

The effect of light irradiation on the fullerene has been investigated meticulously since the establishment of the manufacturing method in 1990.

Most noteworthy is the fact that, on electronic excitation on light irradiation, the fullerene is first excited from the ground state to the excited single state, after which it can readily undergo inter-state intersection to the electronically excited triplet state. The electronically excited low-energy state of the fullerene may be deemed to be a singlet ($\pi$–$\pi^*$) state. In a molecule of planar $\pi$-covalent system, the inter-state intersection between the singlet ($\pi$–$\pi^*$) state and the triplet ($\pi$–$\pi^*$) state is a ban, whereas, with the fullerene molecules, the $\sigma$ and $\pi$ trajectories cease to cross each other due to the radii of curvature thereof. Stated differently, the $\sigma$ and $\pi$ trajectories are mixed together to contribute to inter-state intersection between different spin multiplicities by spin trajectory interaction. Among different fullerene molecules, C60 is known to be high in the inter-state intersection probability.

If the fullerene is contacted with oxygen, the energy is transferred from the fullerene of the excited triplet state to the site of contact. On reception of this energy, oxygen transfers through the ground triplet state to the excited singlet state. This oxygen in an unstable state is termed active oxygen.

Since the photocatalyst of the present invention has a fullerene polymer film, if its surface is contacted with the gas for processing, such as the gas containing harmful ingredients in air, there occurs the above-mentioned catalytic action on the film surface, by the light illumination, thus decomposing the harmful ingredients in the gas for processing. The evaporated film is problematic in that oxygen molecules diffused and invaded into the molecular interstices are activated to produce the phenomenon of oxidation in the inside of the film, that is decomposition of the harmful ingredients, so that the evaporated film is lowered in its catalytic action and hence in durability due to the produced gas ingredients.

In the present invention, such a photocatalyst carrying fine metal particles of, for example, platinum or palladium, on the surface of the fullerene polymer film, is preferred. In such case, the catalytic effect is better than if no metal particles are carried on the catalyst surface.

The film can be deposited on the fullerene polymer film by such techniques as sputtering, evaporation or coating.

The gas decomposition apparatus according to the present invention at least includes a light source and a fullerene polymer film and is able to decompose the gas for processing containing harmful components by having the gas for processing contacted with the fullerene polymer film under light irradiation.

The photocatalyst according to the present invention, employing the fullerene polymer film, is far better in durability than the photocatalyst employing a fullerene polymer film. This effect can be further improved by having fine metal particles carried on the fullerene polymer film by sputtering, evaporation or coating. In the gas decomposition apparatus according to the present invention, having the fullerene polymer film and the light source, the gas for processing is contacted with the fullerene polymer film under light illumination, so that harmful or polluting substances, such as aldehyde or carbon monoxide, can be decomposed effectively.

Also, according to the present invention, in which the evaporated film of the fullerene molecules is first formed and subsequently polymerized on irradiation of the electromagnetic waves, desired evaporated films can be formed by measuring the evaporated film thickness by a film thickness meter and by controlling the evaporation conditions, such as evaporation temperature, and hence the film thickness of the fullerene polymer film by irradiation of the electromagnetic waves can be easily accurately controlled to produce the desired film thickness.

In addition, the evaporated fullerene film undergoes polymerization, on irradiation of the electromagnetic waves, as the structure of the fullerene molecules is maintained, as a result of which a fullerene polymer film of a neat structure may be formed which retains the fullerene molecular skeleton. If an organic acid etc. is present in an underlayer, the underlayer is not damaged by the overlying evaporated film. On the other hand, the underlying layer can be protected from the radiation of the electromagnetic waves by the evaporated film.

BRIEF DESCRIPTION OF THE DRAWINGS

FIG. 1A shows the molecular structure of C60 and FIG. 1B shows that of C70.

FIG. 6A shows a layered structure made up of a fullerene polymer film and a substrate and FIG. 6B shows a layered structure of fine metal particles carried on the fullerene polymer film.

FIG. 7A shows a layered structure made up of a fullerene polymer film and a substrate and FIG. 7B shows the process for polymerizing the evaporated film of fullerene.

DESCRIPTION OF THE PREFERRED EMBODIMENTS

Figure 1A:
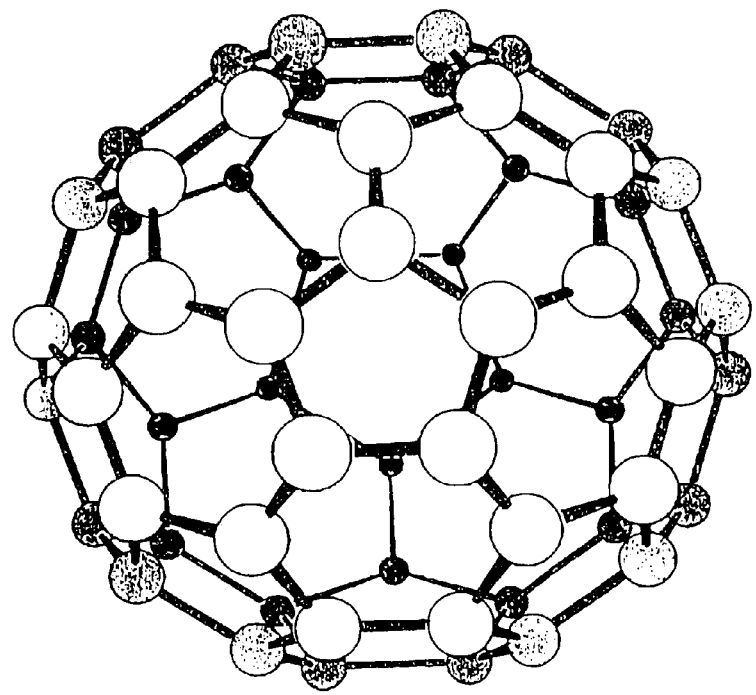
FIGS. 1A and 1B schematic views showing the molecular structure of fullerene, where

Referring to the drawings, preferred embodiments of according to the present invention will be explained in detail.

A photocatalyst according to the present invention is preferably of such a structure in which a fullerene polymer film is layered on a substrate 1, such as a base plate. This fullerene polymer film may be formed on the substrate by an electron beam polymerization method, an electromagnetic wave polymerization method or an electronic polymerization method.

Figure 7A:
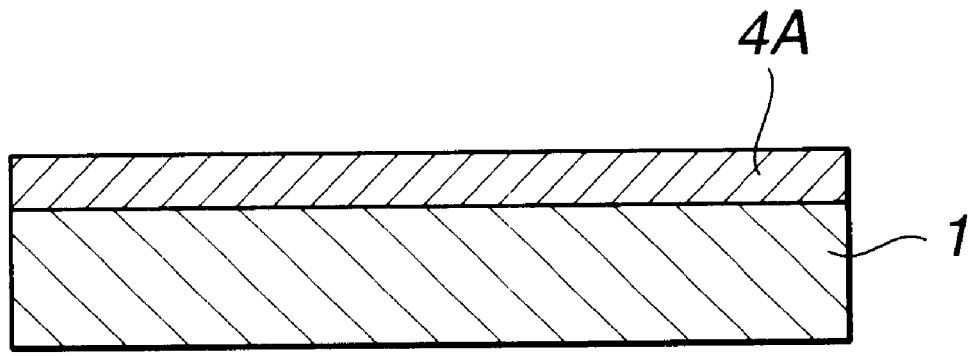
FIGS. 7A and 7B are cross-sectional views illustrating the manufacturing process for another photocatalyst according to the present invention, where
Figure 7B:
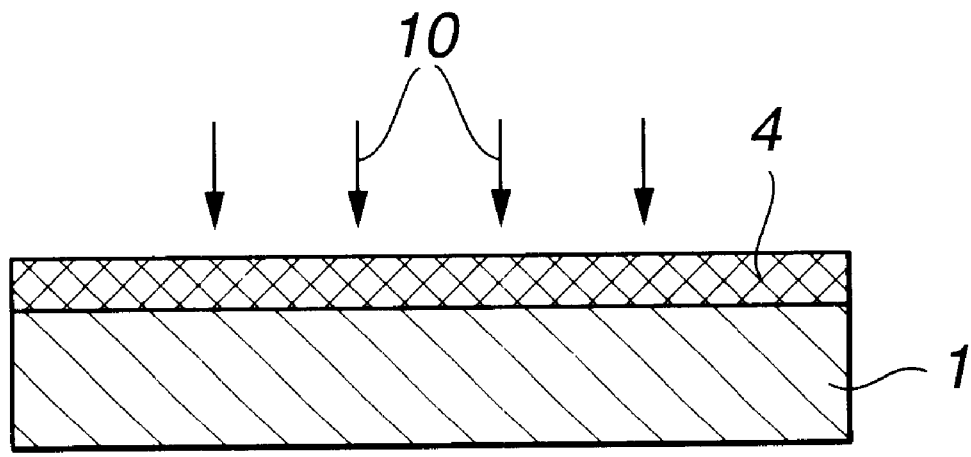

According to the present invention, it is also possible to form a fullerene polymer film 4 by forming the film thickness of an evaporated film 4A of fullerene molecules, such as C60, on the substrate 1, measuring the film thickness of the evaporated film 4A during evaporation to control the film thickness to, for example, 10 Å to 200 nm, in terms of the thickness of a mono-atomic layer, to form an evaporated film of a predetermined thickness, and then by illuminating an electromagnetic wave 10, such as RF plasma, as shown in FIG. 7B, to polymerize the evaporated film 4A to form the fullerene polymer film 4.

Figure 6A:
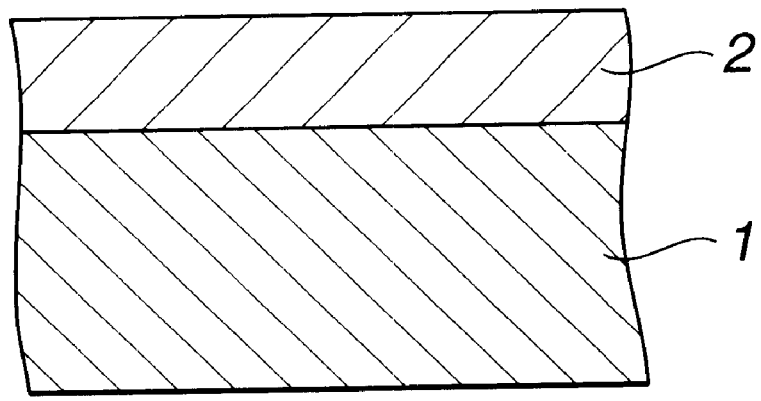
FIGS. 6A and 6B show a cross-sectional structure of a photocatalyst of the present invention, where
Figure 6B:
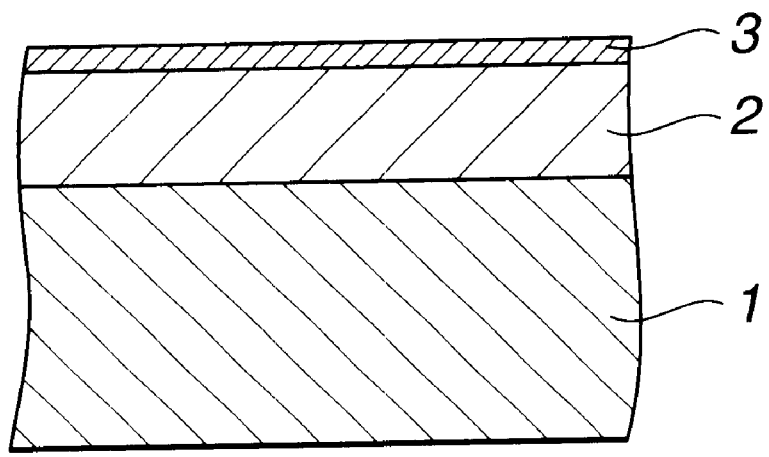

A desirable photocatalyst of the present invention is the fullerene polymer film 2 and fine metal particles 3, such as fine particles of platinum or palladium, carried thereon, as shown in FIG. 6B. In such structure, the fine metal particles 3 operate as active points and as a local reaction battery on the fullerene polymer film 2, so that the catalytic effect is improved as compared to that when the photocatalyst is formed only of the fullerene polymer film.

There is no particular limitation to the fine metal particles. Thus, in addition to platinum and palladium, gold or alkali metals may also be used. Preferred are fine metal particles exhibiting moderate activity. That is, neither excessively high activity nor excessively low activity is desirable. In this respect, the aforementioned platinum and palladium are most desirable.

In having the fine metal particles carried on the fullerene polymer film, such techniques as sputtering, vacuum deposition or coating may preferably be used.

There is no particular limitation to the distribution state of the fine metal particles on the fullerene polymer film. Preferred is the state of distribution in which individual fine particles are not separated but are aggregated in a film shape. As the area ratio of the fine metal particles, it is desirable that fine metal particles with a particle size of 0.5 nm to 100 $\mu$m be distributed at a ratio of 1000000/m$^2$ on the fullerene polymer film.

If the photocatalyst of the present invention is used in processing a gas to be decomposed, it is necessary that the fullerene polymer film be contacted with the gas for decomposition and be irradiated with light. Therefore, in the gas decomposition apparatus according to the present invention, it is necessary to use a photocatalyst comprised of a fullerene polymer film carrying or not carrying metal particles. In this consideration, the history of development of the fullerene polymer film, its polymerization mechanism and the polymerization or film-forming method are discussed in detail.

For overcoming the weak points the fullerene polymer film, described above, the method of producing a so-called fullerene polymer consisting in polymerizing fullerene molecules has been proposed. Typical of these methods is a method of forming a fullerene polymer film by light excitation [see (a) Rao, A. M., Zhou, P, Wang., K. A, Hager., G. T., Holden, J. M., Wang, Y., Lee, W. T., Bi, X, X., Eklund, P. C., Comet, D. S., Duncane, M. A., Amster, I. J., Duncane, M. A., Rao, A. M., Eklund, P. C., J. Phys. Chem. 1993, 97,5036, (c) Li. J., Ozawa, M., Kino, N, Yoshizawa, T., Mitsuki, T., Horiuchi, H., Tachikawa, O; Kishio, K., Kitazawa, K., Chem. Phys. Lett. 1994, 227, 572].

In these methods, in which light is illuminated on a previously formed evaporated fullerene film, numerous cracks tend to be formed in the film surface due to volumetric contraction produced in polymerization, so that produced films are problematic in strength. Moreover, it is extremely difficult to form a uniform thin film of a large surface area.

It has also been known to apply pressure or heat to fullerene molecules or to cause collision of fullerene molecules against one another. It is however difficult to produce a thin film, even though it is possible to form a film (see, for a molecule collision method, (a) Yeretzian, C., Hansen, K., Diedrich, F., Whetten, R. L., Nature 1992, 359,44, (b) Wheten, R. L., Yeretzian, C., Int. J. Multi-layered optical disc. Phys. 1992, B6,3801, (c) Hansen, K., Yeretzian, C., Whetten, R. L., Chem. Phys. Lett. 1994, 218,462, and (d) Seifert, G., Schmidt, R., Int. J. Multi-layered optical disc. Phys. 1992, B6,3845; for an ion beam method, (a) Seraphin, S., Zhou, D., Jiao, J. J. Master. Res. 1993, 8,1995, (b) Gaber, H., Busmann, H. G., Hiss, R., Hertel, I. V., Romberg, H., Fink, J., Bruder, F., Brenn, R. J. Phys. Chem., 1993, 97,8244; for a pressure method, (a) Duclos, S. J., Brister, K., Haddon, R. C., Kortan, A. R., Thiel, F. A. Nature 1991,351, 380, (b) Snoke, D. W., Raptis, Y. S., Syassen, K. 1 Phys. Rev. 1992, B45, 14419, (c) Yamazaki, H., Yoshida, M., Kakudate, Y., Usuda, S., Yokoi, H., Fujiwara, S., Aoki, K., Ruoff, R., Malhotra, R., Lorents, D. J., Phys. Chem. 1993,97, 11161, and (d) Rao, C. N. R., Govindaraj, A., Aiyer, H. N., Seshadri, R. J. Phys. Chem. 1995, 99,16814).

Figure 4:
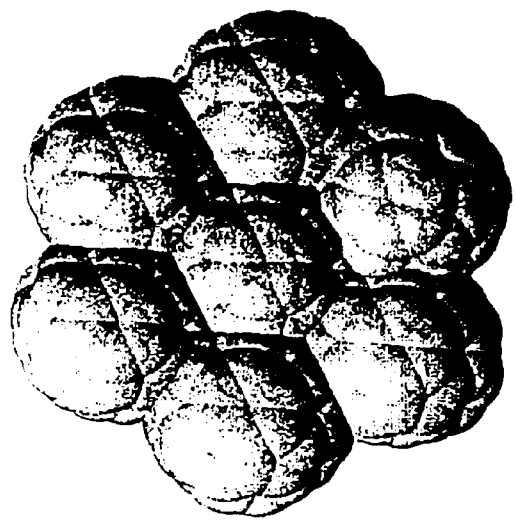
FIG. 4 shows an illustrative structure of a C60 polymer.
Figure 3:
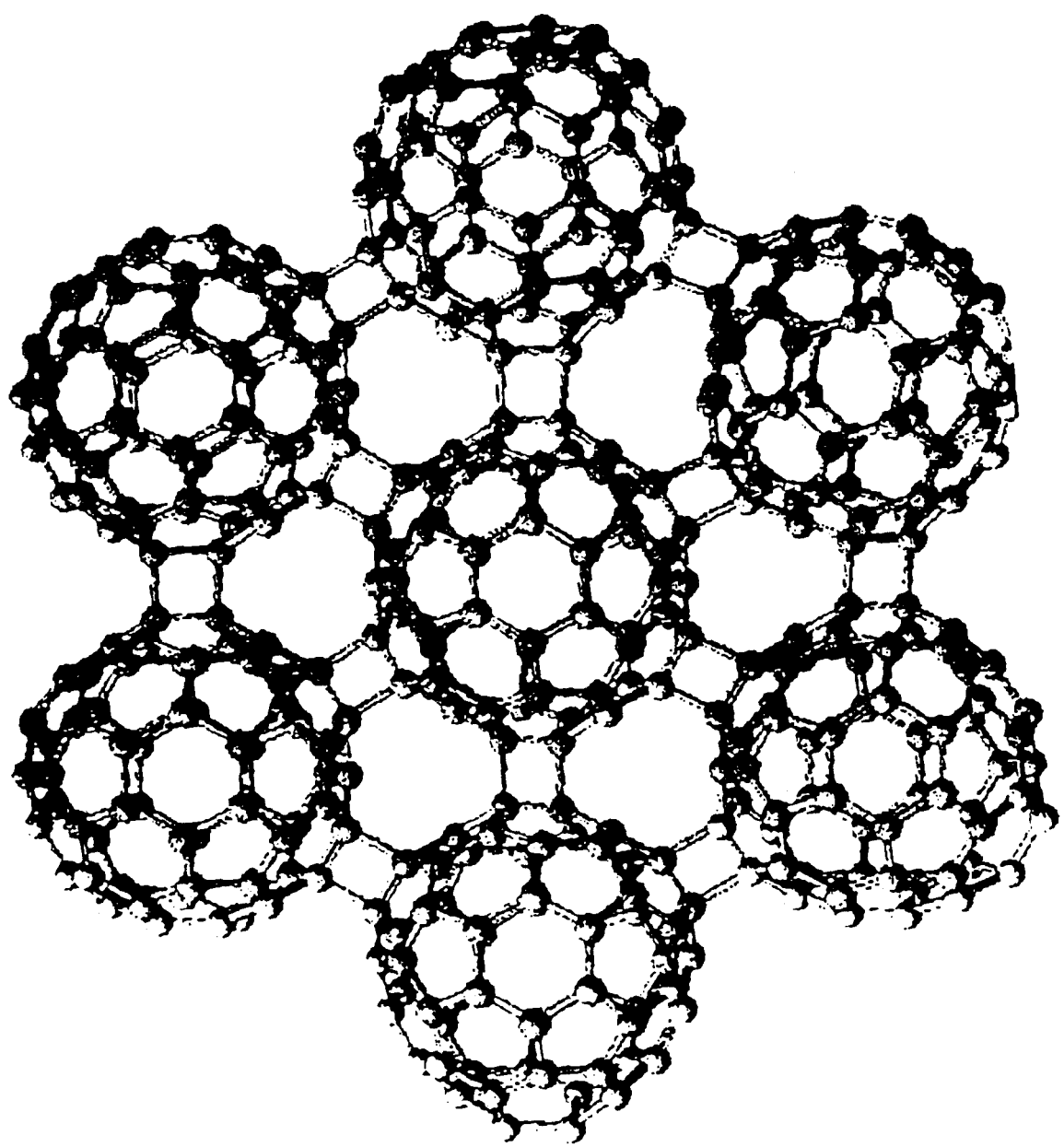
FIG. 3 shows an illustrative structure of a C60 polymer.
Figure 5:
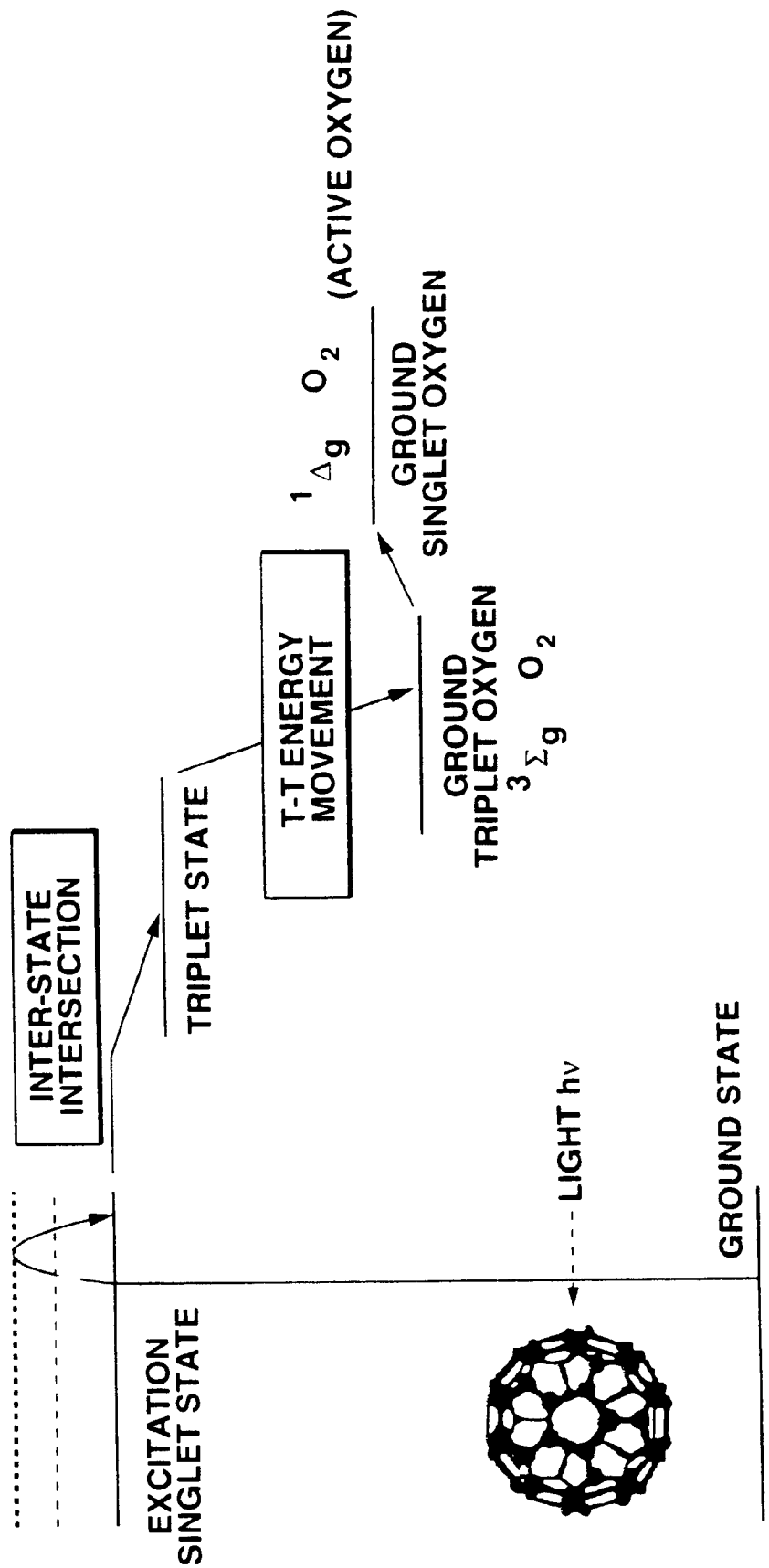
FIG. 5 is a schematic view showing an energy band of fullerene.

Noteworthy as a fullerene polymerization method or film-forming method, which should take the pace of the above-enumerated fullerene polymerization methods, is the plasma polymerization method or the micro-wave (plasma) polymerization method, previously proposed by the present inventors in e.g., Takahashi, N., Dock, H. or in Matsuzawa, N., Ata M. J., Appl. Phys. 1993, 74,5790. The fullerene polymer film, obtained by these methods (see FIGS. 3 and 4), are thin films produced on polymerization of the fullerene molecules through an electronic excited state. It is appreciably increased in strength in comparison with the evaporated thin fullerene film, dense and high in pliability. Since the fullerene polymer film is scarcely changed in its electronic properties in vacuum or in air, it may be premeditated that its dense thin-film properties effectively suppress diffusion or intrusion of oxygen molecules into the inside of the film. In reality, generation of a fullerene polymer constituting the thin film by these methods may be demonstrated by the time-of-flight mass spectrometry.

Irrespective of the type of the plasma method, electron properties of a fullerene polymer film possibly depend appreciably on its polymerization configuration. In reality, the results of mass spectrometry of the C60 polymer film, obtained by the micro-wave plasma method, bear strong resemblance to those of the C60 argon plasma polymer thin film, previously reported by the present inventors [see Ata, M., Takahashi, N., Nojima, K., J. Phys. Chem. 1994, 98, 9960, Ata, M., Kurihara, K., Takahashi, J. Phys., Chem., B., 1996, 101,5].

The fine-textured structure of the fullerene polymer may be estimated by the pulse laser excited time-of-flight mass spectrometry (TOF-MS). In general, there is known a matrix assist method as a method for non-destructively measuring the high molecular polymer. However, lacking the solvent capable of dissolving the fullerene polymer, it is difficult to directly evaluate the actual molecular weight distribution of the polymer. Even with the mass evaluation by Laser Desorption Ionization Time-of-Fight Mass Spectroscopy LDITOF-MS, it is difficult to make correct evaluation of the mass distribution of an actual fullerene polymer due to the absence of suitable solvents or to the reaction taking place between C60 and the matrix molecule.

The structure of the C60 polymer can be inferred from the profile of a dimer or the peak of the polymer of LDITOF-MS, as observed in the ablation of such a laser power as not to cause polymerization of C60. For example, LDITOF-MS of a C60 polymer film, obtained with a plasma power of e.g., 50 W, indicates that the polymerization of C60 molecules is most likely to take place through a process accompanied by loss of four carbon atoms. That is, in the mass range of a dimer, C120 is a minor product, whilst C116 is produced with the highest probability.

Figure 10:
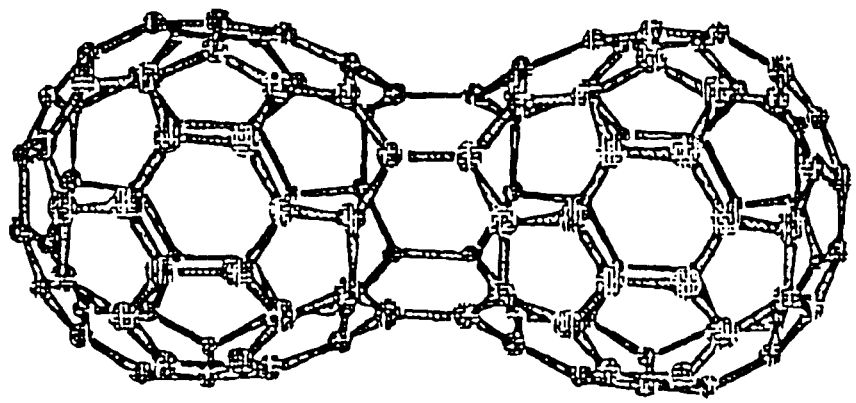
FIG. 10 shows a dimeric structure of another C60 molecule felt to be produced in the fullerene polymer generating process.

According to semi-empiric C60 dimer calculations, this C116 may be presumed to be D2h symmetrical C116 shown in FIG. 10. This may be obtained by C58 recombination. It is reported that this C58 is yielded on desorption of C2 from the high electronic excited state including the ionized state of C60 [(a) Fieber-Erdmann, M., et al., Phys. D. 1993, 26,308 (b) Petrie, S. et al., Nature Chem. Phys. Lett. 1993, 216,399].

Figure 9:
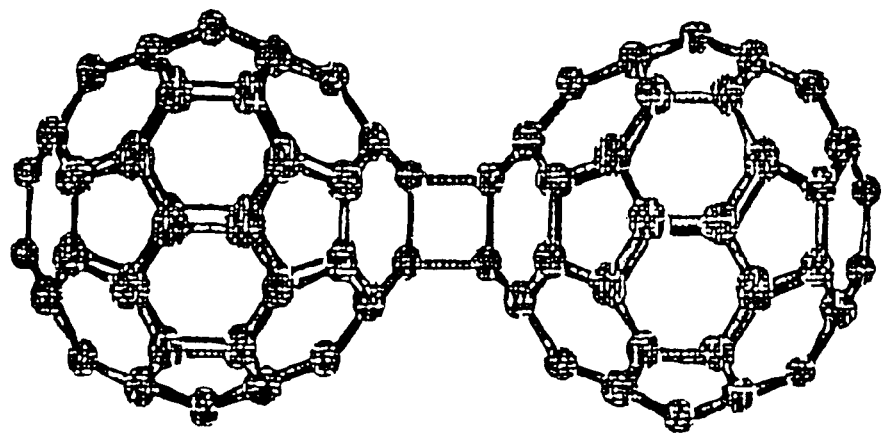
FIG. 9 shows a dimeric structure of a C60 molecule felt to be produced in the fullerene polymer generating process.

If, before transition to a structure comprised of two neighboring five-membered rings, this open-shell C58 molecules are combined with two molecules, C116 shown in FIG. 10 is produced. However, according to the notion of the present inventors, it is after all the [2+2] cycloaddition reaction by the excitation triplex mechanism in the initial process of the C60 plasma polymerization. The reaction product is shown in FIG. 9. On the other hand, the yielding of C116 with the highest probability as mentioned above is possibly ascribable to desorption of four SP3 carbons constituting a cyclobutane of (C69)2 yielded by the [2+2] cycloaddition from the excited triplet electronic state of C60 and to recombination of two C58 open-shell molecules, as shown in FIG. 9.

If a powerful pulsed laser light beam is illuminated on a C60 fine crystal on an ionization target of TOF-Ms, as an example, polymerization of fullerene molecules occurs through the excited electronic state, as in the case of the micro-wave plasma polymerization method. At this time, ions of C58, C56 etc are also observed along with peaks of the C60 photopolymer.

However, since no fragment ions, such as $C58^{2+}$ or $C^{2+}$ are observed, direct fragmentation from $C60^{3+}$ to $C58^{2+}$ and to $C^{2+}$, such as is discussed in the literature of Fieber-Erdmann, cannot be thought to occur in this case. Also, if C60 is vaporized in a C2F4 gas plasma to form a film, only addition products of fragment ions of F or C2F4 of C60 are observed in the LDITOF-MS, while no C60 polymer is observed. Thus, the LDITOF-MS, for which no C60 polymer is observed, has a feature that no C58 nor C56 ions are observed. These results of observation support the fact that C2 loss occurs through a C60 polymer.

The next problem posed is whether or not the C2 loss is directly caused from 1,2-(C60) 2 produced by the [2+2] cycloaddition reaction shown in FIG. 9. Murry and Osawa et al proposed and explained the process of structure relaxation of 1,2-(C60)2 as follows [(a) Murry, R. L. et al, Nature 1993, 366,665 (b) Strout, D. L. et al, Chem. Phys. Lett. 1993, 214,576, Osawa, E, private letter].

Figure 11:
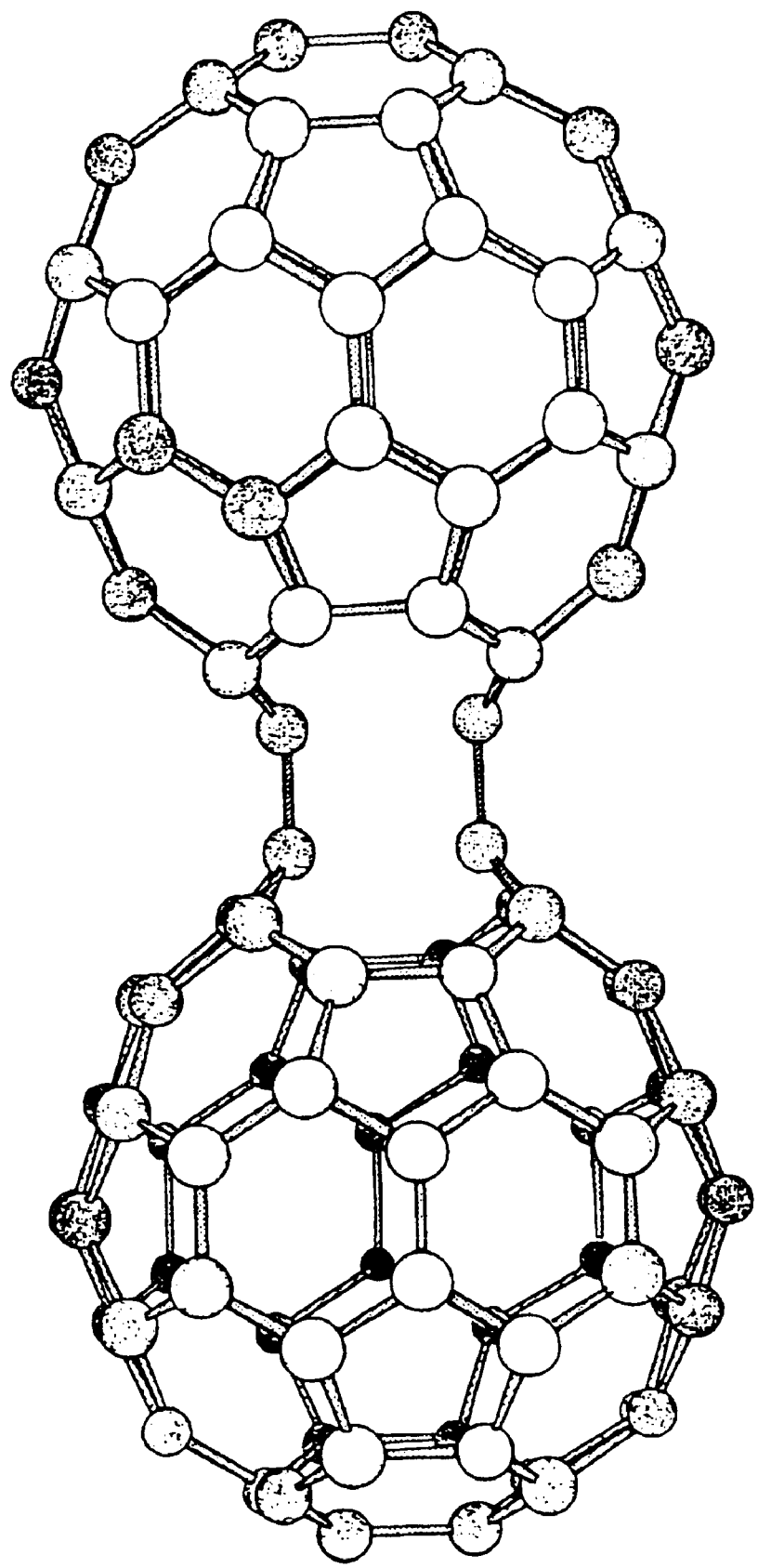
FIG. 11 shows another dimeric structure of another C60 molecule [C120(b)] felt to be produced in the fullerene polymer generating process.
Figure 12:
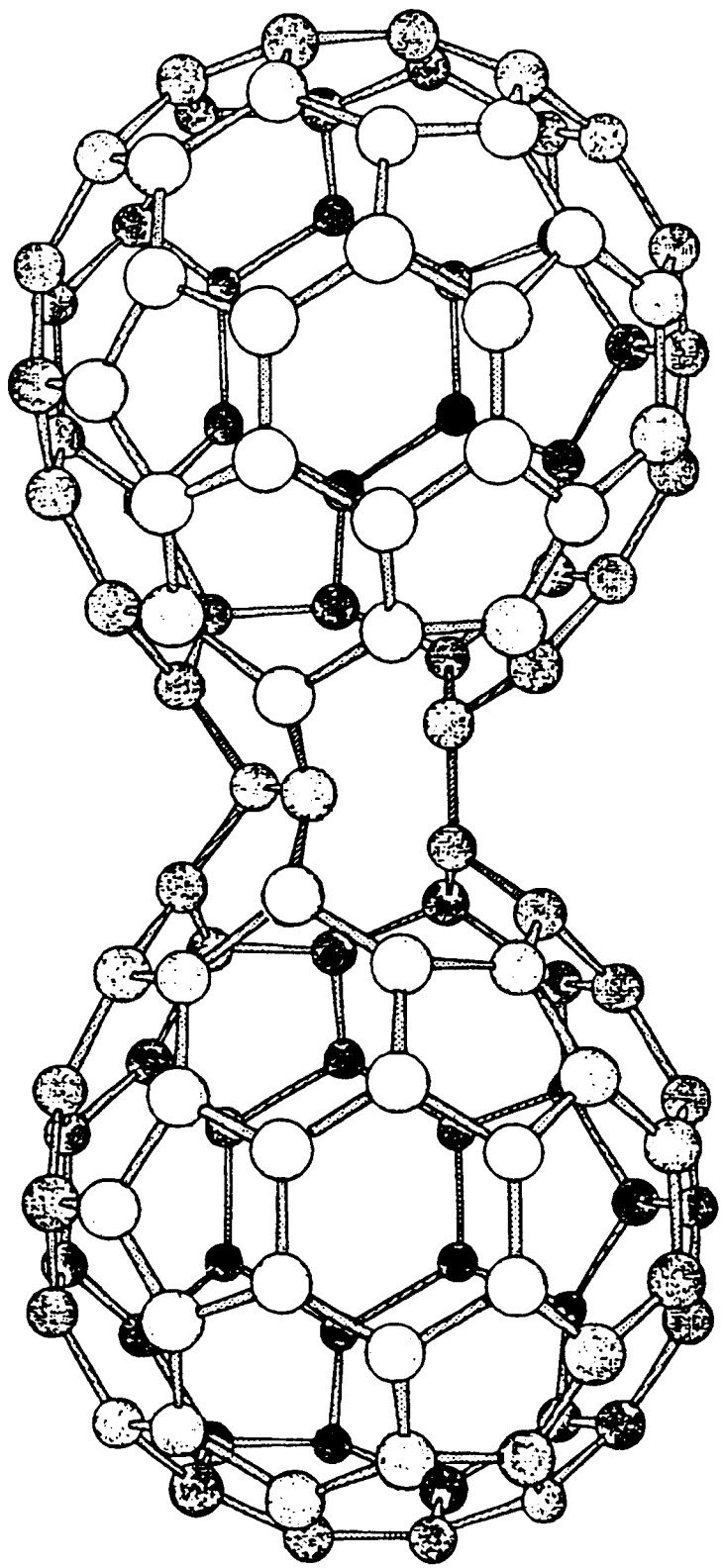
FIG. 12 shows still another dimeric structure of another C60 molecule [C120(c)] felt to be produced in the fullerene polymer generating process.
Figure 13:
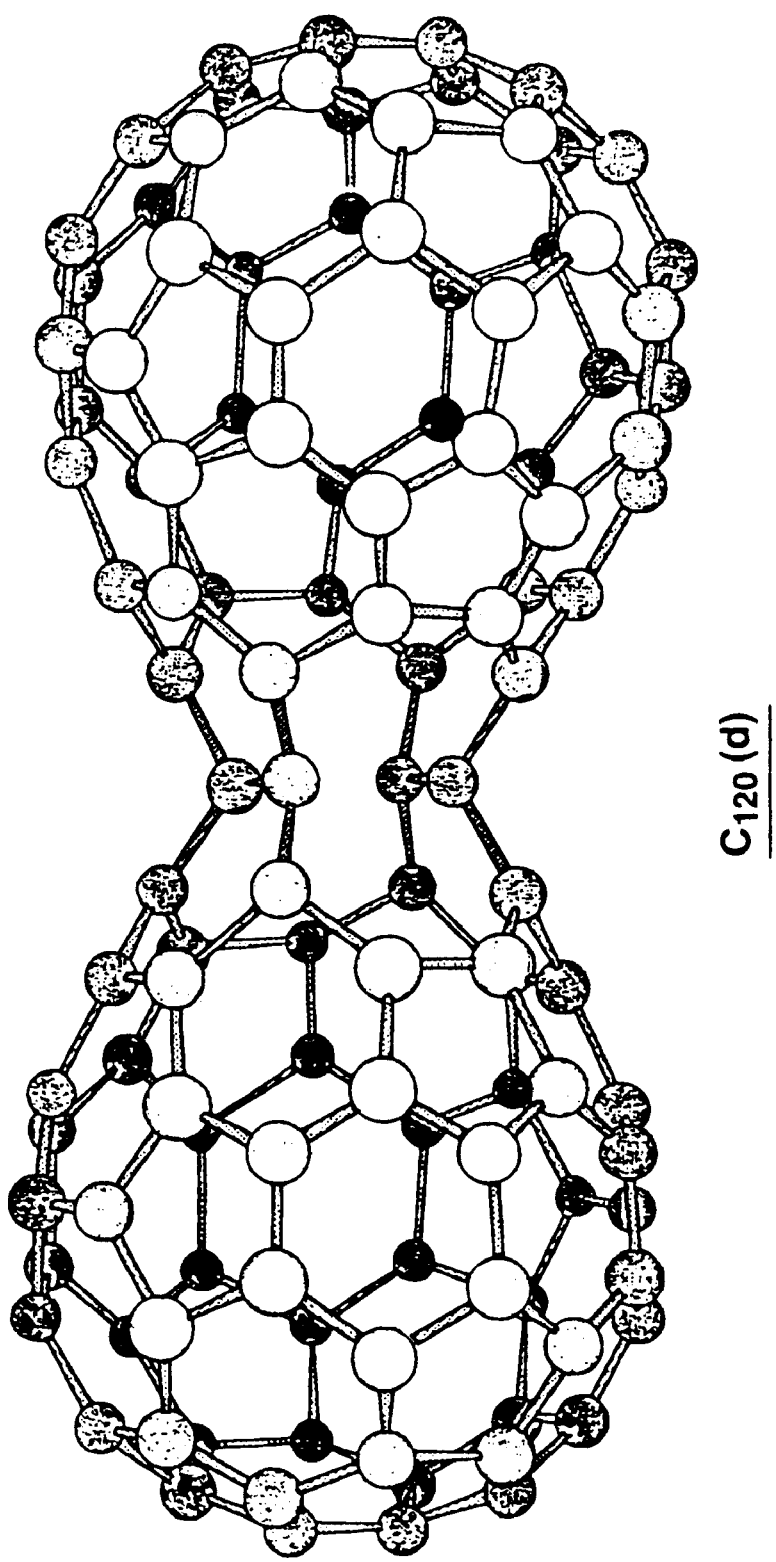
FIG. 13 shows yet another dimeric structure of another C60 molecule [C120(d)] felt to be produced in the fullerene polymer generating process.

Both Murry and Osawa state that, in the initial process of structure relaxation of 1,2-(C60) C2, C120(d) of FIG. 13 is produced through C120 (b) of FIG. 11, resulting from cleavage of the 1,2-C bond, having the maximum pinch of the cross-linked site, from C120 (c) of FIG. 12 having the ladder-like cross-linking by Stone-Wales transition (Stone, A. J., Wales, D. J., Chem. Phys. Lett. 1986, 128, 501, (b) Saito, R. Chem. Phys. Lett. 1992, 195,537). On transition from C120(c) of FIG. 12 to C120(b) of FIG. 11, energy instability occurs. However, on further transition from C120 (c) of FIG. 12 to C120 (d) of FIG. 13, the stabilized state is restored.

Figure 14:
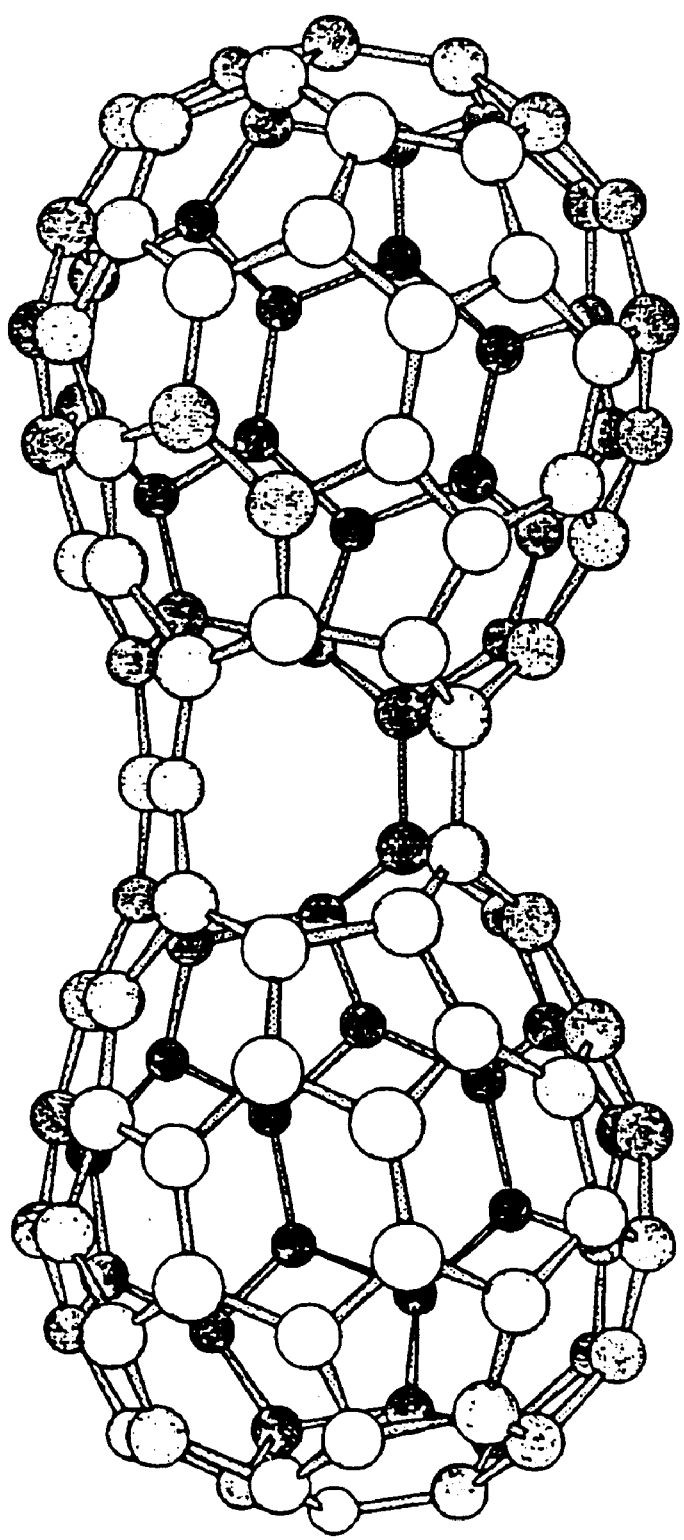
FIG. 14 shows a structure of a C118 molecule felt to be produced in the fullerene polymer generating process.
Figure 15:
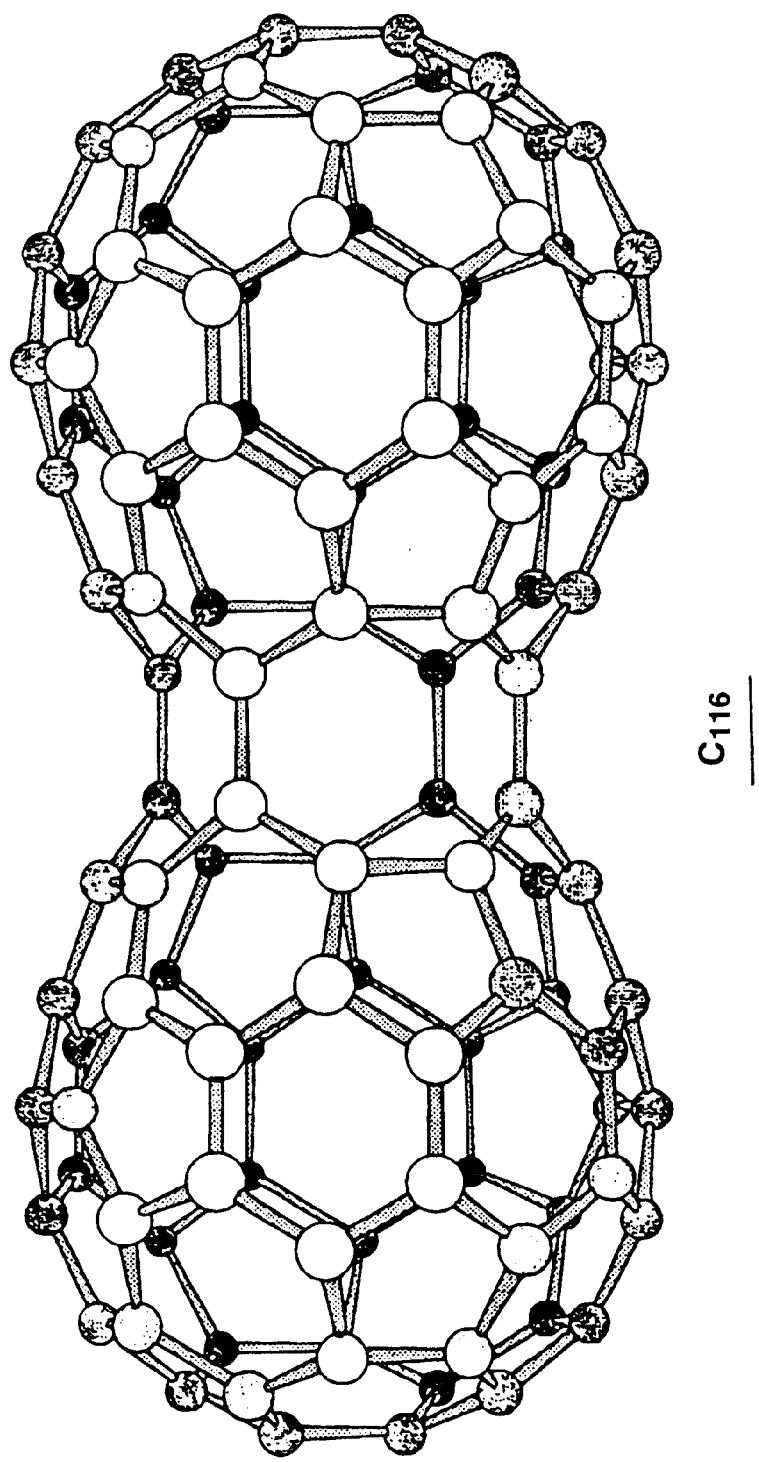
FIG. 15 shows a structure of a C116 molecule felt to be produced in the fullerene polymer generating process.
Figure 16:
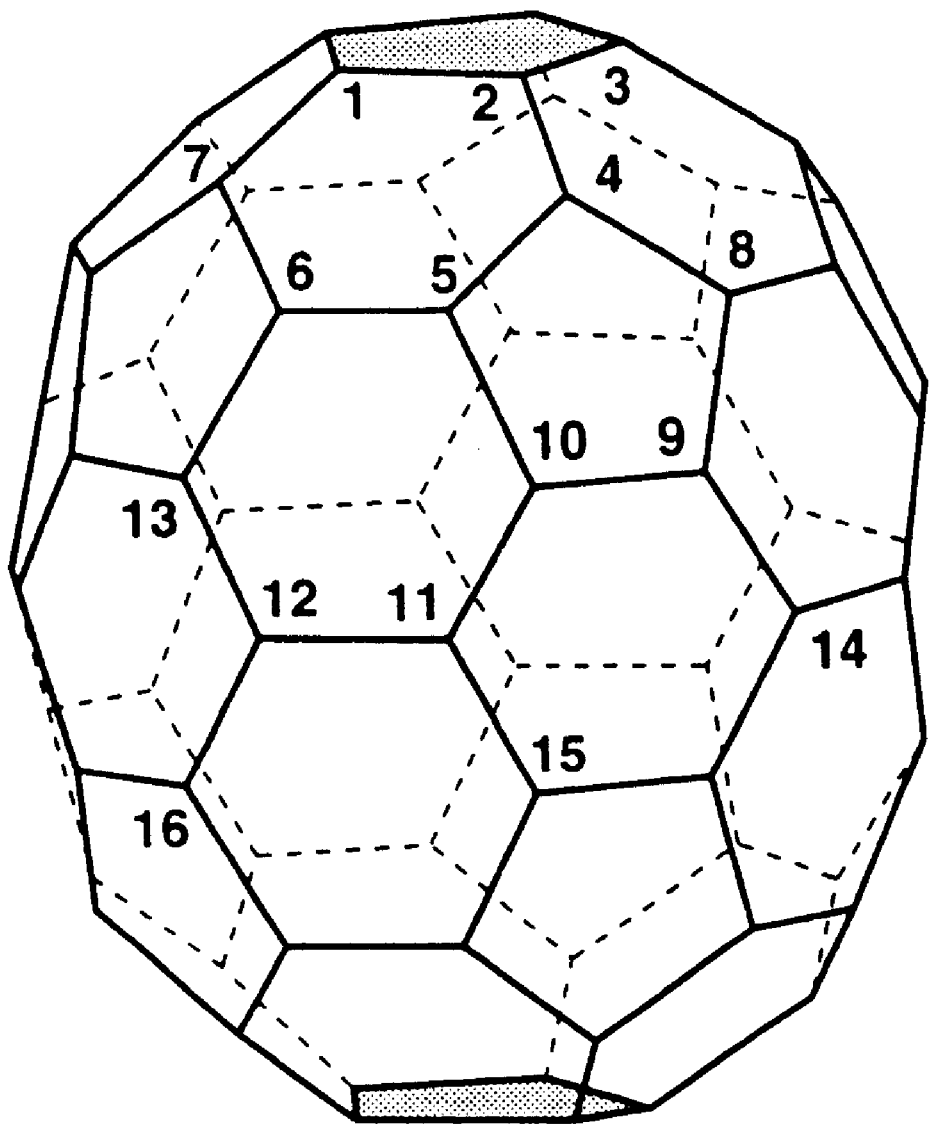
FIG. 16 shows a numbering system of a C70 molecule.

Although it is not clear whether the C2 loss observed in the polymerization of C60 by plasma excitation directly occurs from 1,2-(C60) thought to be its initial process or after certain structure relaxation thereof, it may be premeditated that the observed C118 assumes the structure shown in FIG. 14 by desorption of C2 from C120(d) of FIG. 13 and recombination of dangling spins. Also, C116 shown in FIG. 15 is obtained by desorption of two carbon atoms of the ladder-like cross-linking of C118 of FIG. 14 and recombination of spins. Judging from the fact that there are scarcely observed odd-numbered clusters in the dimeric TOF-MS, and from the structural stability, it may be presumed that the loss in C2 is not produced directly from 1,2-(C60)2, but rather that it is produced through C120 (d) of FIG. 13.

Also, Osawa et al states in the above-mentioned literature that D5d symmetrical C120 structure is obtained from C120(a) through structure relaxation by multi-stage Stone-Wales transition. The structure of C120, which is the graphite structure of C70 molecules extended to C120, is interesting in that a nano-tube is obtained from the C60 polymer. However, insofar as the TOF-MS of the C60 polymer is concerned, it is not the structure relaxation by the multi-stage transition reaction but rather the process of structure relaxation accompanied by C2 loss that governs the formation of the polymer by plasma irradiation.

In a planar covalent compound in general, in which a π-trajectory crosses the σ-trajectory, spin transition between $1(\pi-\pi^*)-(\pi-\pi^*)$ is a taboo, while it is allowed if, by vibration-electric interaction, there is mixed the σ-trajectory. In the case of C60, since the π-trajectory is mixed with the σ-trajectory due to non-planarity of the π covalent system, inter-state crossing by spin-trajectory interaction between $1(\pi-\pi^*)$ and $3(\pi-\pi^*)$ becomes possible, thus producing the high photochemical reactivity of C60. As characteristic of the behavior of the electronic excited state of fullerene, in particular C60, high symmetry of truncated icosahedron of the C60 molecule brings about a severe ban rule to transition between electronic excited states or between vibration levels, whilst transition between $(\pi-\pi^*)$ states of different spin multiplicities, which is a ban with planar molecules, is allowed.

The plasma polymerization method is applicable to polymerization of C70 molecules. However, the polymerization between C70 molecules is more difficult to understand than in that between C60. Thus, the polymerization is hereinafter explained in as plain terms as possible with the aid of numbering of carbon atoms making up C70.

The 105 C—C bonds of C70 are classified into eight sorts of bonds represented by C(1)-C(2), C(2)-C(4), C(4)-C(5), C(5)-C(6), C(5)-C(10), C(9)-C(10), C(10)-C(11) and C(11)-C(12). Of these, C(2)-C(4) and C(5)-C(6) are of the same order of double bond performance as the C=C in C60. The π-electrons of the six members of this molecule including C(9), C(10), C(11), C(14) and C(15) are non-localized such that the C(9)-C(10) of the five-membered ring exhibit the performance of the double bond, while the C(11)-C(12) bond exhibits single bond performance. The polymerization of C70 is scrutinized as to C(2)-C(4), C(5)-C(6), C(9)-C(10) and C(10)-C(11) exhibiting the double-bond performance. Meanwhile, although the C(11)-C(12) is substantially a single bond, it is a bond across two six-membered rings (6, 6-ring fusion). Therefore, the addition reaction performance of this bond is also scrutinized.

First, the [2+2] cycloaddition reaction of C70 is scrutinized. From the [2+2] cycloaddition reaction of these five sorts of the C—C bonds, 25 sorts of dimers of C70 are produced. For convenience of calculations, only nine sorts of the addition reactions between the same C—C bonds are scrutinized. Table 1 shows heat of the reaction (ΔHf0(r)) in the course of the process of yielding C140 from C70 of two molecules of the MNDO/AN-1 and PM-3 levels.

In the table, ΔHf0(r)An-1 and ΔHf° (r)PM-3 means calculated values of the heat of reaction in case of using parameterization of the MNDO method which is a semi-empirical molecular starting method by J. J. Stewart.

TABLE 1

Figure 19:
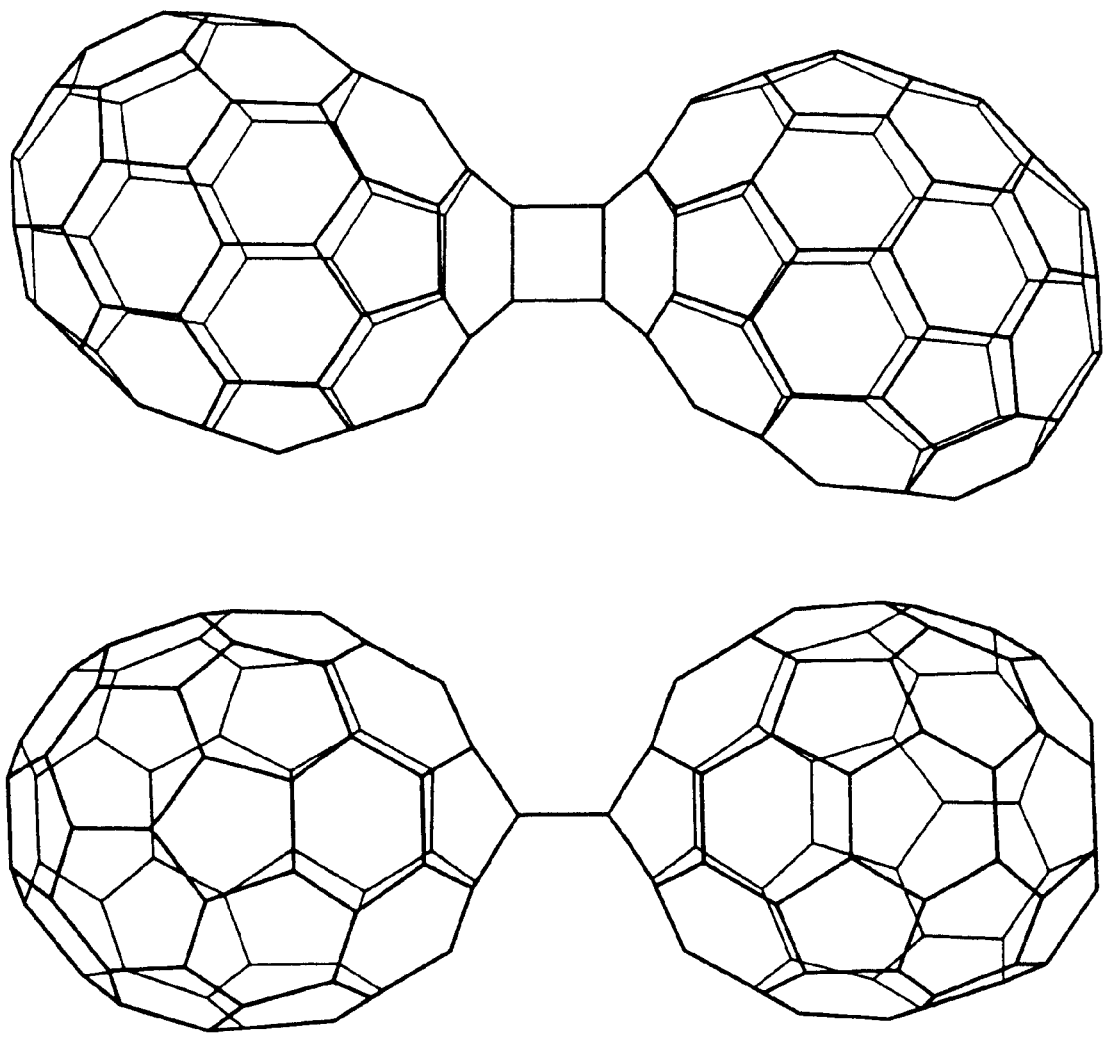
FIG. 19 shows a dimeric structure of a C70 molecule felt to be produced in the fullerene polymerization process [C140(a)].
Figure 20:
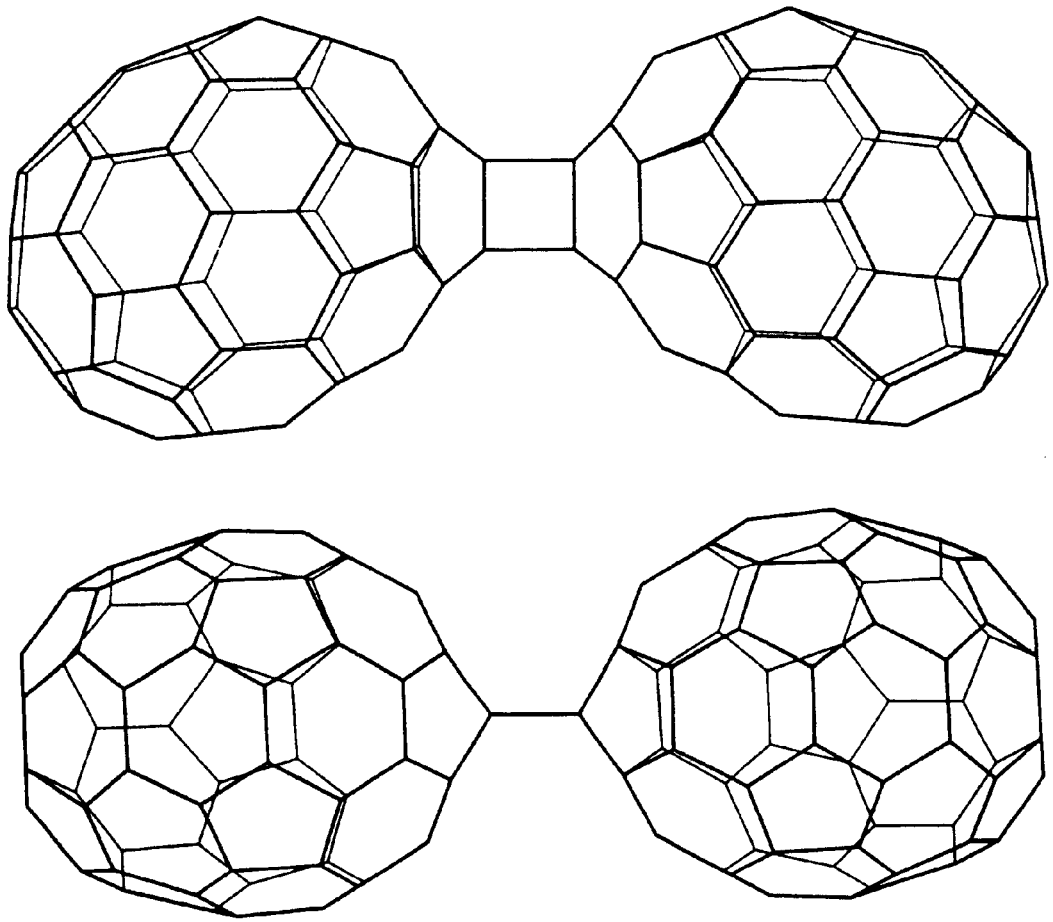
FIG. 20 shows a dimeric structure of a C70 molecule felt to be produced in the fullerene polymerization process [C140(b)].
Figure 21:
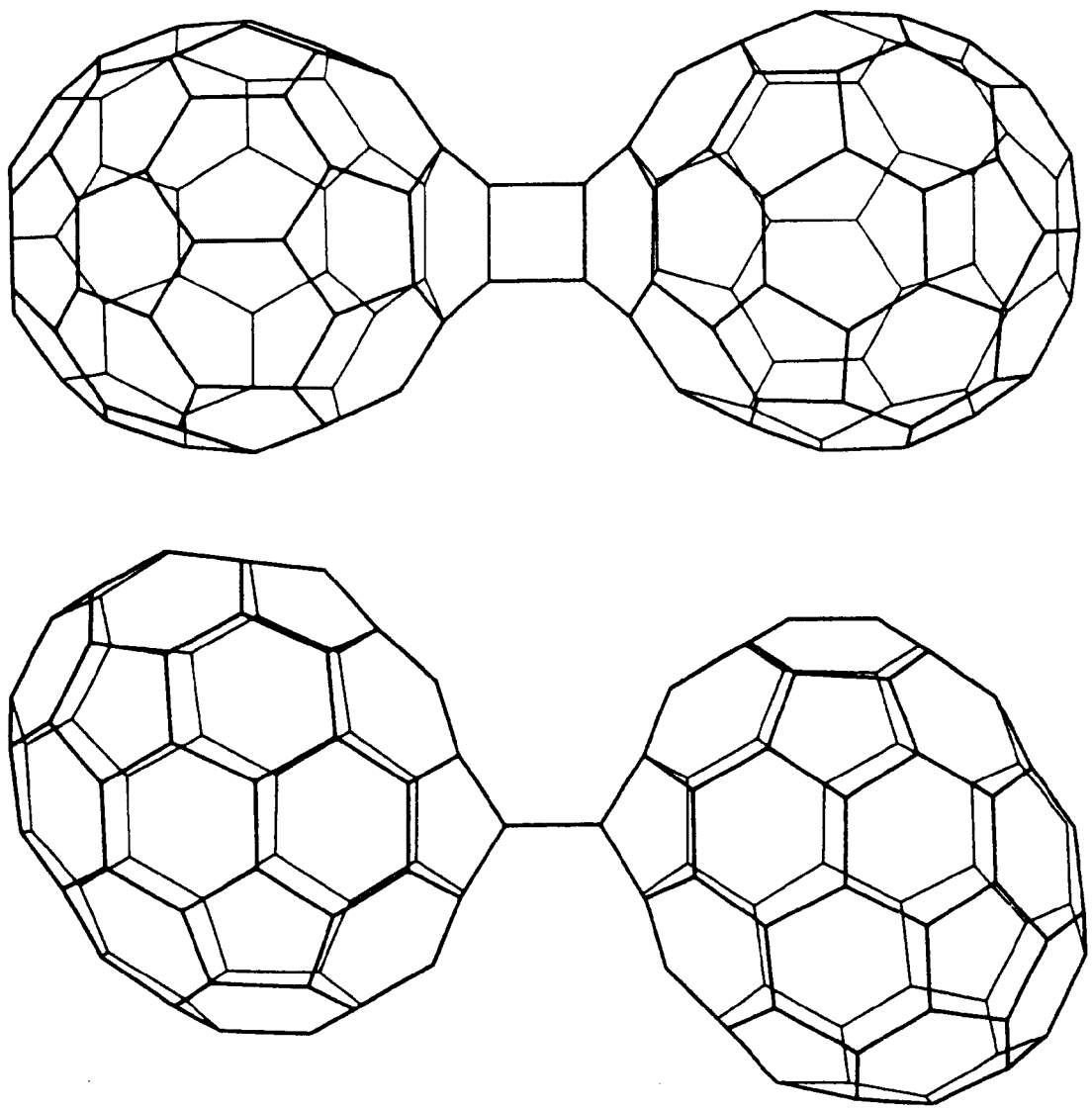
FIG. 21 shows a dimeric structure of a C70 molecule felt to be produced in the fullerene polymerization process [C140(c)].
Figure 22:
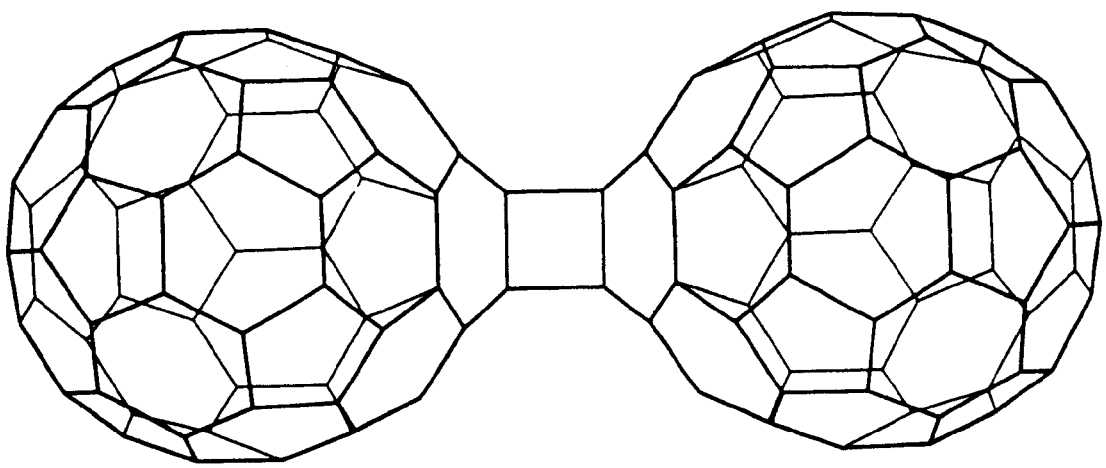
FIG. 22 shows a dimeric structure of a C70 molecule felt to be produced in the fullerene polymerization process [C140(d)].
Figure 22:
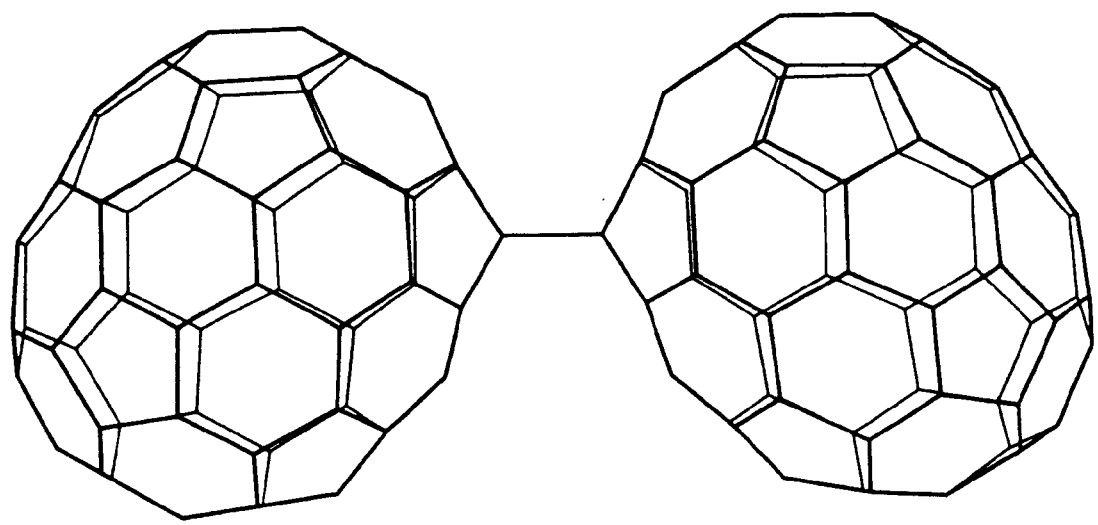
Figure 23:
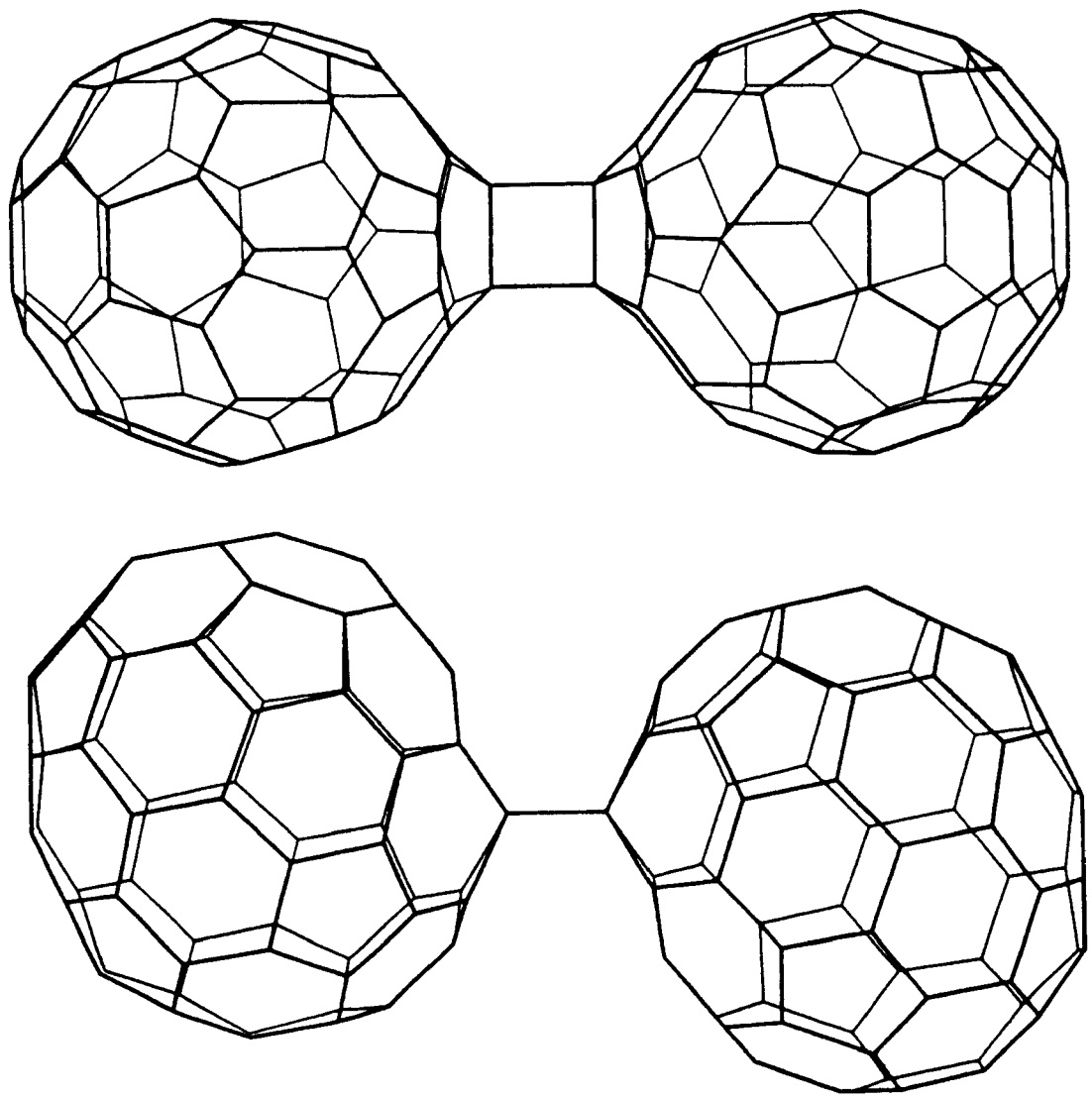
FIG. 23 shows a dimeric structure of a C70 molecule felt to be produced in the fullerene polymerization process [C140(e)].
Figure 24:
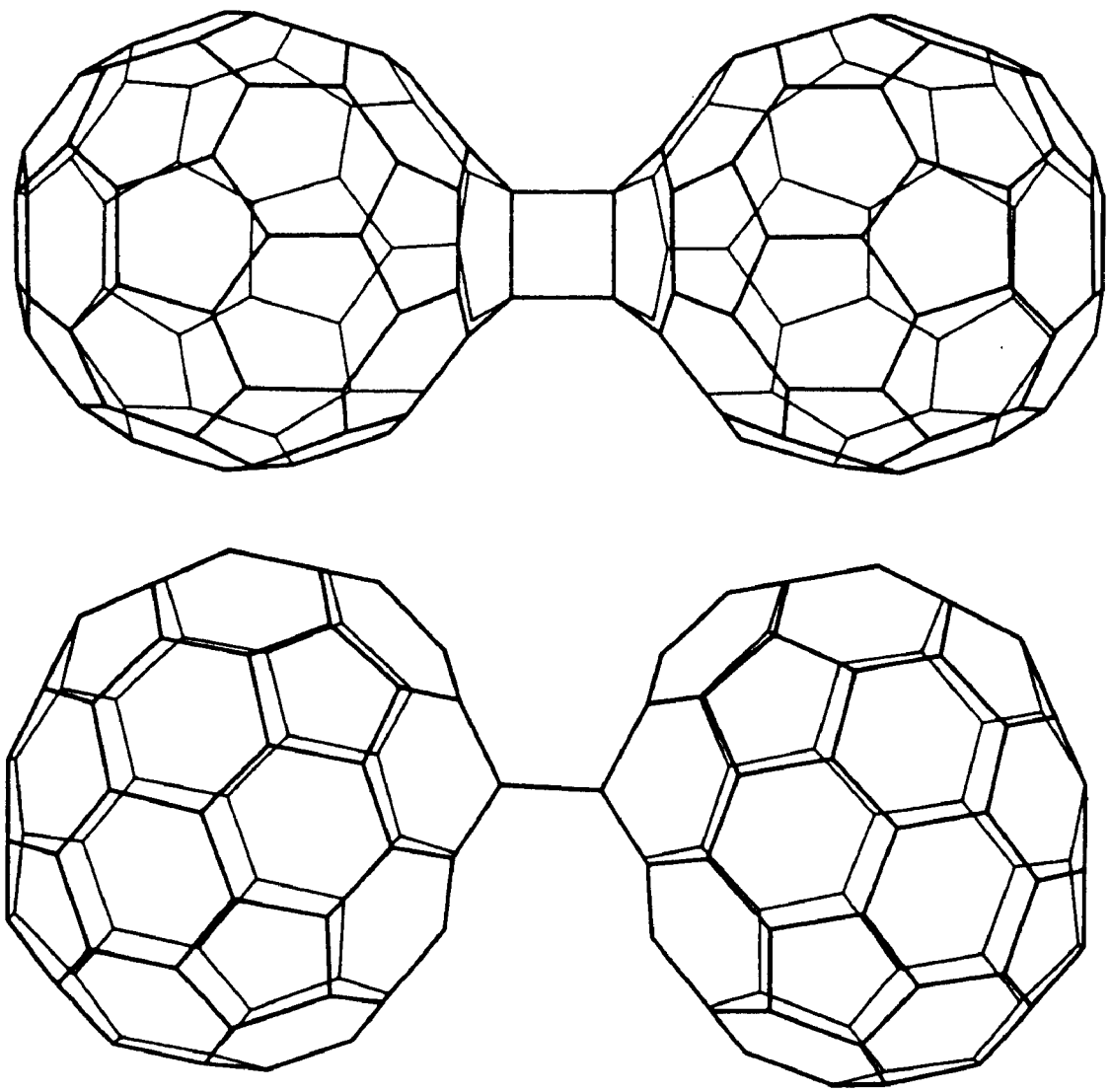
FIG. 24 shows a dimeric structure of a C70 molecule felt to be produced in the fullerene polymerization process [C140(f)].
Figure 25:
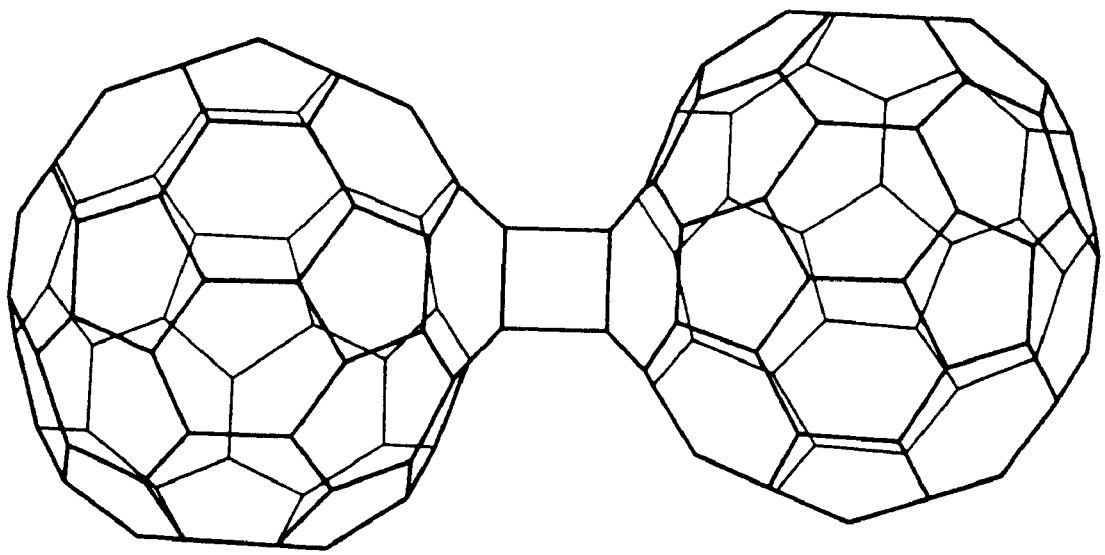
FIG. 25 shows a dimeric structure of a C70 molecule felt to be produced in the fullerene polymerization process [C140(g)].
Figure 25:
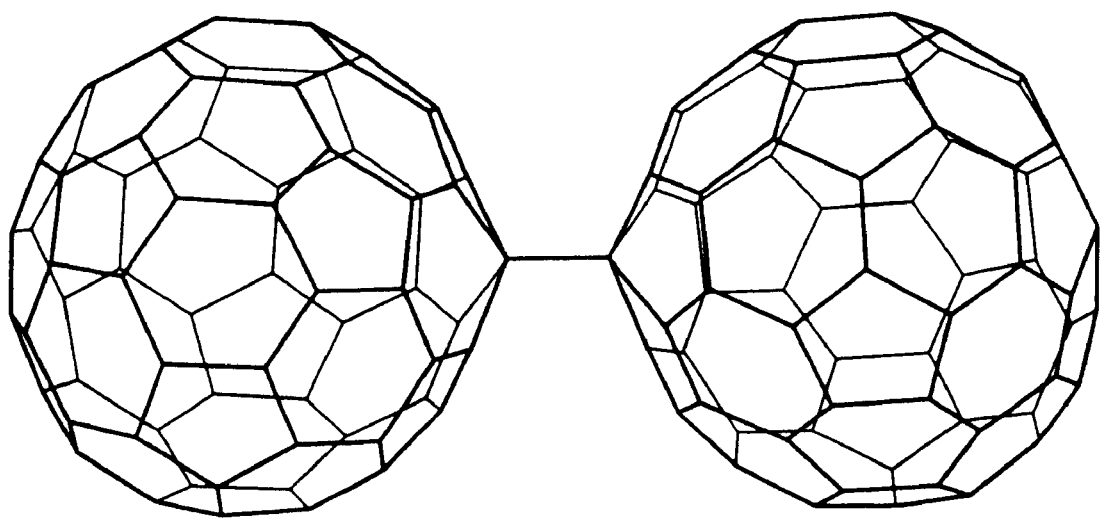
Figure 26:
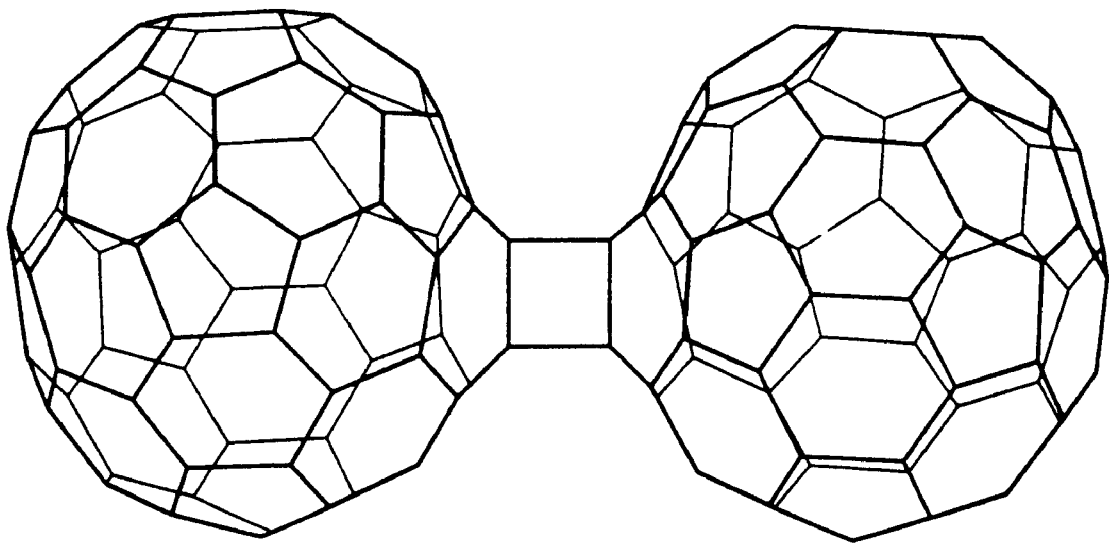
FIG. 26 shows a dimeric structure of a C70 molecule felt to be produced in the fullerene polymerization process [C140(h)].
Figure 26:
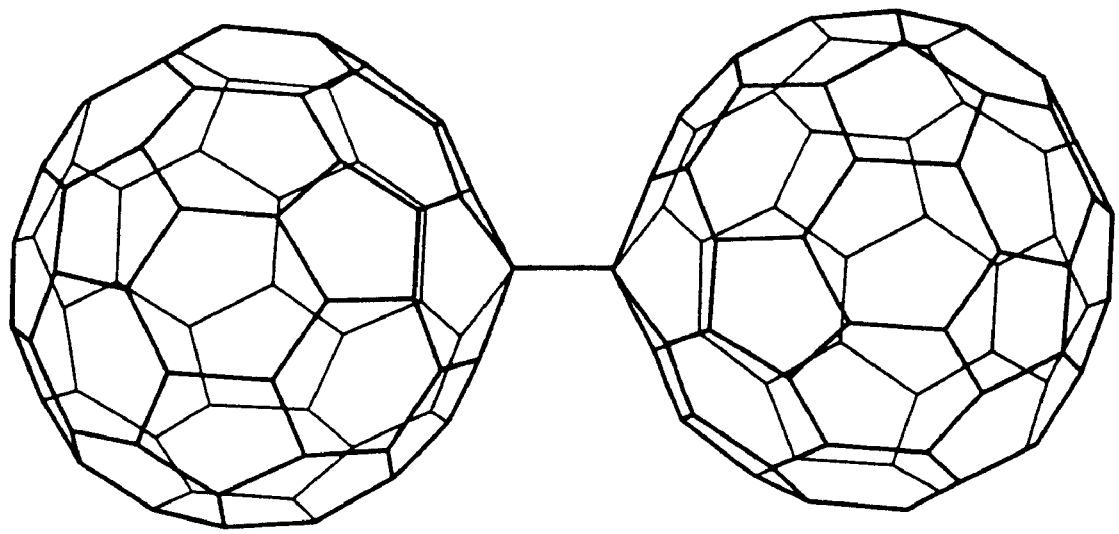
Figure 27:
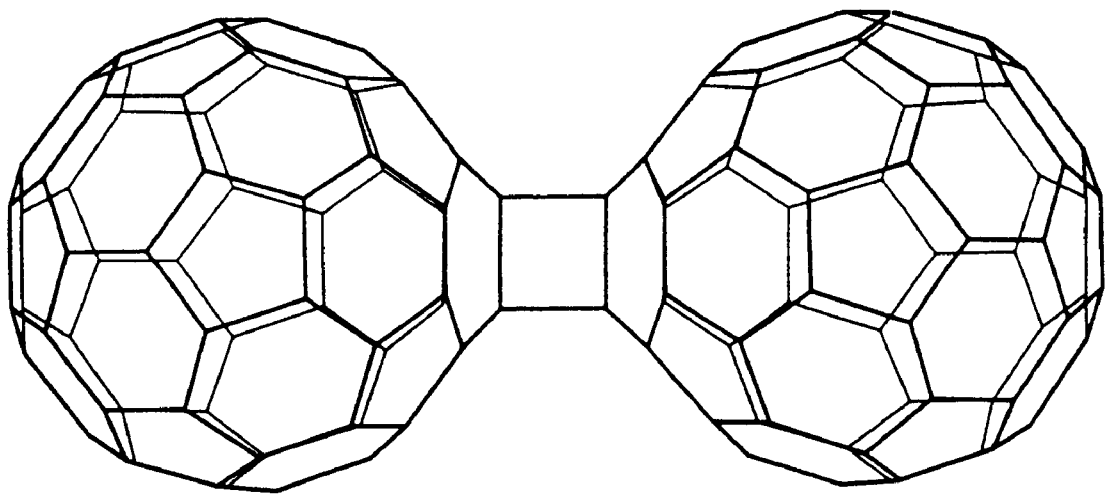
FIG. 27 shows a dimeric structure of a C70 molecule felt to be produced in the fullerene polymerization process [C140(i): D2h symmetrical].
Figure 27:
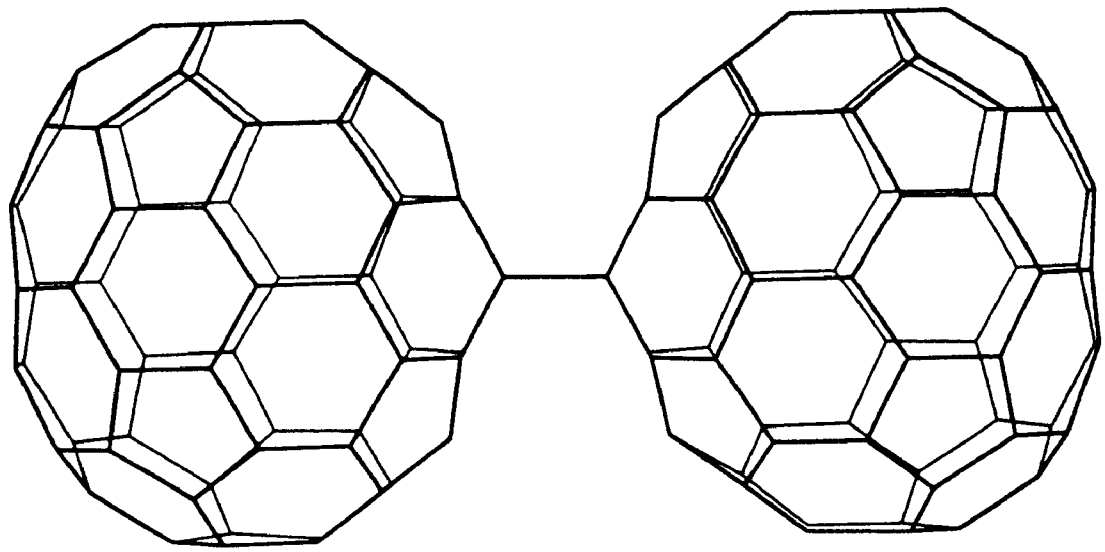
Figure 28:
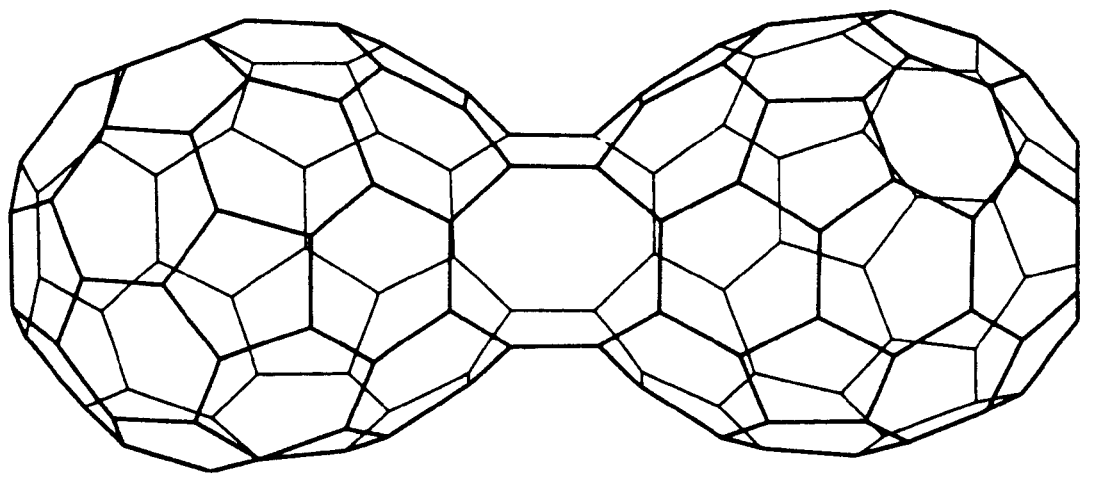
FIG. 28 shows a dimeric structure of a C70 molecule felt to be produced in the fullerene polymerization process [C136(a)].
Figure 28:
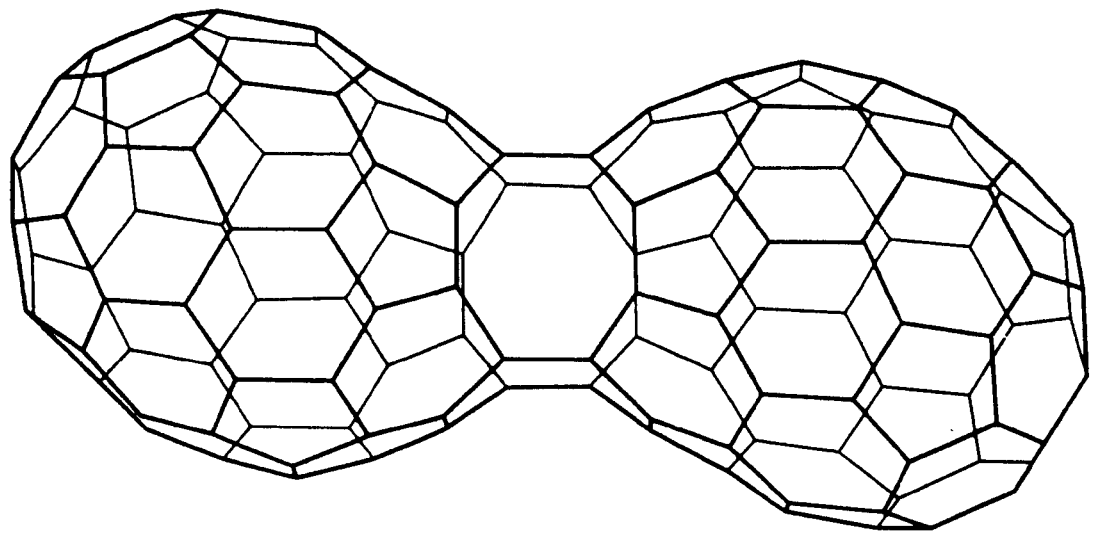
Figure 29:
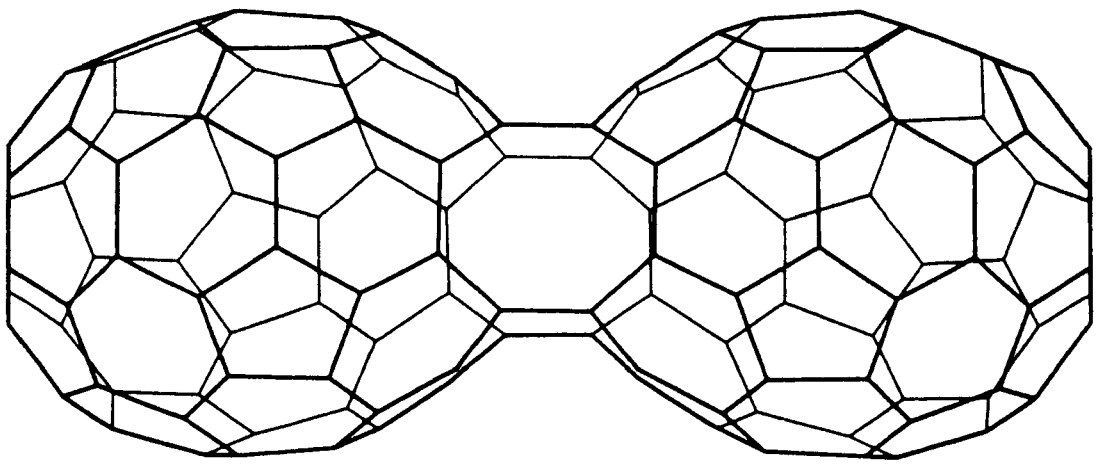
FIG. 29 shows a dimeric structure of a C70 molecule felt to be produced in the fullerene polymerization process [C136(b)].
Figure 29:
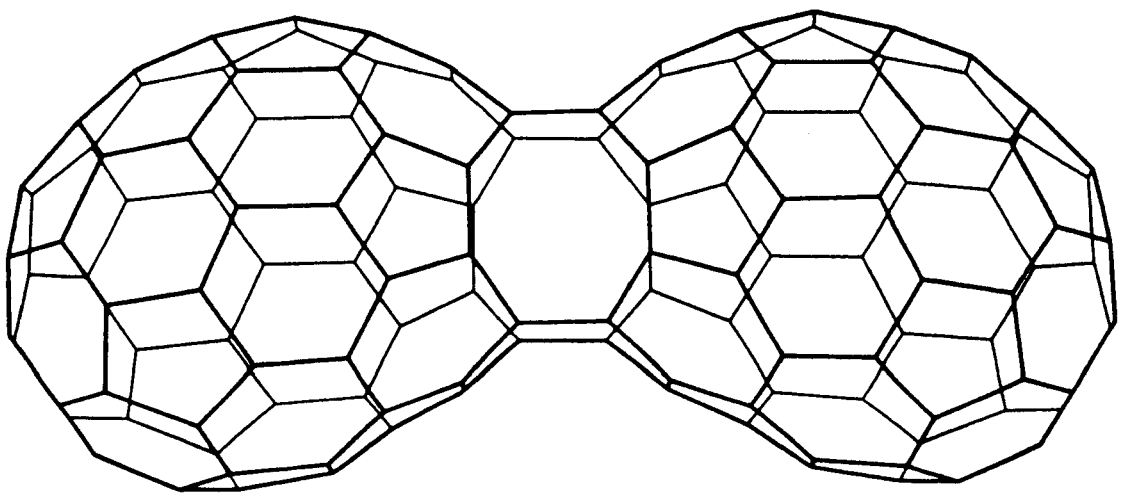
Figure 30:
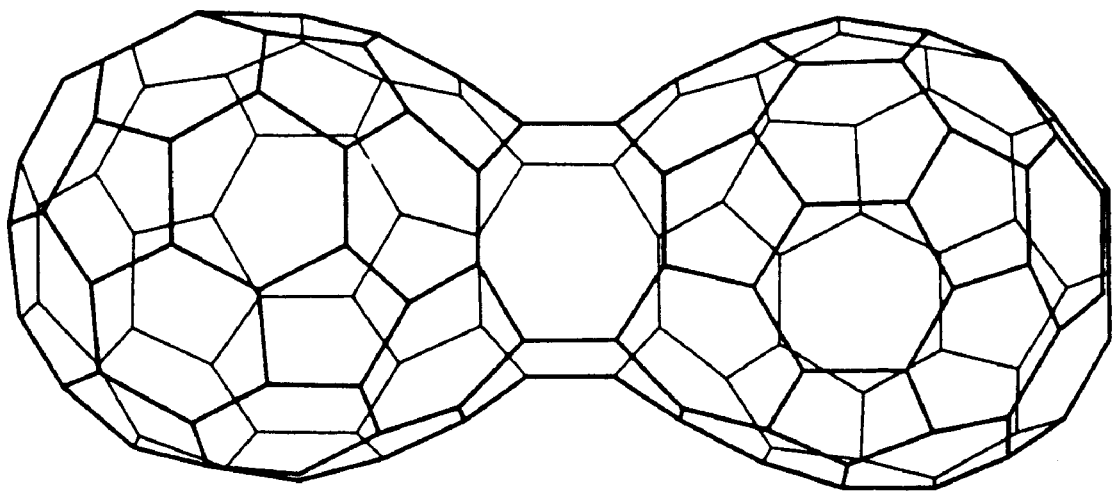
FIG. 30 shows a dimeric structure of a C70 molecule felt to be produced in the fullerene polymerization process [C136(c)].
Figure 30:
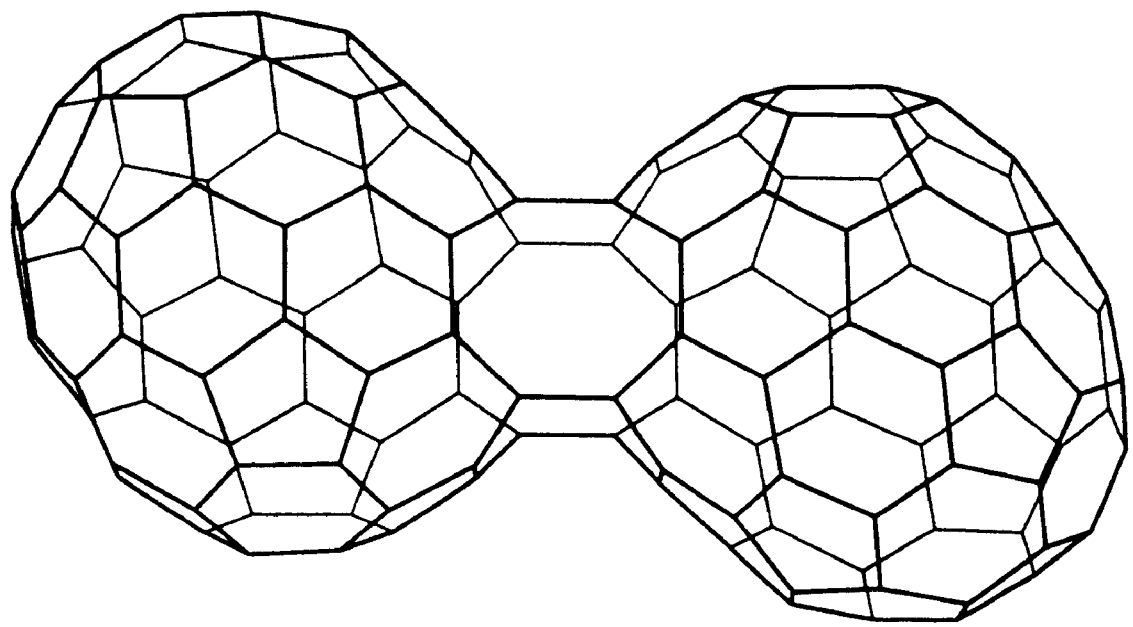
Figure 31:
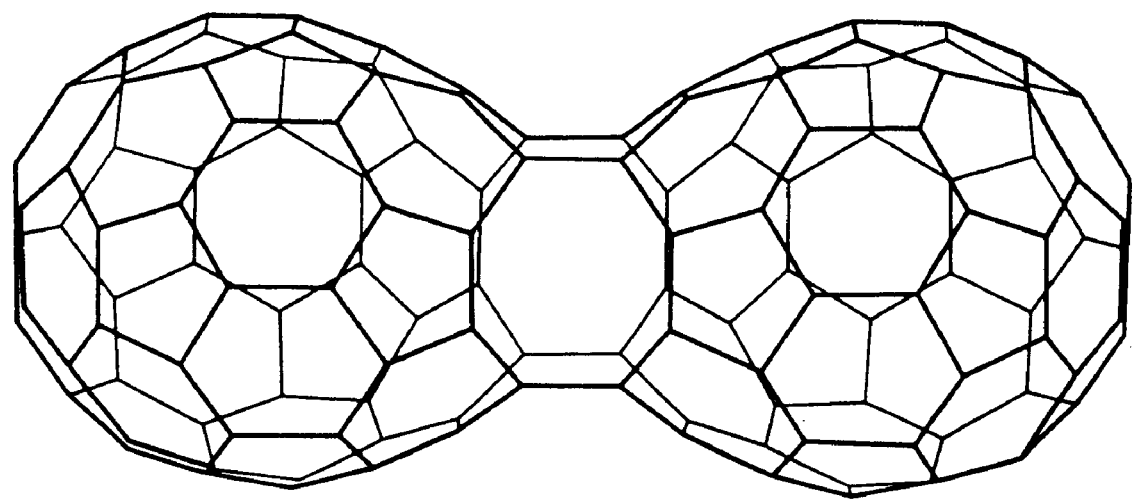
FIG. 31 shows a dimeric structure of a C70 molecule felt to be produced in the fullerene polymerization process [C136(d)].
Figure 31:
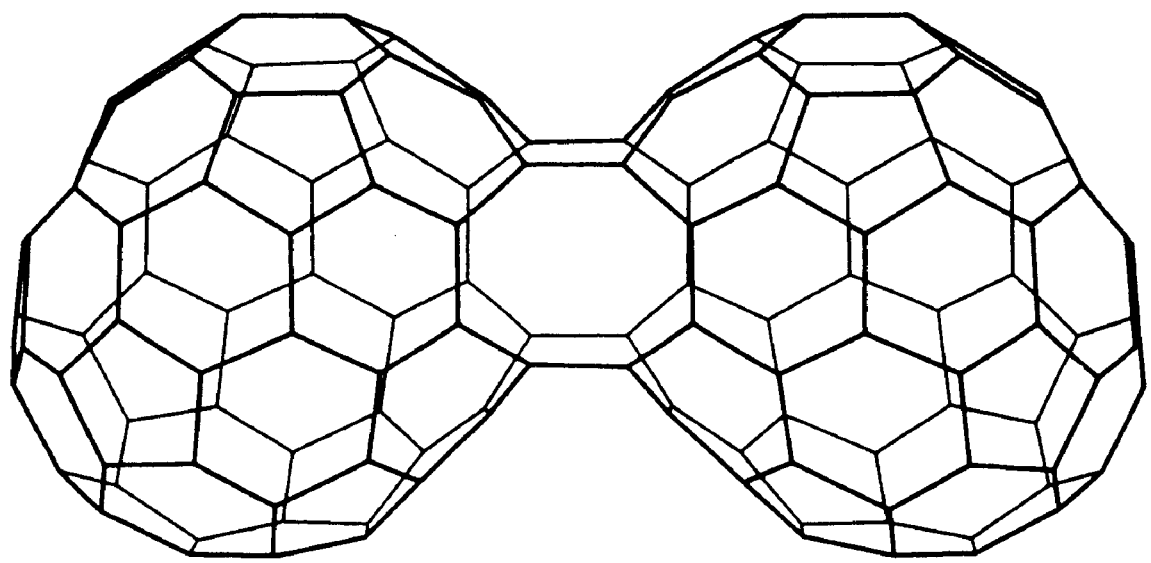
Figure 32:
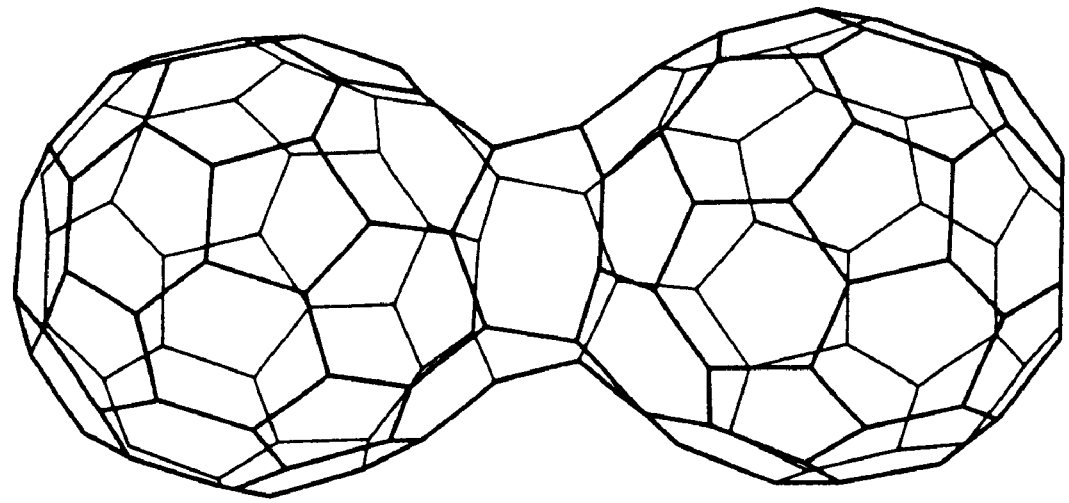
FIG. 32 shows a dimeric structure of a C70 molecule felt to be produced in the fullerene polymerization process [C136(e)].
Figure 32:
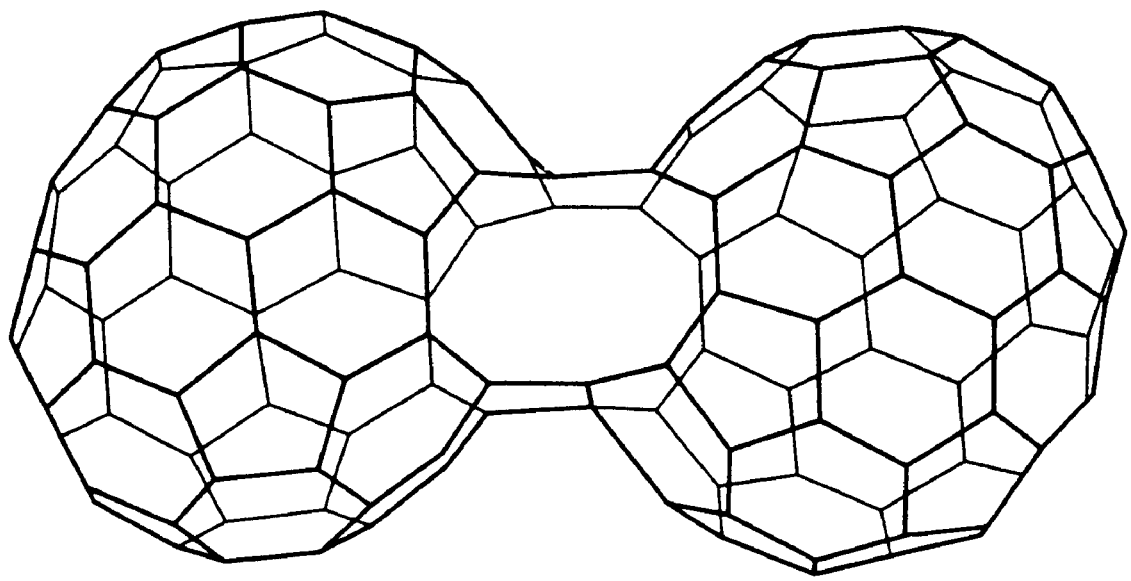
Figure 33:
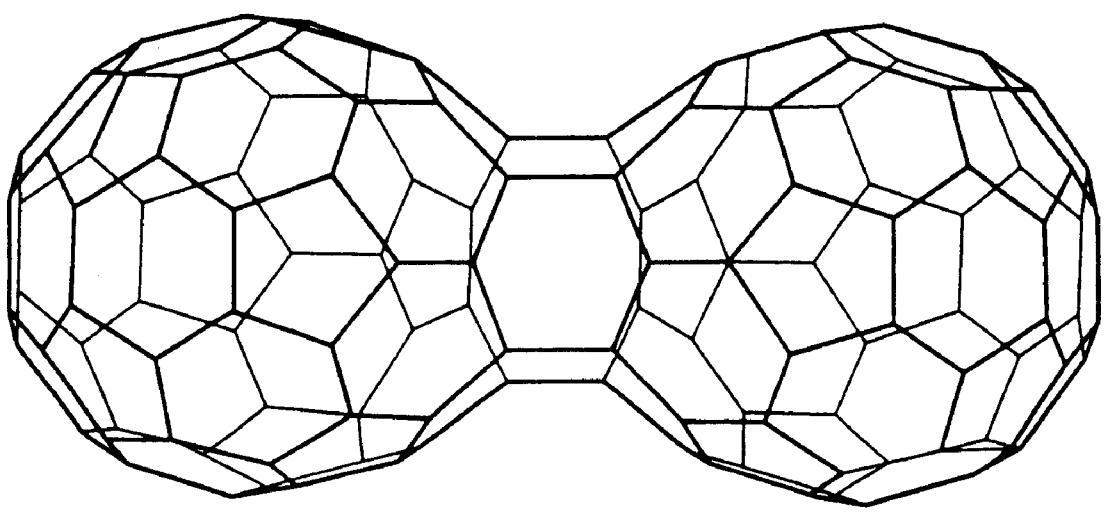
FIG. 33 shows a dimeric structure of a C70 molecule felt to be produced in the fullerene polymerization process [C136(f)].
Figure 33:
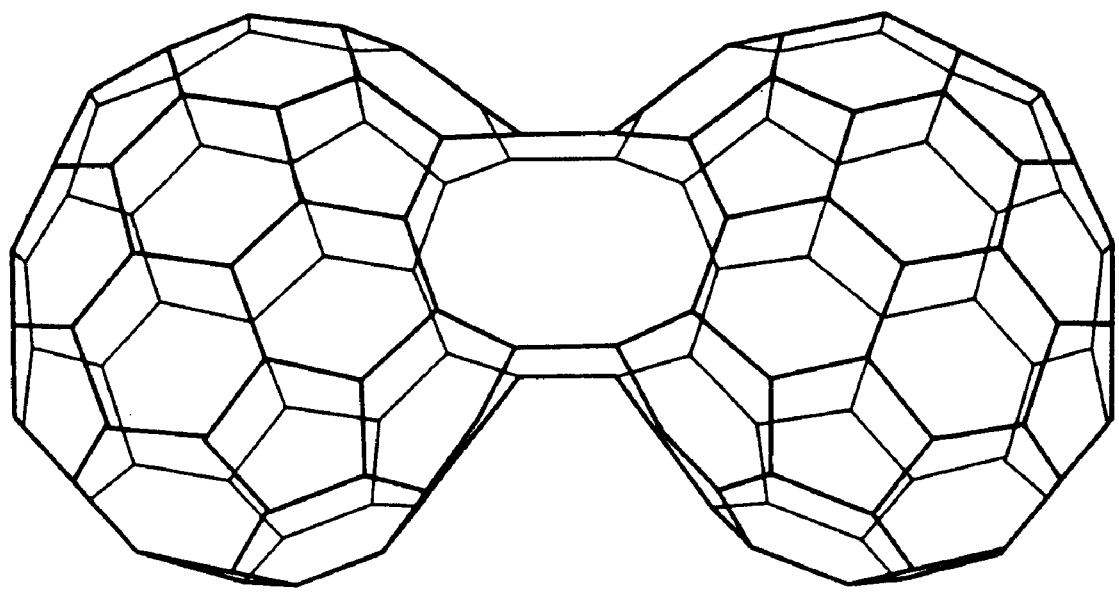
Figure 34:
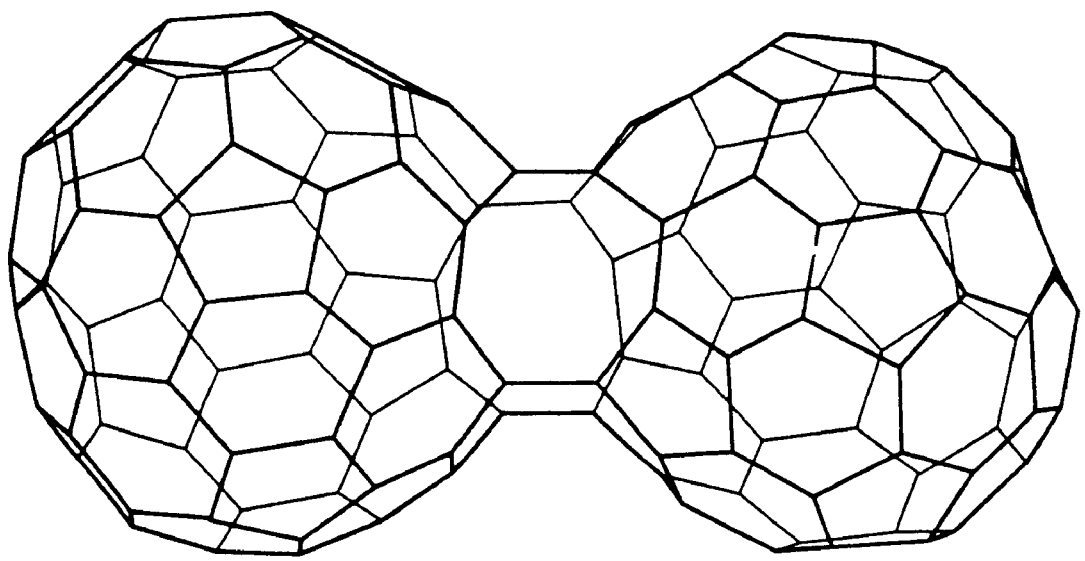
FIG. 34 shows a dimeric structure of a C70 molecule felt to be produced in the fullerene polymerization process [C136(g)].
Figure 34:
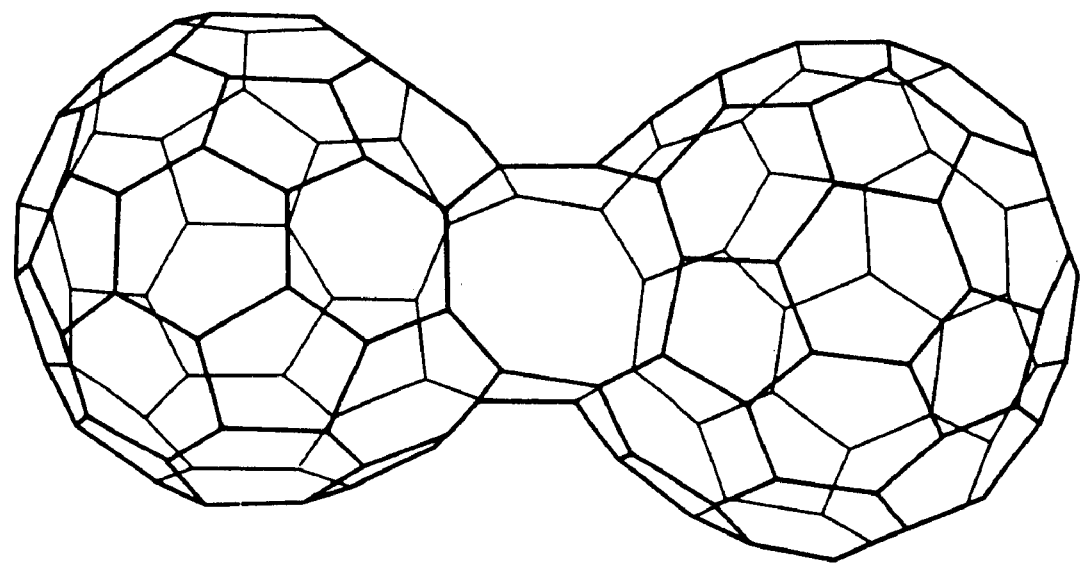
Figure 35:
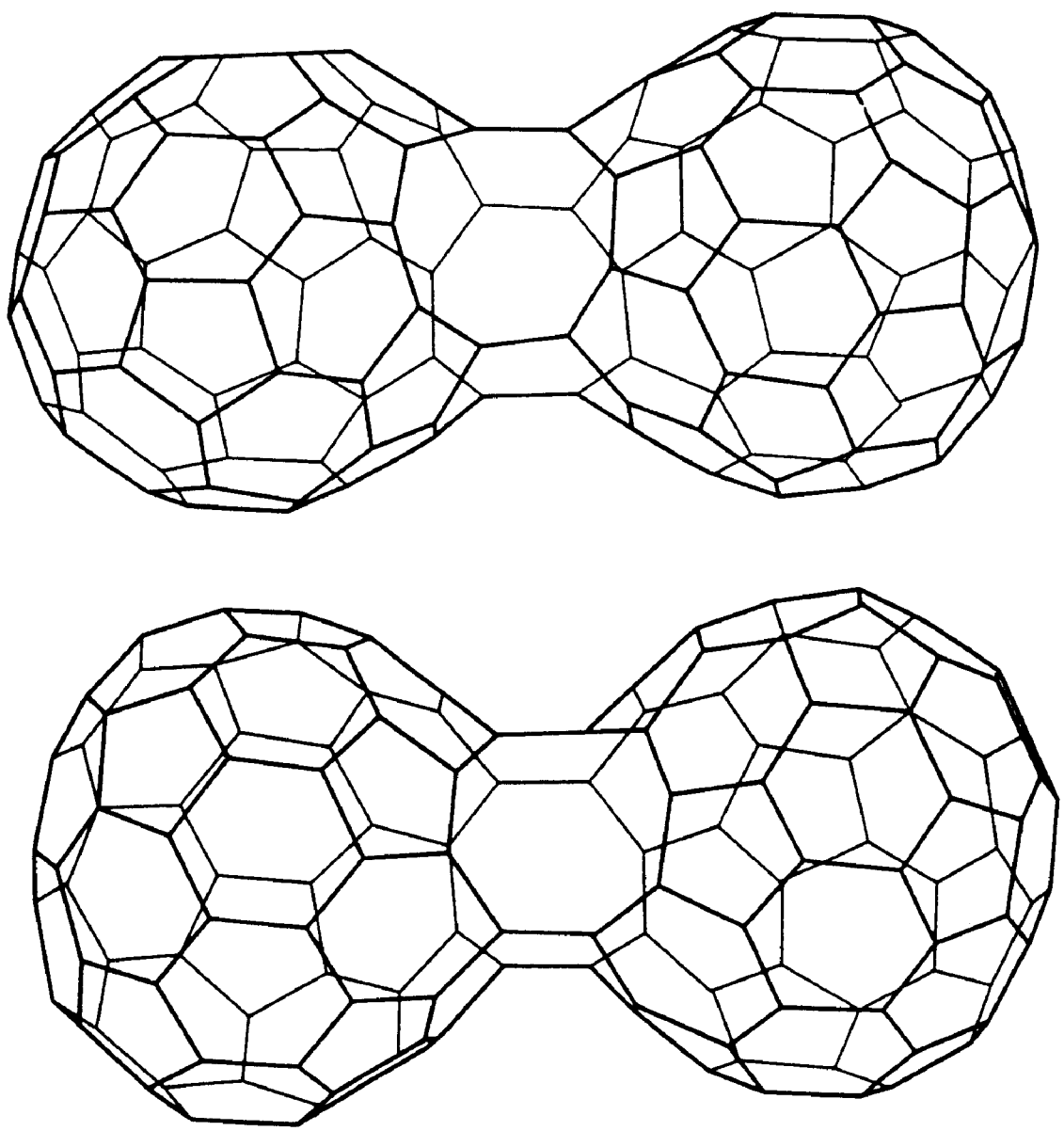
FIG. 35 shows a dimeric structure of a C70 molecule felt to be produced in the fullerene polymerization process [C136(h)].
Figure 36:
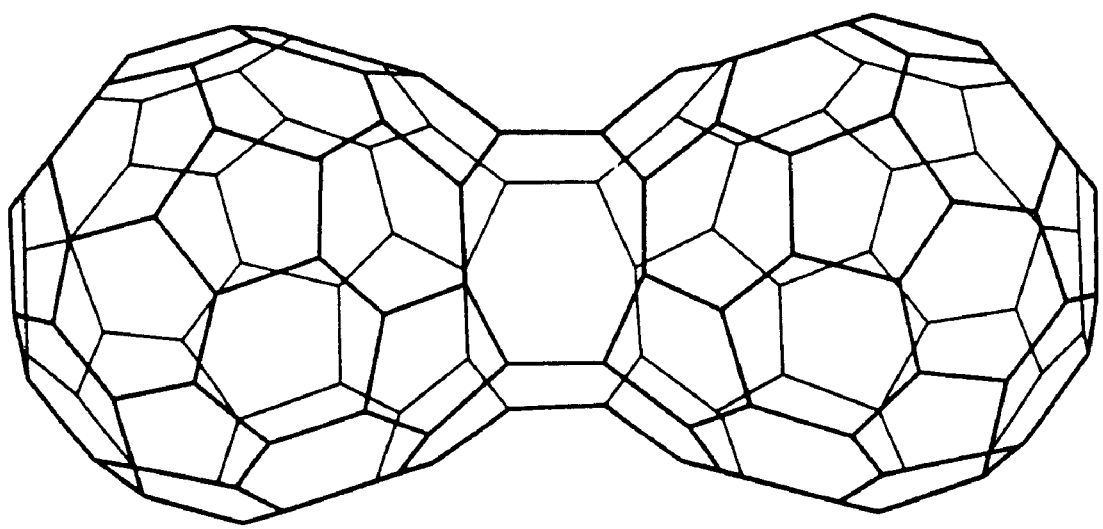
FIG. 36 shows a dimeric structure of a C70 molecule felt to be produced in the fullerene polymerization process [C136(i)].
Figure 36:
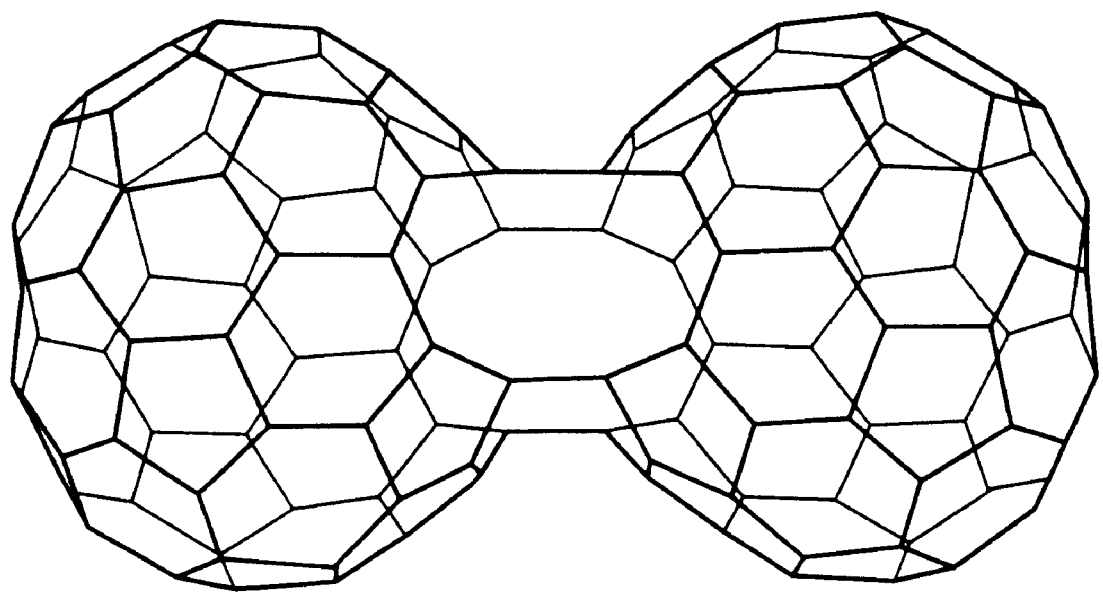

| cluster (reference drawing) | ΔHf0(r) (kcal/mol) AN-1 | ΔHf0(r) (kcal/mol) PM-3 | cross-linking | binding length (Å) |
|---|---|---|---|---|
| C140(a) (FIG. 19) | −34.63 | −38.01 | C(2)-C(2'), C(4)-C(4')<br>C(2)-C(4), C(2)-C(4') | 1544<br>1607 |
| C140(b) (FIG. 20) | −34.33 | −38.00 | C(2)-C(4'), C(4)-C(2')<br>C(2)-C(4), C(2')-C(4') | 1544<br>1607 |
| C140(c) (FIG. 21) | −33.94 | −38.12 | C(5)-C(5'), C(6)-C(6')<br>C(5)-C(6), C(5')-C(6') | 1550<br>1613 |
| C140(d) (FIG. 22) | −33.92 | −38.08 | C(5)-C(6'), C(6)-C(5')<br>C(5)-C(6), C(5')-C(6') | 1551<br>1624 |
| C140(e) (FIG. 23) | −19.05 | −20.28 | C(9)-C(9'), C(10)-C(10')<br>C(9)-C(10), C(9')-C(10') | 1553<br>1655 |
| C140(f) (FIG. 24) | −18.54 | −19.72 | C(9)-C(10'), C(10)-C(9')<br>C(9)-C(10), C(9')-C(10') | 1555<br>1655 |
| C140(g) (FIG. 25) | +3.19 | −3.72 | C(10)-C(10'), C(11)-C(11')<br>C(10)-C(11), C(10')-C(11') | 1559<br>1613 |
| C140(h) (FIG. 26) | +3.27 | −3.23 | C(10)-C(11'), C(11)-C(10')<br>C(10)-C(11), C(10')-C(11') | 1560<br>1613 |
| C140(i) (FIG. 27) | +64.30 | +56.38 | C(11)-C(11'), C(12)-C(12')<br>C(11)-C(12), C(11)-C(12') | 1560<br>1683 |

Figure 17:
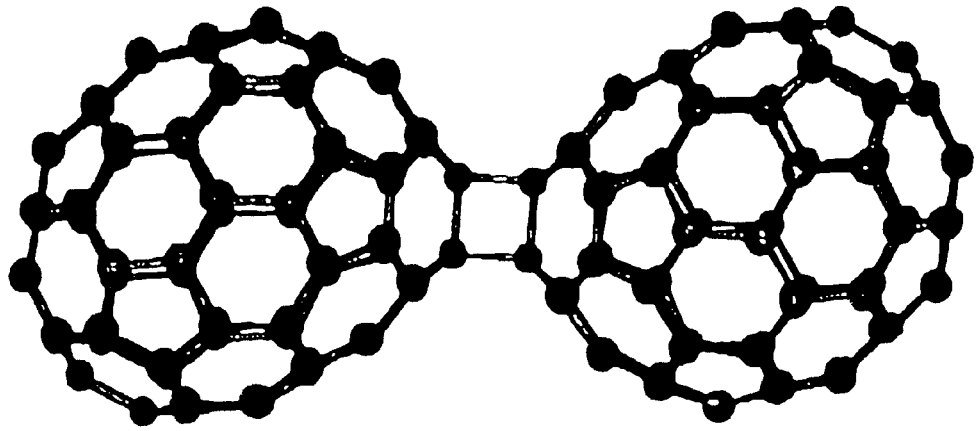
FIG. 17 shows a dimeric structure of a C70 molecule felt to be produced in the fullerene polymerization process.

In the above Table, C140(a) and (b), C140(c) and (d), C140(e) and (f) and C140(g) and (h) are anti-synchronization isomer pairs of the C(2)-C(4), C(5)-C(6), C(9)-C(10) and C(10)-C(11) bonds, respectively. In the addition reaction between C(11) and C(12). In the addition reaction between C(11) and C(12), only D2h symmetrical C140(i) is obtained. These structures are shown in FIGS. 19 to 27. Meanwhile, an initial structure of a C70 polymer by the most stable [2+2] cycloaddition is shown in FIG. 17.

From this Table 1, no energy difference is seen to exist between the anti-synchronization isomers. The addition reaction between the C(2)-C(4) and C(5)-C(6) bonds is as exothermic as the addition reaction of C60, whereas that between the C(11)-C(12) is appreciably endothermic. Meanwhile, the C(1)-C(2) bond is evidently a single bond. The heat of reaction of the cycloaddition reaction in this bond is +0.19 and −1.88 kcal/mol at the AN-1 and PM-3 level, respectively, which are approximately equal to the heat of reaction in C140 (g) and (h). This suggests that the cycloaddition reaction across the C(10) and C(11) cannot occur thermodynamically. Therefore, the addition polymerization reaction across the C70 molecules occurs predominantly across the C(2)-C(4) and C(5)-C(6), whereas the polymerization across the C(1)-C(2) bonds is only of low probability, if such polymerization takes place. It may be premeditated that the heat of reaction across the C(11)-C(12), exhibiting single-bond performance, becomes larger than that across the bond C(9)-C(10) due to the appreciably large pinch of the cyclobutane structure of C140(i), in particular the C(11)-C(12) bond. For evaluating the effect of superposition of the 2p2 lobe of sp2 carbon neighboring to the cross-linking bondage at the time of [2+2] cycloaddition, the values of heat generated in the C70 dimer, C70–C60 polymer and C70H2 were compared. Although detailed numerical data are not shown, it may be premeditated that the effect of superposition can be safely disregarded across C140(a) to (h), insofar as calculations of the MNDO approximate level are concerned.

The mass distribution in the vicinity of the dimer by the LDITOF-MS of the C70 polymer film indicates that dimers of C116, C118 etc. are main products. Then, scrutiny is made into the structure of C136 produced on desorbing four carbon atoms making up cyclobutane of a dimer (C70)2, as in the process of obtaining D2h-symmetrical C116 from C60 and recombining remaining C68. These structures are shown in FIGS. 28 to 36. Table 2 shows comparative values of the generated heat (ΔHf0) of C136.

In Table 2, ΔHf0 AN-1, ΔHf0 PM-3, cross-linking and the binding length are the same as those of Table 1.

TABLE 2

| cluster (reference drawing) | ΔHf0(r) (kcal/mol) AN-1 | ΔHf0(r) (kcal/mol) PM-3 | cross-linking | binding length (Å) |
|---|---|---|---|---|
| C136(a) (FIG. 28) | −65.50 | −61.60 | C(1)-C(8'), C(3)-C(5')<br>C(5)-C(3'), C(8)-C(1') | 1.351<br>1.351 |
| C136(b) (FIG. 29) | −64.44 | −61.54 | C(1)-C(3'), C(3)-C(1')<br>C(5)-C(8'), C(8)-C(5') | 1.351<br>1.351 |
| C136(c) (FIG. 30) | 0 | 0 | C(4)-C(13'), C(7)-C(10')<br>C(10)-C(7'), C(13)-C(4') | 1.352<br>1.352 |
| C136(d) (FIG. 31) | +0.09 | +0.11 | C(4)-C(7'), C(7)-C(4')<br>C(10)-C(13'), C(13)-C(10') | 1.351<br>1.354 |
| C136(e) (FIG. 32) | +112.98 | +102.89 | C(5)-C(8'), C(8)-C(5')<br>C(11)-C(14'), C(14)-C(11') | 1.353<br>1.372 |
| C136(f) (FIG. 33) | +69.47 | +59.44 | C(5)-C(14'), C(14)-C(5')<br>C(11)-C(8'), C(8)-C(11') | 1.358<br>1.352 |
| C136(g) (FIG. 34) | −3.74 | −9.20 | C(5)-C(15'), C(15)-C(5')<br>C(12)-C(9'), C(9)-C(12') | 1.344<br>1.352 |
| C136(h) (FIG. 35) | +2.82 | −5.30 | C(5)-C(9'), C(9)-C(5')<br>C(12)-C(15'), C(15)-C(12') | 1.372<br>1.334 |

TABLE 2-continued

| cluster (reference drawing) | ΔHf0(r) (kcal/mol) AN-1 | ΔHf0(r) (kcal/mol) PM-3 | cross-linking | binding length (Å) |
| --- | --- | --- | --- | --- |
| C136(i) (FIG. 36) | +98.50 | +84.36 | C(13)-C(10'), C(15)-C(16') C(10)-C(13'), C(16)-C(15') | 1.376 1.376 |

Figure 18:
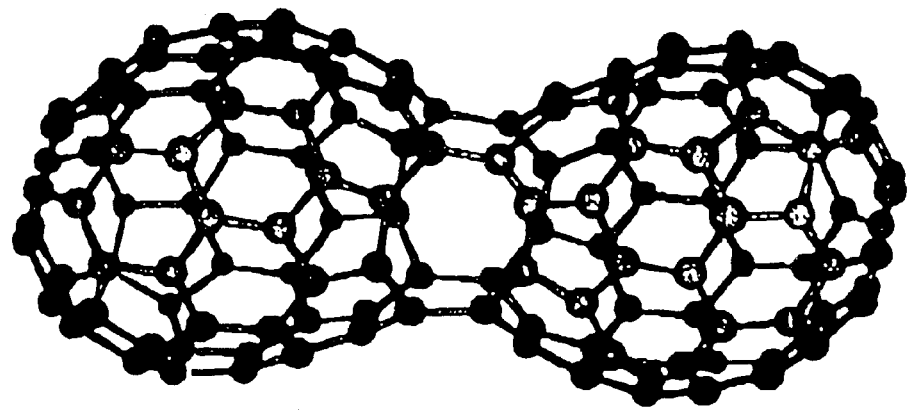
FIG. 18 shows a dimeric structure of a C70 molecule felt to be produced in the fullerene polymerization process.

It is noted that C136(a) to (i) are associated with C140 (a) to (i), such that C(2) and C(4), which formed a cross-link at C140(a), have been desorbed at C136(a). It is noted that carbon atoms taking part in the four cross-links of C136(a) are C(1), C(3), C(5) and C(8), these being SP2 carbon atoms. Among the dimers shown in Table 1, that estimated to be of the most stable structure at the PM-3 level is C140(c). Therefore, in table 2, ΔHf0 of C136(c), obtained from C140(c), is set as the reference for comparison. It may be seen from Table 2 that the structures of C136(a) and C136(b) are appreciably stabilized and that C136(e), C136(f) and C136(i) are unstable. If the calculated values of ΔHf0of per a unit carbon atom of the totality of C140 and C136 structures are evaluated, structure relaxation in the process from C140 to C136 only take place in the process from C140(a) and (b) to C136(a) and (b). Thus, the calculations of the MNDO approximation level suggest that, in the C70 cross-link, not only are the sites of the [2+2] cycloaddition of the initial process limited to the vicinity of both end five-membered rings traversed by the main molecular axis, but also is the cross-link structure of the π-covalent system, such as C136, limited to C136 obtained from the dimer of C70 by the cycloaddition reaction across C(2)-C(4) bond. The molecular structure of more stable C136, yielded in the process of relaxation of the structure shown in FIG. 17, is shown in FIG. 18.

Figure 1B:
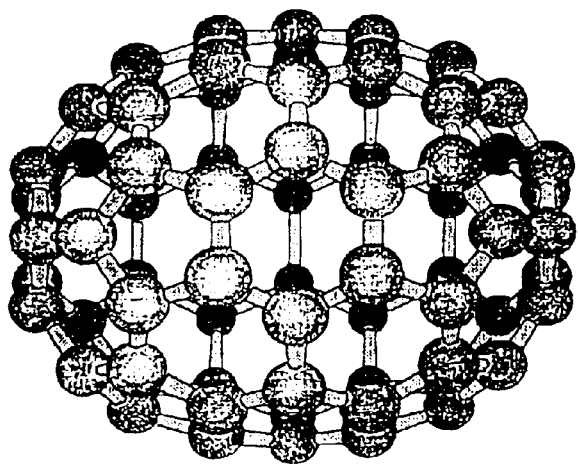
Figure 2:
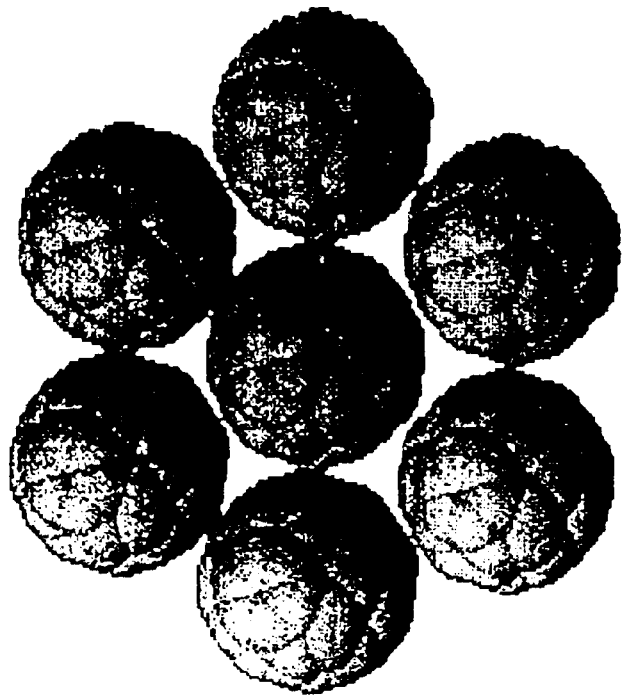
FIG. 2 shows the structure of a C60 evaporated film.

The polymer film of C60, obtained by the polymerization method of electromagnetic excitation, such as plasma, exhibits semi-conductivity, with the band gap evaluated from temperature dependency of the dark current being of the order of 1.5 to 2 eV. Also characteristic of the polymer film is the effect of oxygen diffusion into atmospheric air which is appreciably smaller than that of the evaporated film. The dark current of the C60 polymer film obtained with the micro-wave power of 200 W is on the order of $10^{-7}$ to $10^{-8}$ S/cm, whereas that of the C70 polymer film obtained for the same micro-wave power is not higher than $10^{13}$ S/cm, which is approximate to a value of an insulator. This difference in the electrically conductivity of the polymer films is possibly attributable to the structures of the polymer films. Similarly to the sole cross-link bond in which two-molecular C60 is in the state of open-shell radical state, the cross-link of a dimer of 1,2-C(60) due to [2+2] cycloaddition reaction of FIG. 1 is thought not to contribute to improved electrically conductivity. Conversely, the inter-molecular cross-link, such as C116, forms the π-covalent system, and hence is felt to contribute to improved electrically conductivity. The cross-link structures of C118, C114 and c112, now under investigations, are thought to be a π-covalent cross-link contributing to electrically conductivity.

It may be contemplated that the electrically conductivity usually is not increased linearly relative to the number of electrically conductive cross-links between fullerene molecules, but is changed significantly beyond the permeation limit at a certain fixed number. In the case of C70, the probability of the [2+2] cycloaddition reaction is presumably lower than that in the case of C60, while the structure relaxation to the electrically conductive cross-linked structure such as that from C140 to C136 can occur only on specified sites. In light of the above, the significant difference in electrically conductivity between the two may possibly be attributable to the fact that, in the C60 polymer film, the number of cross-links contributing to electrically conductivity is large and exceeds the permeation limit, whereas, in the case of C70, the permeation limit is not exceeded because of the low probability of polymerization and limitation of formation of electrically conductive cross-links.

Taking into account the history of development of the fullerene polymer film and the mechanism of polymerization thereof, discussed in the foregoing, the manufacturing method of a fullerene polymer film is hereinafter explained.

First, the fullerene molecules, as a starting material, those of C60, C70 and higher-order fullerene may be used, either singly or in combination. Most preferred are the C60 fullerene, the C70 fullerene or mixtures thereof. In addition, the fullerene of higher orders, such as C70, C78, C80, C82, C84 and so forth may be contained therein.

Figure 37:
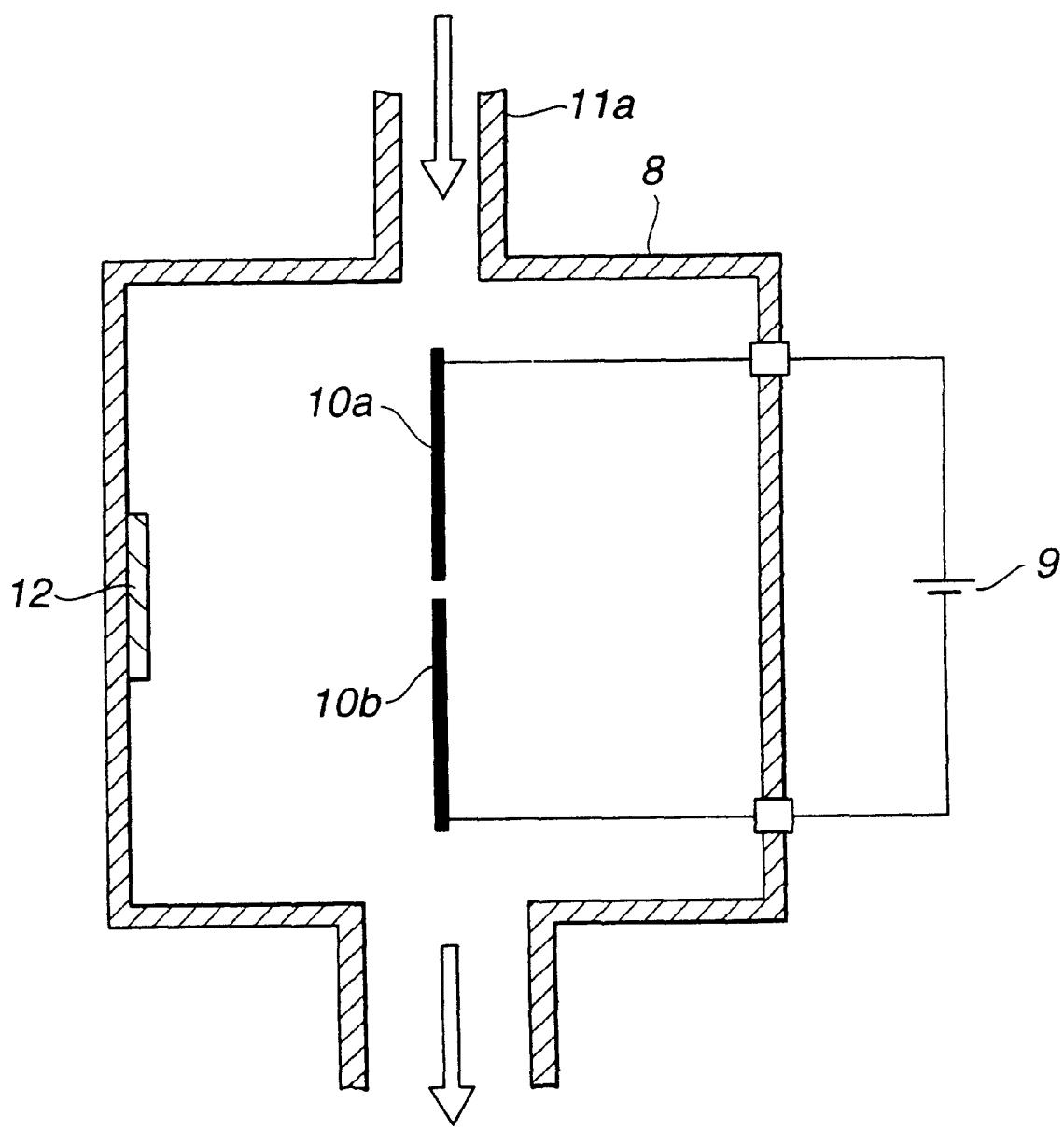
FIG. 37 shows an apparatus for yielding fullerene molecules by arc discharge.

These fullerene molecules may be manufactured by an arc discharge method of a carbon electrode, using an apparatus shown for example in FIG. 37.

In a reaction vessel 8 of the present apparatus, there are mounted a pair of carbon electrodes, connected to an AC or DC source 9, such as counter-electrodes 10a, 10b formed of graphite. After evacuating the reaction vessel 8 by a vacuum pump through an exhaust pump, low-pressure inert gas, such as helium or argon, is introduced via an inlet 11a so as to be charged into the reaction vessel 8.

The ends of the counter-electrodes 10a, 10b are arranged facing each other with a small gap in-between, and a predetermined current and voltage are applied from the DC source 9 to maintain the state of arc discharge across the ends of the counter-electrodes 10a, 10b for a predetermined time.

By this arc discharge, the counter-electrodes 10a, 10b are vaporized so that soot is gradually deposited on a substrate 12 mounted on the inner wall surface of the reaction vessel 8. If this amount of soot deposited is increased, the reaction vessel 8 is cooled and the substrate 12 is taken out, or the soot is recovered using a sweeper.

From this soot, the fullerene such as C60 or C70 may be extracted using a π-electron based solvent, such as toluene, benzene or carbon disulfide. The yielded fullerene, obtained in this stage, is termed crude fullerene, which may be applied to column chromatography to separate C60 and C70 as purified separate products.

The resulting fullerene molecules are used as a starting material in the film-forming process of the fullerene polymer. Among the polymerization or film-forming methods, there are, for example, an electron beam illumination method, an electromagnetic polymerization method (photo polymerization method, plasma polymerization method and micro-wave polymerization method) and an electronic polymerization method.

Photo Polymerization Method

In this polymerization method, an apparatus including a reaction chamber capable of being maintained at a reduced pressure or in vacuum, heating means, such as resistance heating means, for vaporizing the fullerene molecules, and illumination means for illuminating the light, such as ultraviolet beam, through the window of the reaction chamber, is used. A fullerene polymer film is formed on the substrate as fullerene is evaporated and illumination of ultraviolet light is continued for a predetermined time. At this time, the fullerene molecules are excited by light and polymerized through the excited state.

It is noted that polymerization occurs by forming an evaporated film and illuminating ultraviolet rays thereon, without illuminating the light as the evaporation is going on. In this case, there are occasions wherein only a superficial layer of the film is polymerized, whilst the inside of the film is not polymerized. An experiment conducted by the present inventors have revealed that a pattern of cracks can be produced on the surface of the evaporated fullerene film on UV irradiation, as may be observed over a microscope.

Electron Beam Polymerization Method

This method uses an electron beam radiated from the electron gun in place of the light such as ultraviolet light. The principle of polymerization is similar to the photo polymerization method, that is, the fullerene molecules are excited by an electron beam and polymerized through the excited state.

Plasma Polymerization Method

Among the plasma polymerization methods, there are a high-frequency plasma method, a DC plasma method and an ECR plasma method. Here, the high-frequency plasma method, which is now in widespread use, is explained by referring to the drawings.

Figure 38:
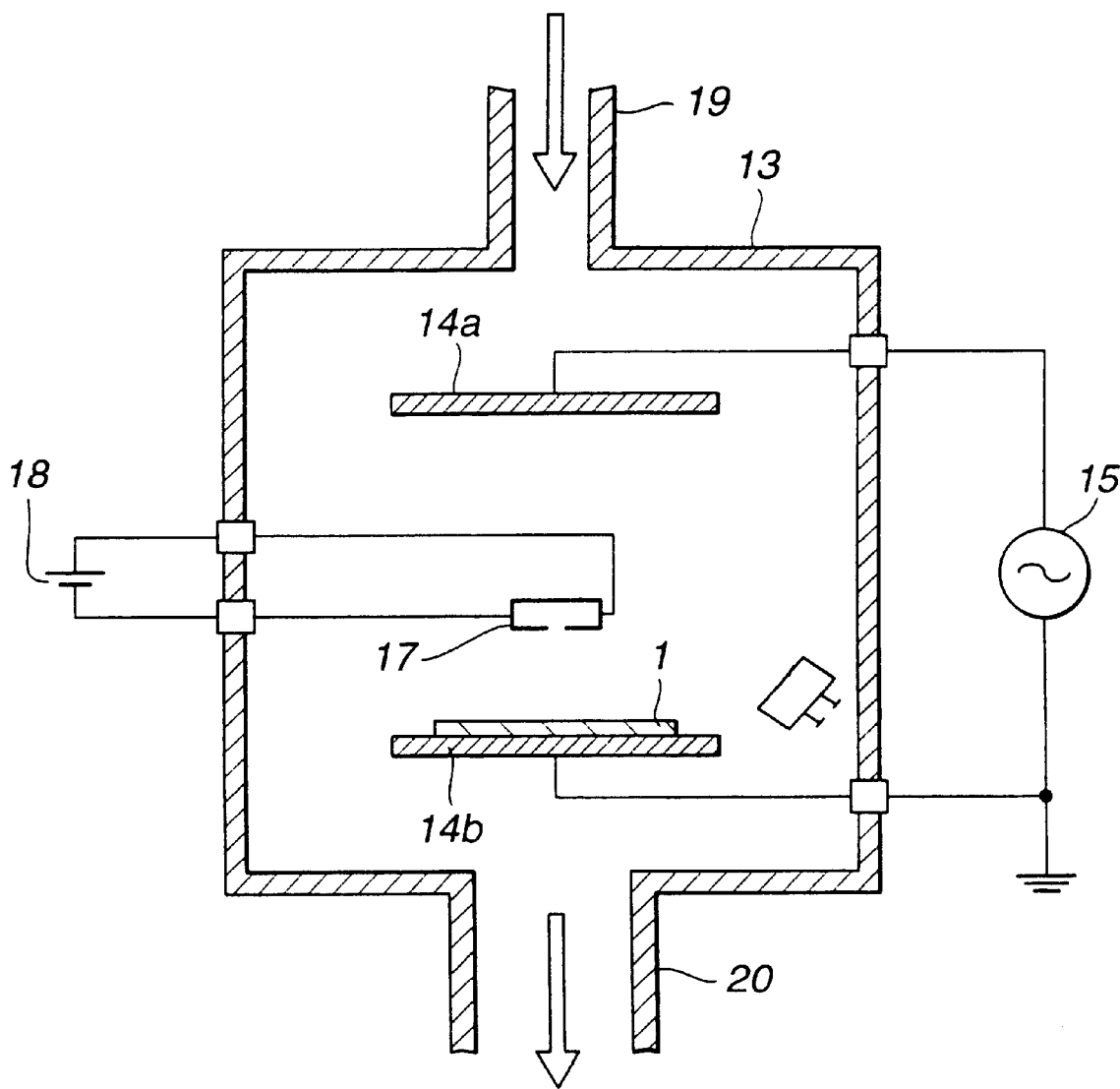
FIG. 38 shows an apparatus for producing a fullerene polymer film by the plasma polymerization method.

FIG. 38 shows a typical high-frequency plasma polymerization apparatus, including a vacuum vessel 13, within which are arranged a pair of electrodes 14a, 14b facing each other. These electrodes are connected to an outer high frequency power source 15. On one 14b of the electrodes is set a substrate 1 for permitting a fullerene polymer film to be deposited thereon.

In this vacuum vessel 13, there is arranged a vessel 17 formed e.g., by a molybdenum boat, accommodating the fullerene molecules, as a starting material. This vessel 17 is connected to an external power source for resistance heating 18.

In the polymerization apparatus, constructed as described above, a low-pressure inert gas, such as argon, is introduced through an inlet 19 into the vacuum vessel 13, which is evacuated through the exhaust port 20. After the vacuum vessel 13 is charged with the inert gas, the current is supplied to the vessel 17 to heat it to vaporize the fullerene molecules therein. The high frequency voltage is applied from the high frequency power source 15 to generate a high frequency plasma across the electrodes, while illumination is made into the fullerene gas to form a fullerene polymer film holding the π-electron skeleton on the substrate 1.

Meanwhile, a DC power source may be used in place of the high frequency power source 15 (DC plasma method). If the vessel 17 is heated without actuating these power sources, that is without generating the plasma, the fullerene is not polymerized, but its evaporated film is formed on the substrate 1.

If the temperature of the substrate 1 is excessively high, the amount of deposition of the fullerene polymer film is decreased. Therefore, the substrate is usually kept at a temperature of 300° C. or less. If the plasma power is of the order of 100 W, the temperature scarcely exceeds 70° C.

Figure 39:
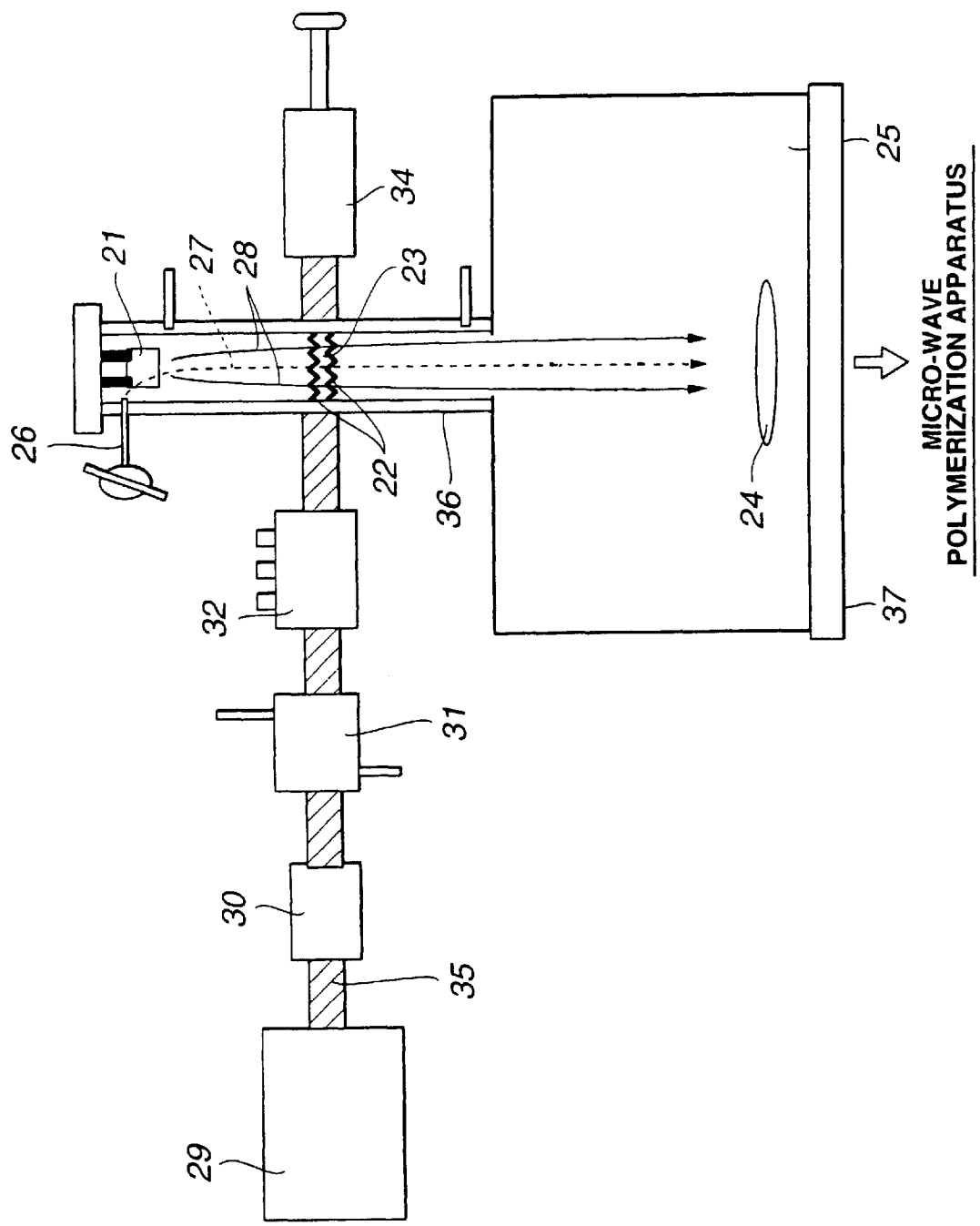
FIG. 39 shows an apparatus for producing a fullerene polymer film by the micro-wave polymerization method.

FIG. 39 shows a typical microwave polymerization apparatus including a vessel 21, such as a molybdenum boat, accommodating the fullerene molecules as a supply source of a starting material, a microwave operating portion 23 for causing the microwave 22 to operate on flying fullerene molecules, a reaction chamber 25 for generating a fullerene polymer by induction by the microwave 22 (excitation of asymmetric plasma) and for forming its film on the substrate 24, and a microwave generating device for generating the microwave 22.

In an inner wall of the polymerization apparatus in the vicinity of the vessel 21 is opened a gas inlet tube 26 for introducing a carrier gas, such as an argon gas, into the inside of the apparatus. This carrier gas 27 has not only the capability of entraining fullerene molecules 28 to bring them onto the substrate 24 in the reaction chamber 25 but the capability of modifying the surface of the substrate 24 in the following manner.

That is, if, before introducing the fullerene molecules 28 into the inside of the apparatus, the carrier gas 27 is introduced and excited by the microwave operating portion 23 so as to be bombarded onto the surface of the substrate 24 in the reaction chamber 25, the substrate surface is etched by the excited carrier gas 27 to improve adhesion of the substrate surface with the fullerene polymer film deposited thereon.

The microwave generating device (microwave unit) includes a microwave oscillation source 29, an isolator 30, a power meter 31, a microwave power tuner 32 and a reflection cavity 34, interconnected by a wave guide tube 35. Of these, the microwave oscillation source 29 is made up of an oscillation source, such as a magnetron, whilst the isolator 30 and the power meter 31 have the functions of rectifying the microwave and of detecting the microwave power. The microwave power tuner 32 is a device for adjusting the number of oscillations of the microwave, having the function of matching the number of oscillations, whilst the reflection cavity 34 is a device for reflecting the microwave and matching the wavelength to convert the microwave in the microwave operating portion 23 into a standing wave.

The reaction chamber 25 may be larger in diameter than a resonant tube 36 which is a flow duct of the carrier gas 27 and the fullerene molecules 28, and is configured so that the fullerene molecules induced efficiently to high density in the microwave operating portion 23 of the resonant tube will be led onto a substrate 24 of e.g., silicon, provided on a support, not shown, where the fullerene polymer film will be formed uniformly. In the reaction chamber 25, there is provided an evacuating system 37 for maintaining a pre-set pressure in the reaction chamber 25.

The support for mounting the substrate 24 thereon may be electrically conductive or insulating. It may also be provided with heating means, such as current supplying means.

If this microwave polymerization device is to be used, the inside of the reaction chamber 25 is maintained at a pressure of approximately 0.05 to 1 Torr, with e.g., an argon gas, whilst the vessel 21 is heated by heating means, not shown, for vaporizing the fullerene molecules therein. The vaporized fullerene molecules then are illuminated with e.g., a high frequency plasma of the order of 13.56 MHz by the microwave operating portion 23. This excites the fullerene molecules to form a fullerene polymer film on the substrate 24.

The temperature of the substrate 24 of 300° C. or less usually suffices. If this temperature exceeds 300° C., the amount of deposition of the fullerene polymer film is occasionally lowered. It is noted however that deposition of the fullerene polymer film is facilitated by applying a bias voltage. No special control is needed to maintain the substrate temperature in the above range during film formation. For example, if the microwave power is of the order of 100 W, the temperature rarely exceeds 100° C. Meanwhile, if the substrate 24 is put on the microwave operating portion 23, the temperature is occasionally increased to near 1000° C.

Method of Illuminating the Evaporated Film with Electromagnetic Wave

Figure 8:
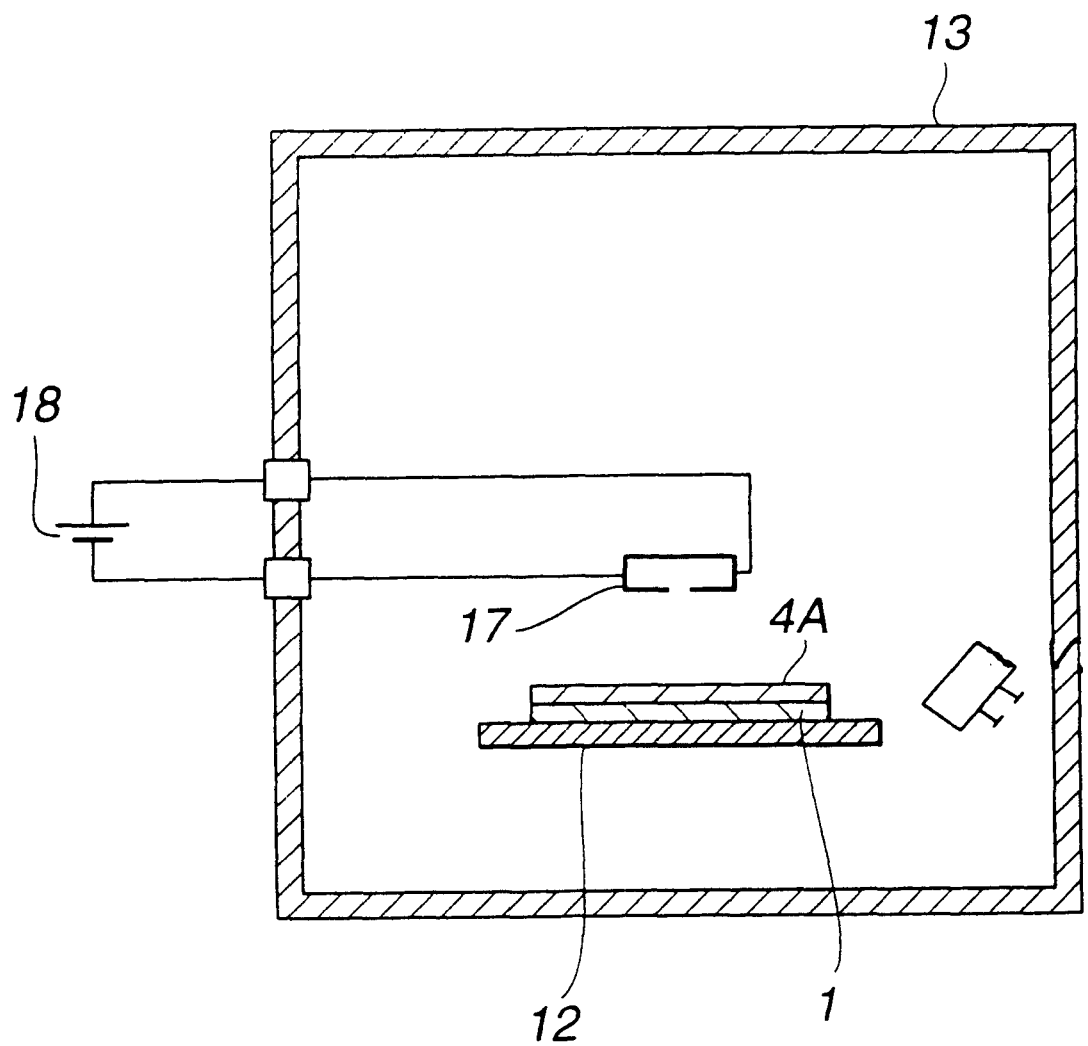
FIG. 8 is a schematic cross-sectional view of a fullerene evaporating apparatus according to the present invention.

FIG. 8 shows an evaporation device including a susceptor 12 arranged in the vacuum vessel 13. On the susceptor 12 is set a substrate on which to deposit an evaporated fullerene film. This substrate may, for example, be a substrate 1 on which an electrically conductive high molecular film has been formed on a light-transmitting electrode.

In the vacuum vessel 13 is arranged a vessel 17, such as a molybdenum boat, for accommodating fullerene molecules as a starting material therein. This vessel is connected to an external resistance heating power source 18.

In the evaporation device, constructed as described above, the current is supplied to the vessel 17 in the evacuated vacuum vessel 13, to heat the vessel to vaporize the fullerene molecules therein to form an evaporated fullerene film of fullerene 4A on the substrate 1.

Figure 40:
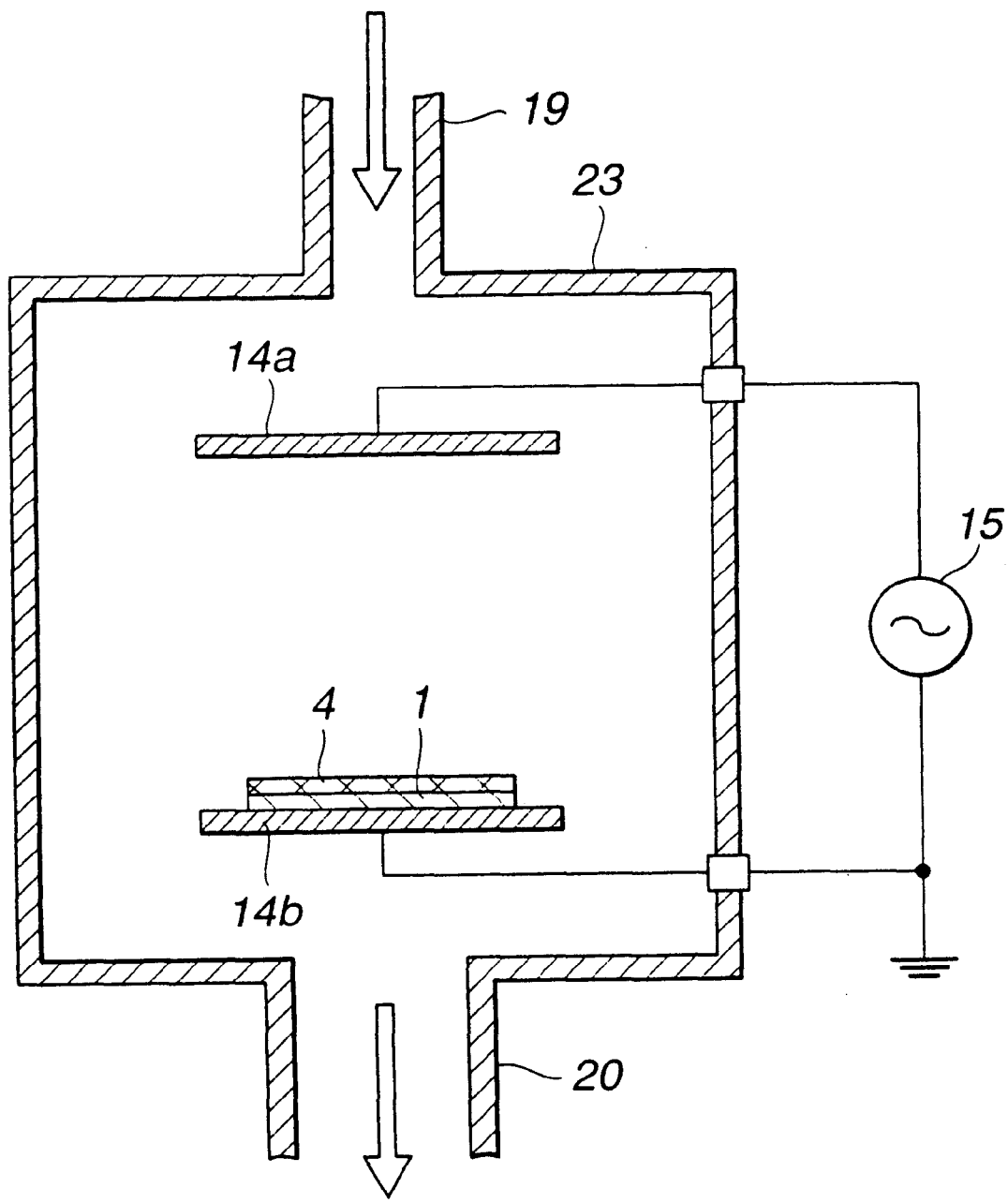
FIG. 40 is a schematic cross-sectional view of a plasma polymerization apparatus for polymerizing a fullerene evaporated film according to the present invention.

Then, in a high frequency plasma polymerization apparatus of FIG. 40, in which a pair of electrodes 14a, 14b are arranged facing each other in a vacuum vessel 23 and are connected to ah external high frequency power source 15, the substrate 1, carrying the evaporated fullerene film 4A, is set.

In this polymerization apparatus, a low pressure inert gas, such as argon, is supplied into the vacuum vessel 23, evacuated through the exhaust port 20, to fill the inside of the vacuum vessel 23 with the gas. The high frequency voltage is applied from the high frequency power source 15 to generate a high frequency plasma across the electrodes 14a and 14b, at the same time as the evaporated fullerene film 4A is illuminated and thereby polymerized to form a fullerene polymer film 4 having the π-electronic skeleton.

The high frequency power source 15 may be replaced by a DC power source (direct current plasma method). If the devices of FIGS. 8 and 40 are combined as shown in FIG. 38, and the vessel 17 is heated without driving the power source 15, that is without generating the plasma, the evaporated fullerene film 4A is formed on the substrate 1. The power source 15 may be driven in the same apparatus to effect polymerization in a manner as described above.

Electronic Polymerization Method

Figure 41:
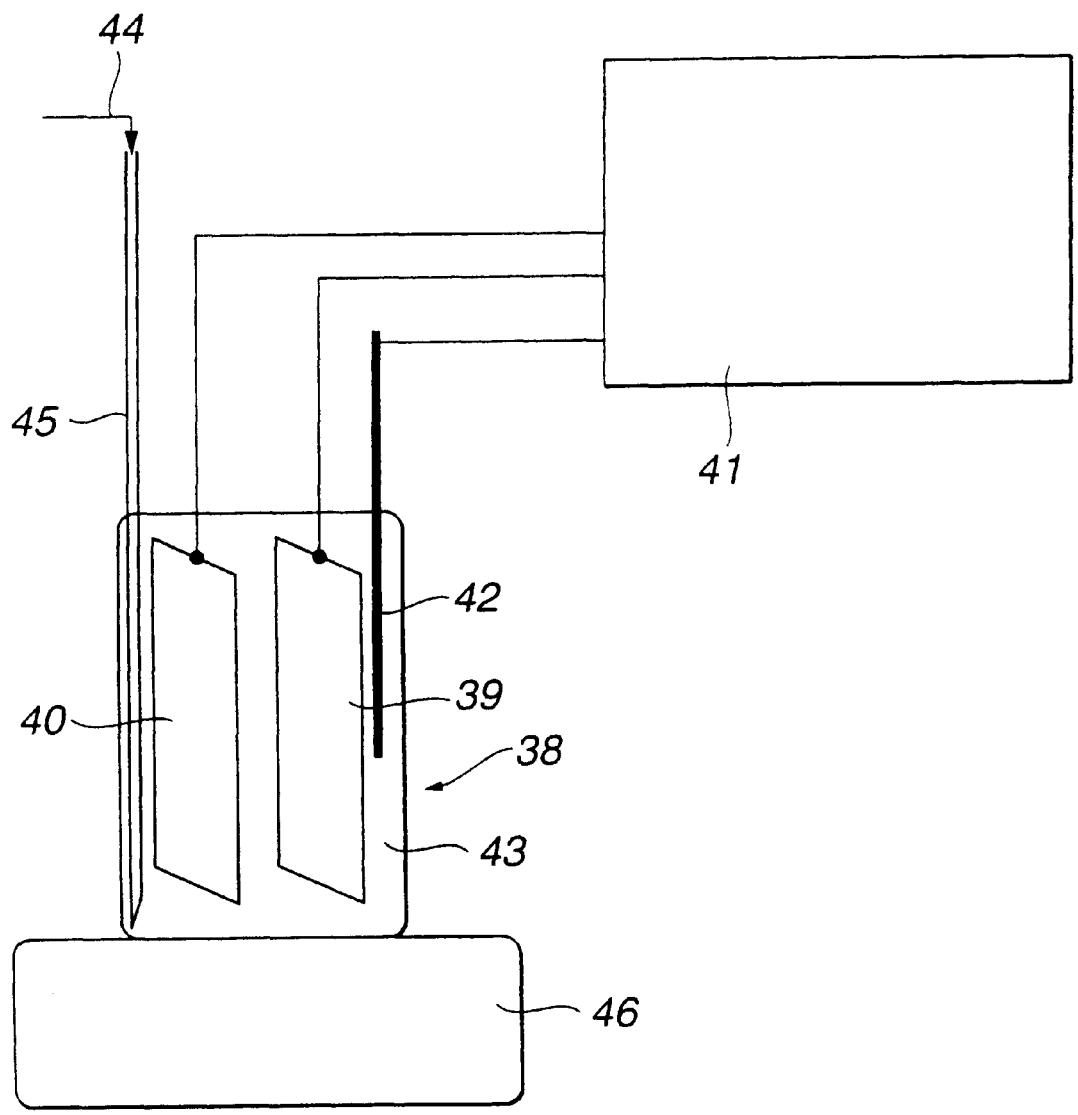
FIG. 41 shows an apparatus for producing a fullerene evaporated film according to the present invention.

FIG. 41 shows a typical electronic polymerization apparatus in which an electrode 39 as a positive electrode and an electrode 40 as a negative electrode, both connected to a potentiostat 41, are provided in an electronic cell 38, and in which a reference electrode 42 is connected to the same potentiostat 41 so that a pre-set electric potential is applied across the electrodes 39 and 40.

The electronic cell 38 is provided with a gas inlet tube 45 for introducing the inert gas 44 for removing an oxygen gas etc from a non-aqueous solvent 43. In a lower portion of the electronic cell 38, there is provided a magnetic stirrer 46 for causing movement of a stirrer, not shown, provided in the cell.

For operating the electronic polymerization apparatus, constructed as described above, fullerene molecules, as starting material, a supporting electrolyte, for accelerating electrolysis, and the non-aqueous solvent 43, are charged into the electronic cell 38 and the potentiostat 41 is operated to cause a pre-set electrical energy to operate across the electrodes 39, 40. Then, a majority of the fullerene molecules are turned into anionic radicals, whilst a fullerene polymer is formed as a precipitate as a thin film and/or a precipitate on the negative electrode 40. Meanwhile, the spherically-shaped fullerene polymer, obtained as a precipitate, can be readily recovered by filtration or drying. After recovery, the polymer can be solidified or kneaded into a resin to form a thin film.

Although the electrodes 39, 40 are preferably metal electrodes, they may also be formed of other electrically conductive materials, or by vapor depositing metal or other electrically conductive materials on a silicon or glass substrate. The materials of the reference electrode 42 need not be limited to particular metals, depending on the sort of the supporting electrolyte.

The removal of e.g., oxygen by the inert gas 44 may usually be helium gas bubbling. The helium gas may also be replaced by other inert gases, such as nitrogen or argon. For completely removing oxygen etc, it is advisable to dehydrate the non-aqueous solvent, composed of first and second solvents, as later explained, using a dehydrating agent, to evacuate the solvent, to save the respective solvents in ampoules and to introduce the solvents saved in the ampoules through a vacuum line into the electronic cell 38.

It should be noted that oxygen etc is removed from the electronic solution in order to prevent oxygen etc from being captured into the fullerene polymer film to suppress paramagnetic centers to improve stability of the fullerene polymer film.

As the supporting electrolyte, tetrabutyl ammonium perchloride, lithium tetrafluoro borate ($LiBF_4$), lithium hexafluoro phosphate ($LiPF_6$), sodium peroxide ($NaClO_4$), $LiCF_3SO_3$, and lithium hexafluoro arsenide ($LiAsF_6$) may be used. If these supporting electrolytes are used, the produced spherical carbon polymers tend to be precipitated in the electronic solution.

If lithium perchloride ($LiClO_4$) or tert-butyl ammonium perchlorate is used, a spherically-shaped carbon polymer can be produced as a thin film on the electrode.

There are occasions wherein the physical properties of the fullerene polymer film produced on the electrode are slightly affected depending on selection of the supporting electrolytes. In general, if large positive ions, such as ammonium salts, are present as counter-ions in a non-aqueous solvent, a fullerene polymer film of lower mechanical strength tends to be deposited on the electrode. On the other hand, if lithium ions are present as counter-ions, there is produced a fullerene polymer film having a larger mechanical strength and a mirror-like surface.

According to the present invention, a mixed solvent composed of a first solvent, capable of dissolving fullerene molecules, and a second solvent, capable of dissolving the supporting electrolyte, is preferably employed. The mixing ratio of the first solvent to the second solvent is preferably 1:10 to 10:1 in volume ratio.

The first solvent is preferably a solvent of lower polarity, having a π-electronic system (low polarity solvent). Examples of this sort of the solvent include one or more selected from the group of carbon disulfide (CS2), toluene, benzene and o-dichlorobenzene.

The second solvent is preferably an organic solvent having a high dielectric constant, such as, for example, acetonitrile, dimethyl formamide, dim ethyl sulfoxide and dimethyl acetoamide. Of these, acetonitrile is most preferred.

In general, the fullerene molecules are dissolved only in low-polar solvent, such as carbon disulfide, while being extremely low in solubility even in aliphatic solvents, such as n-hexane. This is the most serious problem in electronic polymerization of the fullerene molecules.

The reason is that the supporting electrolyte used in electronic polymerization is dissolved only in polar solvents, such as water.

In carrying out electronic polymerization of the fullerene molecules, it is necessary to use such a solvent as is capable of dissolving both the fullerene molecules and the supporting electrolyte. However, there lacks a single solvent satisfying this condition. At least a mixed solvent made up of individual solvents having the above-mentioned dissolving properties needs to be used.

However, mixed solvents satisfying these conditions may not unconditionally be used. If such mixed solvent simply is used, it is a frequent occurrence that the solvent is insufficient in solubility for the fullerene molecules and/or the supporting electrolyte.

For example, an aqueous solvent, including water, is known to be an optimum solvent for the supporting electrolyte which is a salt. However, it is only insufficiently soluble in the low-polar solvent capable of dissolving fullerene molecules. Therefore, the mixed solvent composed of the two solvents cannot be said to be optimum.

Our researches have revealed that the desirable mixed solvent used in the present invention is made up of the first and second solvents, with the first solvent being a low polar solvent and the second solvent being an organic solvent of high polarity and large dielectric constant.

Among the above-specified second solvents, acetonitrile, a solvent frequently used in preparing radicals of an organic matter in the presence of a supporting electrolyte in an electronic cell, is most preferred.

It is however unnecessary to use this acetonitrile as the second solvent since dimethyl formamide or other organic solvents are also desirably used in the present invention.

In applying the potential during electronic polymerization, one of the constant current mode and the constant voltage mode may be selectively used. In the former mode, if a high-resistance fullerene polymer film is formed on an electrode, the current value tends to be lowered to raise the voltage. In such situation, it is difficult to maintain a constant reaction because of different states of fullerene polyanions. It is therefore preferred to carry out electronic polymerization under the constant voltage mode, even if the current value is undesirably lowered.

If electronic polymerization is effected simply under a constant potential condition, it is unnecessary to limit the power source only to the potentiostat, shown in the drawing, such that it suffices to use a simple DC power source comprised of a dry cell and a variable resistor both of which are commercially available.

Using an apparatus shown in FIG. 41, fullerene polymerization was effected in the presence of a variety of supporting electrolytes. Our analyses have indicated that the fullerene molecules, if dissolved, are turned into electrically negative anion radicals. Since these anion radicals are reacted with electrically neutral fullerene molecules or with one another, so that a fullerene polymer film is produced on the electrode. This polymerization process is in need of extremely delicate temperature control and control of the electronic potential. If the aforementioned specified mixed solvent is used, it is not so hard to dissolve the fullerene molecules or to donate electrical charges. However, if polymerization has occurred not on the electrode surface but in the mixed solvent, the fullerene polymer is precipitated because of the low solubility. If the amount of the precipitate is excessive, it is not deposited efficiently on the electrode surface to lower the efficiency in thin film formation. If, in general, heating for accelerating the reaction is not performed and lithium is reacted as positive ions of the supporting electrolyte, there is produced a solid lustrous fullerene polymer film.

The above-described electronic polymerization method for fullerene has inherently developed by the present inventor in order to produce a fullerene polymer film composed only of [2+2] cycloaddition of C60 fullerene. Such polymer cannot be produced by the gas phase reaction, such as other plasma polymerization method. The present inventor has conducted scrutiny, based on semi-empirical level molecular orbit calculations, as to whether or not the aforementioned electronic polymerization reaction is possible thermodynamically. If the counter-ion is lithium, the results of calculations of MNDO approximations, in which atomic parameters of lithium ions are set, predicted the following values of the generated heat for C60, C60-Li, C120-Li and C120-L2.

C60: 869.4182 kcal/mol

C60-Li: 768.001 kcal/mol

C120-Li: 1525.716 kcal/mol

C120-Li2: 1479.057 kcal/mol

It is noted that C120 is a dimer of C60 resulting from cyclo-addition, shown in FIG. 9, and that lithium ion has the most stable structure in which the lithium ion is sandwiched between two fullerene molecules of the cross-linked structure. The calculations of the system including the lithium compound were executed in their entirety by a non-limiting Hartrey-Fock method. From these results of calculations, the following conclusions are derived:

(1) C60 is appreciably stabilized by lithium coordination. This is ascribable to the fact that the lowest void orbit of C60 is at an appreciably lower position than free electrons.

(2) The reaction heat of 2C60- Li=C120-Li is estimated to be −46.945 kcal/mol, this reaction being similarly exothermic. These results of calculations represent the energy difference between the initial state and the terminal state in vacuum and are not intended to find out the potential barrier to the reaction.

However, the present results of calculations support the fact that, if there is only negligible entropy contribution, such as steric hindrance, during the reaction, there is obtained good correlation with the free energy of the system, such that the aforementioned reaction can take place easily.

On the surface of the fullerene polymer film, obtained by the above-mentioned different polymerization methods, there are partially left fullerene molecular structures, so that numerous bonds of the double bond type exist. Therefore, surface modification (surface processing) in a variety of ways is possible.

For example, the fullerene polymer film can be surface-modified, using techniques such as microwave induction, DC plasma or AC plasma, in an atmosphere of a hydrocarbon gas, such as acetylene, methane, ethane, propane, toluene, benzene, acetone, acetonitrile, ethanol or methanol, or a gas, such as oxygen, hydrogen, chlorine or fluorine. Alternatively, the fullerene polymer film may be surface-modified in a solvent using metal complex compounds or organic radicals.

This surface modification is effective to modify the fullerene polymer film or to afford specificity thereto depending on the objective or application.

Meanwhile, the fullerene polymer film, in particular the fullerene polymer film obtained by the microwave polymerization method, suffers the problem of dangling spin. If, for example, microwave polymerization is carried out at ambient temperature with a power of from 100 W to hundreds of W, using C60 and/or C70 as a starting material, there is produced a fullerene polymer film containing approximately 1018 spins/g of dangling spin.

This dangling spin significantly affects the electrically conductivity of the fullerene polymer film, band structure or chronological stability of the physical properties.

This dangling spin is possibly produced by the fact that no ideal cross-linked structure has not been formed. The amount of the dangling spin can be reduced to some extent by adjusting the substrate temperature for depositing the fullerene polymer film or by exposing the film to an atmosphere such as a hydrogen plasma. The process of decreasing the amount of the dangling spins may be confirmed from the difference in the absorption intensity by the electron spin resonance method.

The present invention will be explained more specifically, with reference to the drawings. However, the present invention is not limited to these specified Examples.

EXAMPLE 1

First, fullerene molecules as a starting material for forming the fullerene polymer film were prepared as follows: In an apparatus shown in FIG. 37, arc discharge was carried out by the DC current of 150 A, in an atmosphere of 100 Torr of helium, using a graphite rod 10 mm in diameter and 35 cm in length. After the graphite rod has mostly vaporized to give a soot containing the fullerene, the polarities of the two electrodes were reversed and deposited products on the inherent negative electrode, such as carbon nano-tubes, were further vaporized to form soot. This soot, deposited in a water-cooled reaction vessel, was recovered by a sweeper, and extracted with toluene to yield crude fullerene, which then was washed with hexane, dried and purified by vacuum sublimation. The fullerene molecules, thus produced, were subjected to time-of-flight mass spectrometry. It was thus found that the fullerene molecules contained C60 and C70 at a rate of approximately 9:1.

Then, using the high frequency polymerization apparatus, shown in FIG. 38, a fullerene polymer film was formed on a polyethylene terephthalate (PET) film, as a substrate. The fullerene molecules were then charged into a molybdenum boat and installed on a reaction site of a vacuum vessel of the high frequency plasma (rf plasma) polymerization apparatus. After sufficiently evacuating the inside of the vacuum vessel by a molecular turbo-pump, an argon was started to be introduced. After the pressure in the inside of the vacuum vessel was constant at 0.5 Torr, the high frequency power source was operated. As the output was stable at 50 W, the current was supplied to the molybdenum boat and the current value was gradually raised to raise the temperature. The fullerene vaporization and deposition were monitored by a quartz film thickness sensor installed laterally of a substrate. For confirmation, the film thickness of the fullerene polymer film was measured using a contact film thickness meter. For measuring the current value, a nano-ammeter was used. The band gap of the fullerene polymer film was determined from the temperature dependency of the current value. During the film formation, a glass substrate and a silicon substrate were simultaneously set in a bell jar to measure physical properties. The mass spectrography of the fullerene polymer film was effected by ionization and ablation by a pulsed nitrogen laser using a time-of-flight mass spectrometer. The dangling spin was measured using an x-band electronic spin resonation device in a nitrogen atmosphere. The number of dangling spins per unit weight of the fullerene polymer thin film was found by the relative comparison method of the third and fourth absorption lines from the low magnetic field of a digital manganese marker, using a solution in toluene of d-tert-butyl nitroxide as a standard spin. The results are as follows:

film thickness (as measured with a contact film thickness meter): 500 nm electrically conductivity: $1.0 \times 10^{-9}$ S/cn band gap: 1.5 eV dangling: $1.5 \times 10^{18}$ spins/g wherein the value of the band gap is found from the results of measurement of the transmittance by the forbidden-indirect method.

Figure 42:
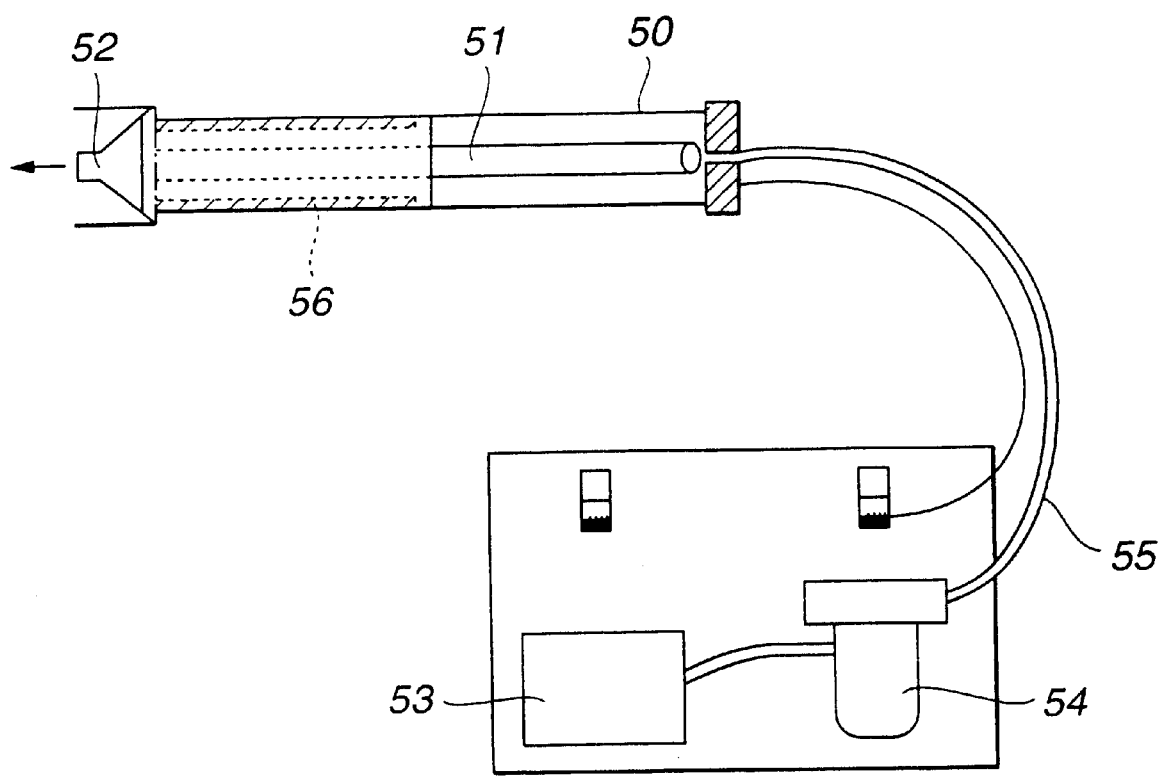
FIG. 42 is a schematic view showing an illustrative evaluation apparatus for evaluating the catalytic performance.

Of a layered product of the fullerene polymer film and a polyethylene terephthalate film, the function as a catalyst was evaluated using an evaluation device shown in FIG. 42. This evaluation device was made up of an aluminum tube 50, with a length of 30 cm, within which was mounted an UV lamp 51 of 40 W connected to a power source. One end of the UV lamp 51 was connected to a Teflon cap 52 mounted at an outlet of the tube 50, an inlet of which was connected by a tube 55 to a sample gas pump 53 through a moisture-removing filter 54. On the inner wall of the tube 50 was bonded the layered product 56 with an adhesive.

Into the inside of the tube 50 of the evaluation device, dry air containing 500 ppm of formaldehyde was fed from the pump 53 without the intermediary of the filter 54, while the UV lamp 51 was lit. The flow rate of the dry air was adjusted to approximately 1 second from the inlet to the outlet of the tube 50.

After the UV lamp 51 was lit, the concentration of formaldehyde contained in the outlet gas was measured with gas chromatography. Table 1 shows the measured results.

EXAMPLE 2

An experiment was carried out in the same way as in Example 1 except using a commercialized UV fluorescent tube for sterilization in place of the UV light employed in Example 1. Table 1 shows the measured results of the formaldehyde concentration.

EXAMPLE 3

An experiment was carried out in the same way as in Example 1 except using a black light in place of the UV light employed in Example 1. Table 1 shows the measured results of the formaldehyde concentration.

EXAMPLE 4

An experiment was carried out in the same way as in Example 1 except using a C60/C70 mixture as a starting material fullerene for film forming. Table 1 shows the measured results of the formaldehyde concentration.

Comparative Example 1

For comparison, similar measurements were made without sticking the layered product in the tube of the evaluation device. Table 1 shows the results of measurement of the concentration of formaldehyde.

EXAMPLE 5

An experiment was carried out in the same way as in Example 1 except changing the processing time to check chronological changes of the catalytic capability. Table 2 shows the measured results of the formaldehyde concentration.

Comparative Example 2

An experiment was carried out in the same way as in Example 1 except using a C60 evaporated film in place of the fullerene polymer film of Example 1 and also changing the processing time to check the chronological changes of the catalytic capability. Table 2 shows the measured results of the formaldehyde concentration.

EXAMPLE 6

Using a C60/C70 mixture as a starting material fullerene for film forming, a fullerene polymer film was formed on a polyethylene terephthalate film, in the same way as in Example 1, and a minor amount of fine platinum particles were evaporated on this fullerene polymer film by an electron gun. Meanwhile, this evaporation was carried out in vacuum of 10 to 9 Torr.

Figure 43:
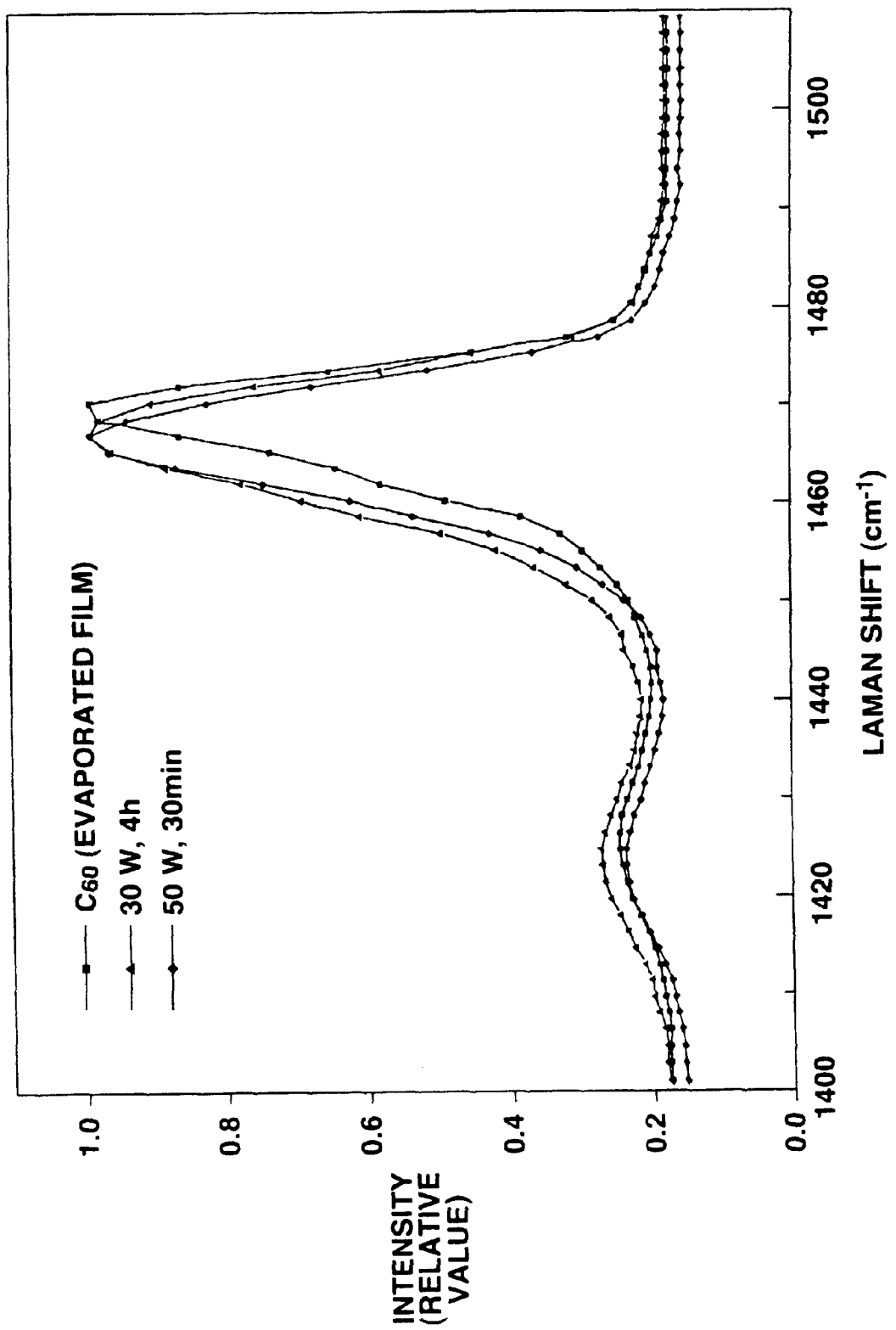
FIG. 43 is a Raman spectral diagram of the fullerene polymer film according to the present invention.

The function as the catalyst of the layered product of the polyethylene terephthalate film and the fullerene polymer film, carrying the fine platinum particles on its surface, was evaluated using the following measurement device. This measurement device is comprised of the evaluation device of FIG. 43 less the pump 53 and the filter 54 and plus a gas bomb in which was charged dry air containing 500 ppm of formaldehyde. This gas bomb was prepared by placing an order on a gas purveying company. The aforementioned layered product is bonded to the inner wall of the tube of the evaluation device, as in Example 1.

From the gas bomb, a dry gas containing 500 ppm of formaldehyde was charged into the tube of the evaluation device, whilst a UV lamp was lit. The flow rate of the dry air was adjusted to approximately 1 second from the inlet to the tube outlet.

After the UV lamp was lit, the concentration of formaldehyde contained in the outlet gas was measured with gas chromatography. Table 3 shows the measured results.

EXAMPLE 7

An experiment was carried out in the same way as in Example 6 except causing fine platinum particles to be carried on the surface of the fullerene polymer film by argon sputtering in place of vapor deposition performed in Example 6. Table 3 shows the measured results of the formaldehyde concentration.

EXAMPLE 8

Ultra-fine platinum particles, called platinum black (commercial product), was dispersed in a water/ethanol mixed solvent to prepare a suspension, which then was coated on the surface of a fullerene polymer film to get the ultra-fine platinum particles carried thereon. An experiment was carried out in the same way as in Example 6 except using this as a catalyst. Table 3 shows the measured results of the formaldehyde concentration.

EXAMPLE 9

An experiment was carried out in the same way as in Example 6 except performing laser processing by XeCl excimer laser in place of vapor deposition for getting ultra-fine platinum particles carried by the fullerene polymer film. Table 3 shows the measured results of the formaldehyde concentration.

EXAMPLE 10

An experiment was carried out in the same way as in Example 6 except bonding the fullerene polymer film with polyethylene terephthalate film formed in Example 6 directly on the inner wall surface of the tube of the evaluation device, that is without evaporating fine platinum particles. Table 3 shows the measured results of the formaldehyde concentration.

EXAMPLE 11

An experiment was carried out in the same way as in Example 6 except using isolated and purified fullerene C60 as a starting material for film forming of the fullerene polymer film. Table 3 shows the measured results of the formaldehyde concentration.

EXAMPLE 12

An experiment was carried out in the same way as in Example 7 except using isolated and purified fullerene C60 as a starting material for film forming of the fullerene polymer film. Table 3 shows the measured results of the formaldehyde concentration.

EXAMPLE 13

An experiment was carried out in the same way as in Example 8 except using isolated and purified fullerene C60 as a starting material for film forming of the fullerene polymer film. Table 3 shows the measured results of the formaldehyde concentration.

EXAMPLE 14

An experiment was carried out in the same way as in Example 9 except using isolated and purified fullerene C60 as a starting material for film forming of the fullerene polymer film. Table 3 shows the measured results of the formaldehyde concentration.

EXAMPLE 15

An experiment was carried out in the same way as in Example 10 except using isolated and purified fullerene C60 as a starting material for film forming of the fullerene polymer film. Table 3 shows the measured results of the formaldehyde concentration.

Comparative Example 3

An experiment was carried out in the same way as in Example 1 except using a polyethylene terephthalate film alone in place of the layered product of the fullerene polymer film and the polyethylene terephthalate film used in Example 6. Table 3 shows the measured results of the formaldehyde concentration.

Comparative Example 4

An experiment was carried out in the same way as in Example 1 except processing the polyethylene terephthalate film used in Comparative Example 3 with a sand paper and bonding a platinum black paste on its surface. Table 3 shows the measured results of the formaldehyde concentration.

TABLE 1

| | light illumination conditions and starting material of fullerene polymer | formaldehyde concentration after light illumination (ppm) |
|---|---|---|
| Ex.1 | fluorescent lamp, C60 | 280 |
| Ex.2 | UV fluorescent lamp for sterilization, C60 | 210 |

TABLE 1-continued

| light illumination conditions and starting material of fullerene polymer | | formaldehyde concentration after light illumination (ppm) |
|---|---|---|
| Ex.3 | black light, C60 | 200 |
| Ex.4 | fluorescent lamp, C60/C70 mixture | 240 |
| Comp. Ex.1 | fluorescent lamp, none | 485 |

TABLE 2

|  | 0 hrs | 10 hrs | 50 hrs | 100 hrs |
|---|---|---|---|---|
| Ex.5 | 280 ppm | 290 ppm | 295 ppm | 295 ppm |
| Comp. Ex.2 | 250 ppm | 310 ppm | 380 ppm | 400 ppm |

TABLE 3

|  | formaldehyde concentration after light illumination (ppm) |
|---|---|
| Ex.6 | 140 |
| Ex.7 | 180 |
| Ex.8 | 100 |
| Ex.9 | 155 |
| Ex.10 | 280 |
| Ex.11 | 118 |
| Ex.12 | 116 |
| Ex.13 | 115 |
| Ex.14 | 180 |
| Ex.15 | 300 |
| Comp. Ex.3 | 485 |
| Comp. Ex.4 | 425 |

As may be seen from Tables 1 to 3, the photocatalyst employing the fullerene polymer film of the present invention has higher decomposition performance than that with the fullerene polymer film of the present invention, in other words, is superior in durability in use.

It is moreover apparent that durability in use is better if fine metal particles are carried on the surface of the fullerene polymer film than otherwise. Meanwhile, it cannot be unequivocally determined which of the fullerene polymer prepared from the C60 fullerene molecules alone or the fullerene polymer prepared form the mixture of C60/C70 fullerene molecules is more meritorious as the starting material of the fullerene polymer. It is however clear at any rate that superior durability is realized by having fine metal particles carried as described above.

EXAMPLE 16

Plasma Polymerization of C60 Evaporated Film

In the present Example, an evaporated fullerene C60 film was processed in an Ar plasma to form a C60 polymer.
Forming a Fullerene Polymer Film As starting material commercially available fullerene C60 molecules were used. This C60 can be prepared as follows: Using a graphite rod 10 mm in diameter and 35 cm in length, in a conventional device, arc discharge was effected with the DC current of 150 A in an atmosphere of 100 Torr of helium. After the graphite rod was mainly vaporized to yield a fullerene-containing soot, the two electrodes were reversed in polarity and the deposited products such as carbon nano-tubes on the inherent negative electrode were vaporized and turned into a soot.

This soot, deposited in a water-cooled reaction vessel, was recovered by a sweeper, and extracted with toluene to yield crude fullerene, which then was washed with hexane, dried and purified by vacuum sublimation. The fullerene molecules, thus produced, were subjected to time-of-flight mass spectrometry (TOF-MS). It was thus found that the fullerene molecules contained C60 and C70 at a rate of approximately 9:1.

Then, using the apparatus shown in FIGS. 8 or 38, a C60 thin film, controlled to a film thickness of 20 Å, was formed on a silicon substrate at $4\times10^{-6}$ Torr, by sublimating and evaporating powders of C60, to form a thin C60 film, controlled to a film thickness of 20 Å, as the evaporated film thickness was measured using a film thickness meter. The C60 powders, set on a molybdenum boat, were heated gradually to approximately 600° C. for degassing and evaporated at a higher temperature.

The evaporated film then was exposed to an Ar plasma of 0.1 Torr in an RF reaction vessel of plan-parallel plates started at 13.56 MHz. Each sample of the C60 thin film was maintained at 50° C. and plasma-processed at 30 W for four hours and at 50 W for thirty minutes to produce C60 polymer films.
Raman Spectroscopy The C60 molecule shows 10 active modes in the Raman spectrum. The strongest line is observed at 1469 $cm^{-1}$. The Ag(2) pentagonal pinch mode (C—C single bond stretching) is the most sensitive to probe the polymerization. Because of the polymerization, a shift of this mode is observable and several new Raman lines are activated due to the loss of molecular symmetry. The shift has been used as a qualitative as well as quantitative measure of the polymerization. A downshift of 10 $cm^{-1}$ was predicted theoretically for the C60 dimer and trimer. A shift of about 20 $cm^{-1}$ was predicted for longer polymers.

The Raman spectra of the processed films are shown in FIG. 1. The Ag(2) pentagonal pinch mode shifts in comparison to C60 by 4 to 5 $cm^{-1}$, respectively. XPS.

Figure 44:
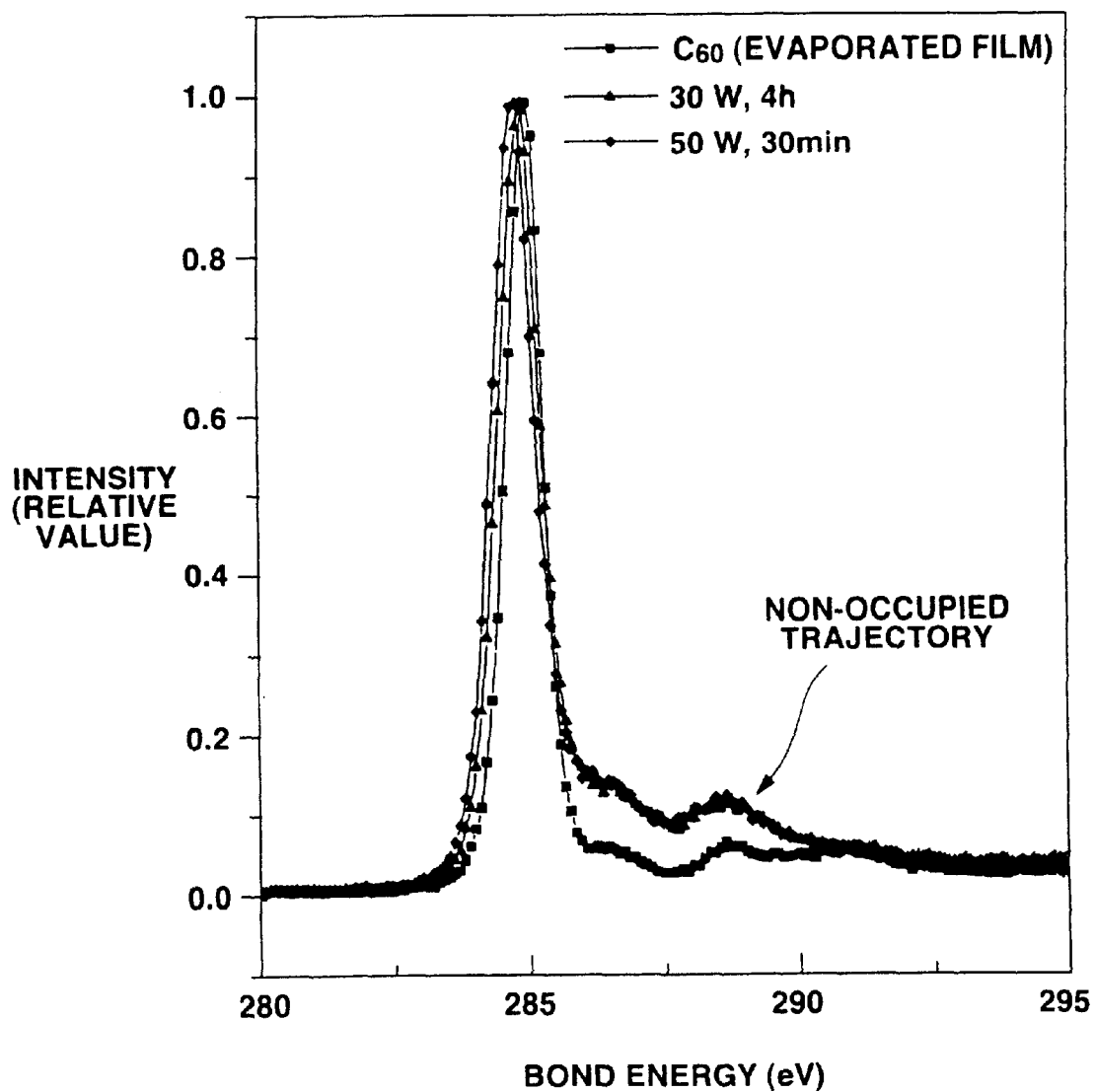
FIG. 44 is a C is spectral diagram of XPS of the fullerene polymer film according to the present invention.

FIG. 44 shows the normalized XPS C 1 s spectra. The C 2 s binding energies of the evaporated C60 film and the plasma processed films were determined to be 284.9, 284.8 (3 W) and 284.7 eV (50 W). The full width of half magnitude (FWHM) of the C 1 s peak of the processed films increased by 0.2 eV to 1.0 eV compared to that of 0.8 eV of the evaporated film. Moreover, the shape of the C 1 s becomes asymmetric to higher binding energies. The calculated chemical shifts of the C is binding energy of +3 eV per four-membered ring in C60 polymers with respect to the isolated C60 molecule explains only partially the differences in the spectra. On the other hand, 13 (30 W) and 15 at % (50 W) oxygen were found by XS. The rather high overall FWHM's (2.7 and 2.5 eV) measured for the O 1 s peaks indicates that different molecular and atomic oxygen species are superimposed.

Figure 45:
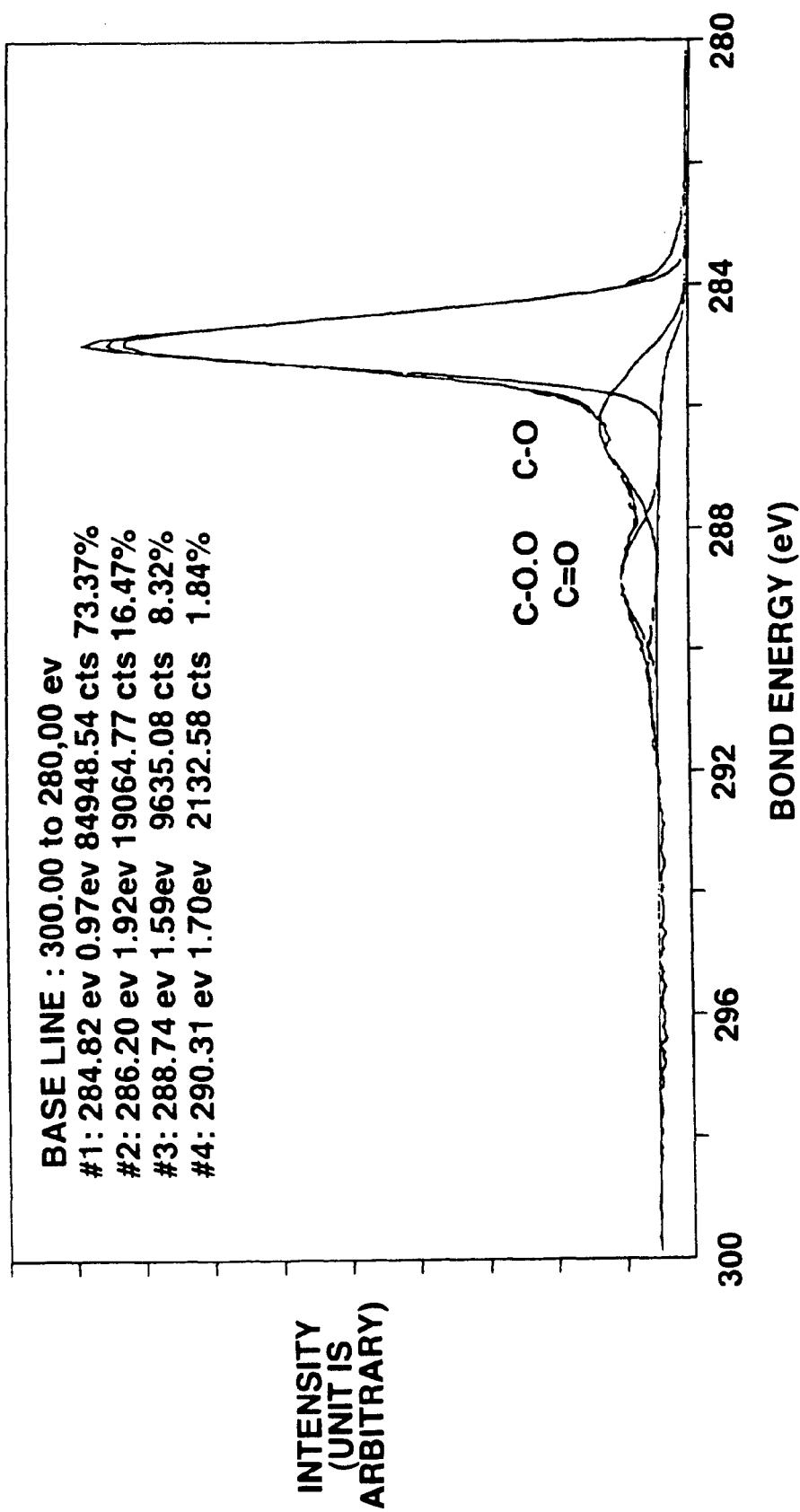
FIG. 45 is a C is peak distribution diagram of the fullerene polymer film.

FIG. 45 shows the peak analyses of C 1 s of the plasma processed films. Peaks were found at 284.8 (284.7), 286.2 (286.1) and 288.7 (288.6) eV. The subpeaks correlate to C—O, C—O—O and C=O superimposed by shake-up features.

Figure 46:
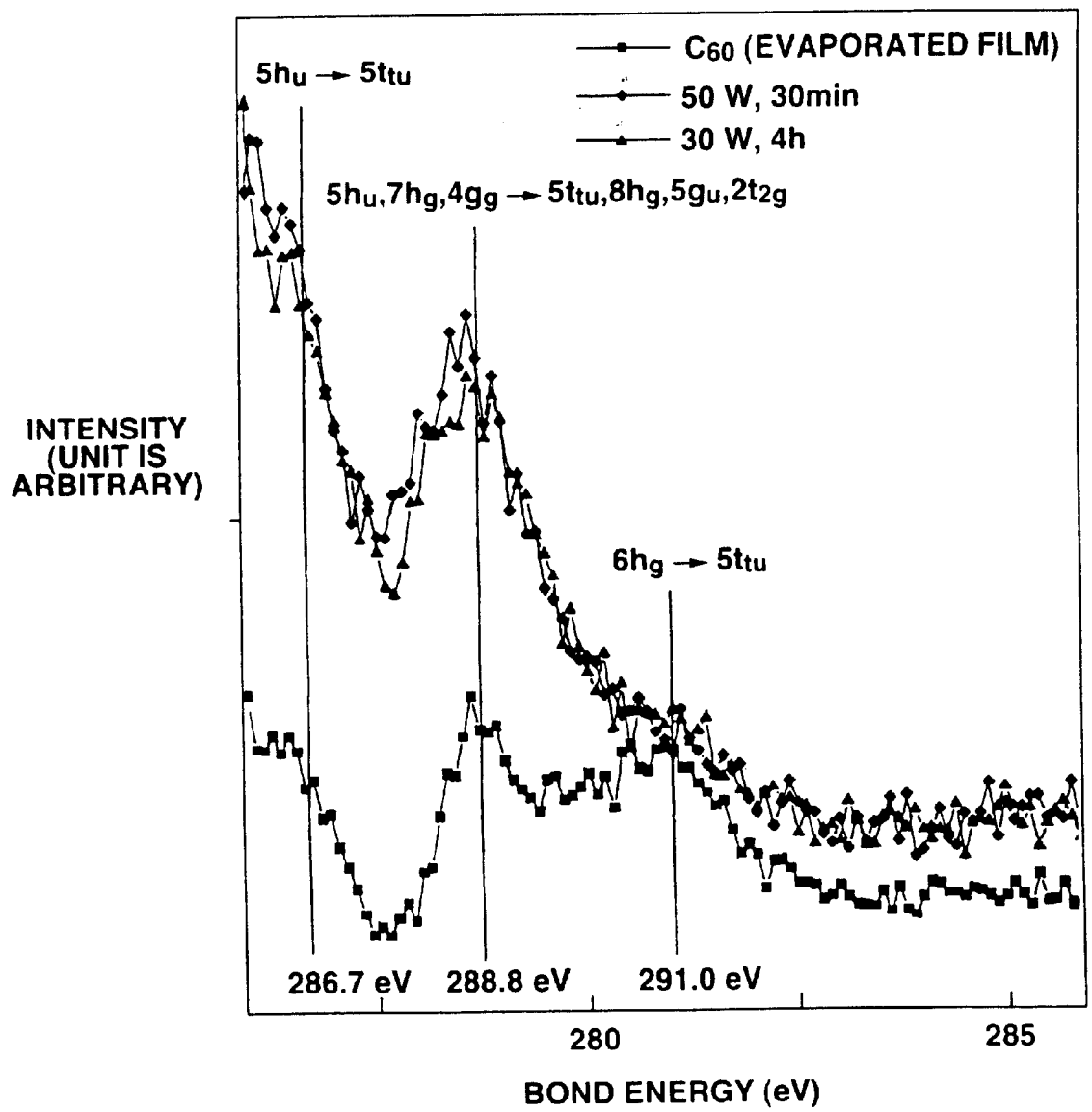
FIG. 46 is a spectrum diagram showing a shake-up satellite area of the fullerene polymer film.

FIG. 46 illustrates the expanded region covering the C 1 s shake-up satellites. Five bands were separated by C60 by high-resolution photoelectron spectroscopy at 1.8, 2.9, 3.7, 4.8 and 5.9 eV relative to the C 1 s binding energy. Three of these peaks were resolved for the evaporated C60 film, but not the peaks at 2.9 and 4.8 eV. The observation of the shake-up satellites of the plasma processed films is somewhat problematic because they are strongly superimposed by the emission from oxidized carbon species.

Figure 47:
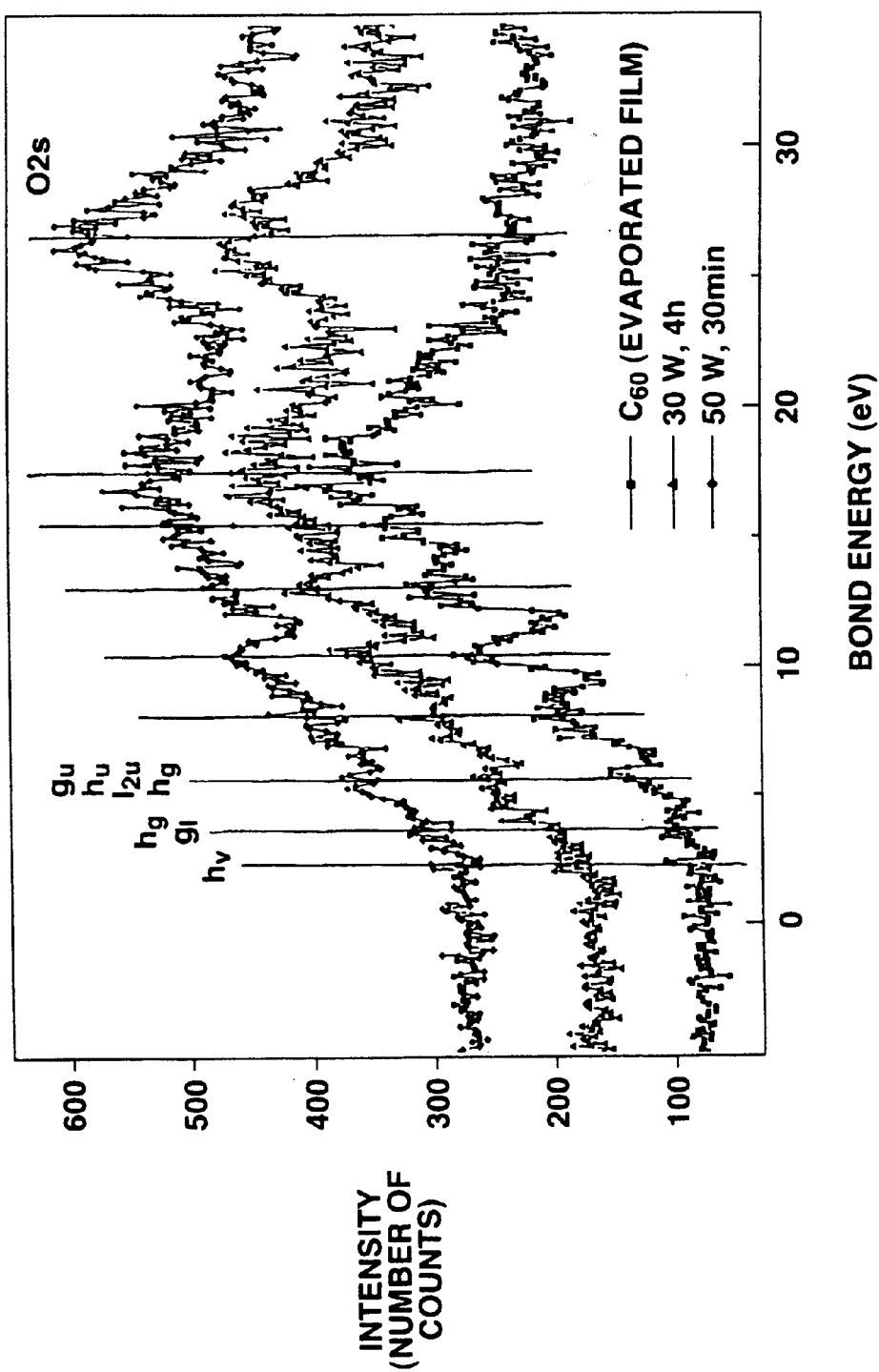
FIG. 47 is a is a valence coupling XPS spectral diagram of the fullerene polymer film according to the present invention.

FIG. 47 shows the XS valence band spectra of the evaporated C60 film and the plasma processed films. It is apparent that the peaks of the plasma processed becomes broader and reduced in intensity. In addition to the carbon states, the O2 s peak appears at about 27 eV.

TOF-MS

Figure 48:
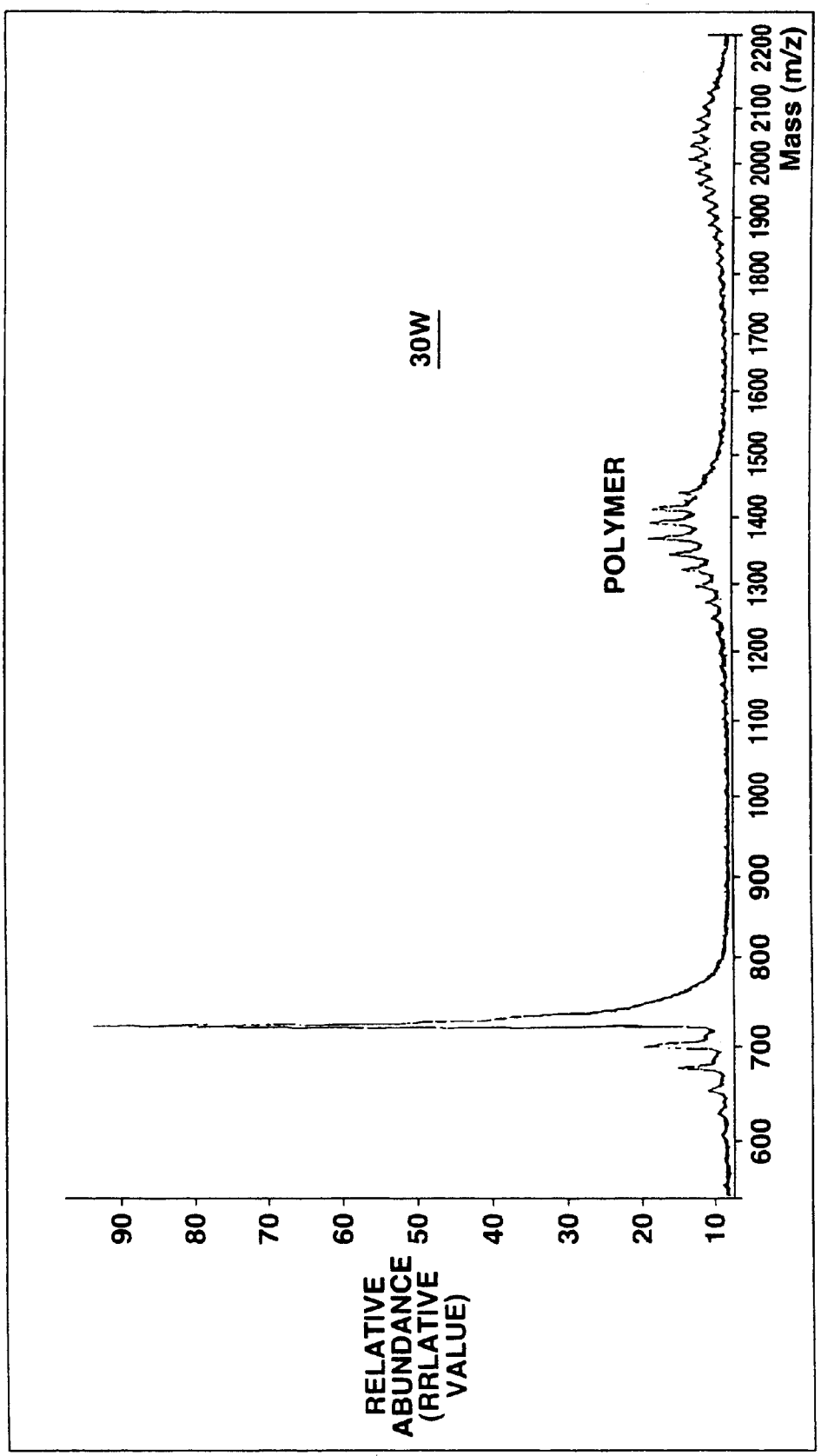
FIG. 48 is a TOF-MS spectral diagram of the fullerene polymer film obtained by the plasma processing.
Figure 49:
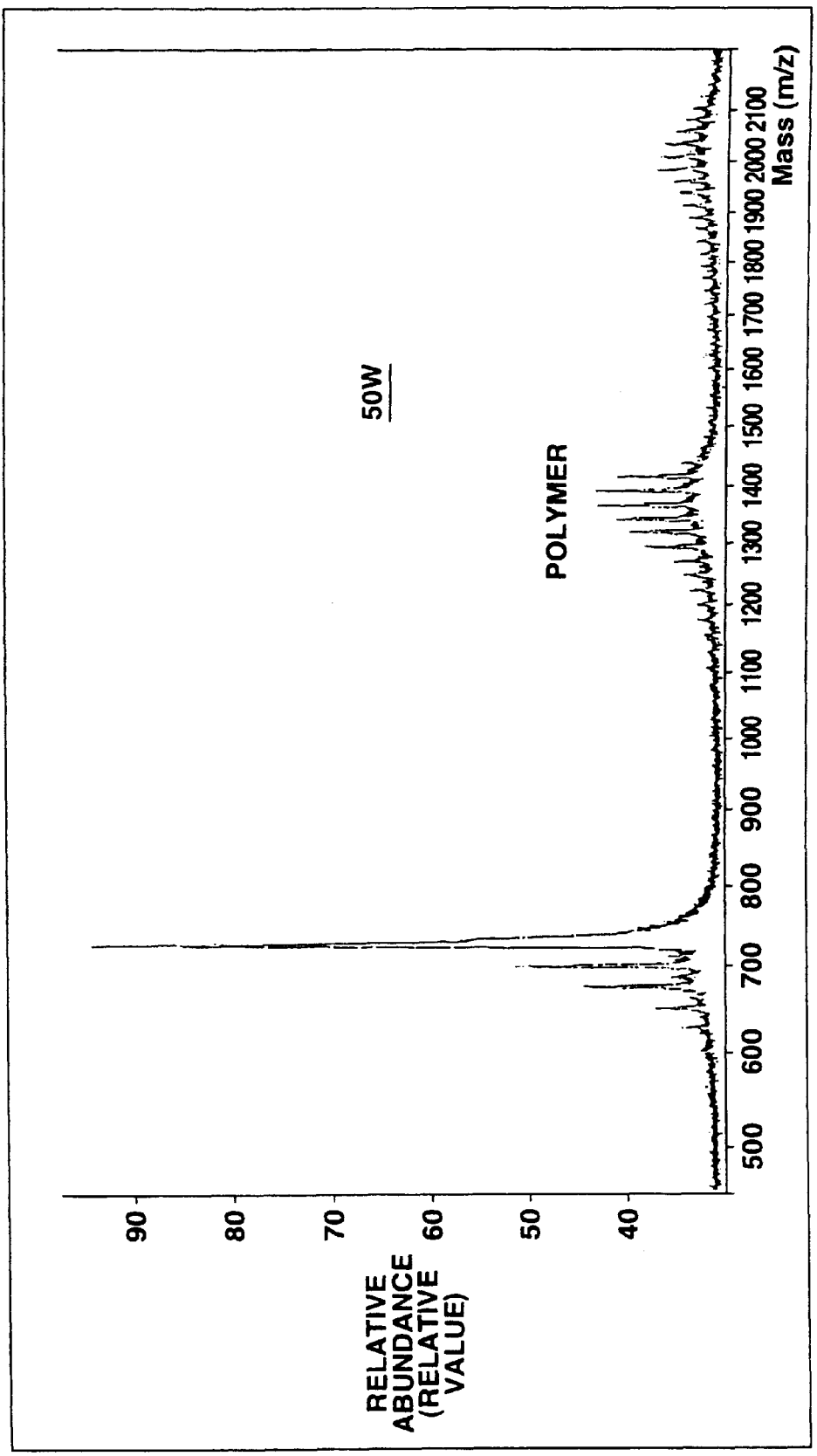
FIG. 49 is a TOF-MS spectrum diagram of the fullerene polymer film obtained by the plasma processing.

FIGS. 48 and 49 show the TOF-MS spectra of the plasma processed films. In the spectra occur peaks in the mass range of about 1440, which are attributable to fullerene polymer. Also, the C60 structure is retained.

The results of Raman, XPS and TOF-MS confirm that the plasma processing of evaporated COO films resulted in polymerized C60. The described method opens a new route to polymerize C60 by plasma.

EXAMPLE 17

Preparation and Performance of Photocatalyst

The function as the catalyst of the layered product of the structure of FIG. 6A comprised of the polyethylene terephthalate film and the fullerene polymer film formed thereon by the method described above were evaluated using the evaluation device shown in FIG. 42 as in Examples 1 to 16. In this evaluation device, a 40 W UV lamp 61, connected to a power source, is mounted in an aluminum tube 60 of 30 cm length, one end of the lamp 61 being connected to a Teflon cap 62 provided at an outlet of the tube 60, an inlet of which is connected with a tube 65 to a sample gas pump 63 and a filter for moisture removal 64. On the inner wall of the tube 60 is bonded the layered product 66 with an adhesive.

Into this tube 60 of the evaluation device, dry air containing 500 ppm of formaldehyde was forced from the pump 63, without the intermediary of the filter 64, whilst the UV lamp 61 was lit. The flow rate of the dry air was approximately one second from the inlet to the outlet of the tube 60.

After the UV lamp 61 was lit, the concentration of formaldehyde contained in the outlet gas was measured with gas chromatography. The measured results indicated that the concentration of formaldehyde contained in the gas decreased to 280 ppm.

EXAMPLE 18

Preparation of and Performance of Other Photocatalysts

A fullerene polymer film was formed on a polyethylene terephthalate film as in Example 6, and a minor quantity of fine platinum particles were evaporated on the surface of this fullerene polymer film, using an electron gun, in 10 to 9 Torr vacuum.

The function as the catalyst of this layered product of polyethylene terephthalate film and the fullerene polymer film, carrying fine platinum particles on its surface, was evaluated, using the following evaluation device. The function as the catalyst of the layered product of the polyethylene terephthalate film and the fullerene polymer film, carrying the fine platinum particles on its surface, was evaluated using the following measurement device. This measurement device is comprised of the evaluation device of FIG. 43 less the pump 53 and the filter 54 and plus a gas bomb in which was charged dry air containing 500 ppm of formaldehyde. This gas bomb was prepared by placing an order on a gas purveying company. The aforementioned layered product is bonded to the inner wall of the tube of the evaluation device, as in Example 1.

From the gas bomb, a dry gas containing 500 ppm of formaldehyde was charged into the tube of the evaluation device, whilst a UV lamp was lit. The flow rate of the dry air was adjusted to approximately 1 second from the inlet to the tube outlet. After the UV lamp was illuminated, the concentration of formaldehyde contained in the outlet gas was measured with gas chromatography. The measured results indicated that the concentration of formaldehyde contained in the gas decreased to 140 ppm.

What is claimed is:

1. A photocatalyst having a fullerene polymer film consisting essentially of fullerene molecules bonded together by covalent bonds.

2. The photocatalyst according to claim 1 wherein the fullerene polymer film is layered on a substrate.

3. The photocatalyst according to claim 1 wherein said fullerene polymer film is a film obtained on polymerizing fullerene molecules by electron beam polymerization, electromagnetic wave polymerization or electronic polymerization.

4. The photocatalyst according to claim 1 wherein said fullerene polymer film is a film obtained on polymerizing C60 or C70 fullerene molecules.

5. The photocatalyst according to claim 1 wherein fine metal particles are carried on the surface of said fullerene polymer film.

6. The photocatalyst according to claim 5 wherein said fullerene polymer film is layered on a substrate.

7. The photocatalyst according to claim 5 wherein said fine metal particles are carried by sputtering, evaporation or coating on said fullerene polymer film.

8. The photocatalyst according to claim 5 wherein said fine metal particles with a particle size of 0.5 nm to 100 $\mu$m are distributed on said fullerene polymer film with an area proportion of $1000000/m^2$.

9. The photocatalyst according to claim 5 wherein said fine metal particles are fine particles of platinum or palladium.

10. A method for producing a photocatalyst comprising:
    forming a fullerene polymer film with polymerizing fullerene molecules bonded together by covalent bonds by electron beam polymerization, electromagnetic wave polymerization or electronic polymerization; and
    getting fine metal particles carried by sputtering, evaporation or coating on the surface of said fullerene polymer film.

11. The method for producing a photocatalyst according to claim 10 wherein
    said fullerene polymer film is formed on a substrate.

12. The method for producing a photocatalyst according to claim 10 wherein
    said fullerene polymer film is formed using C60 and/or C70 fullerene molecules as a starting material for polymerization.

13. The method for producing a photocatalyst according to claim 10 wherein
    said fine metal particles with a particle size of 0.5 nm to 100 $\mu$m are distributed on said fullerene polymer film with an area proportion of $1000000/in^2$.

14. The method for producing a photocatalyst according to claim 10 wherein
    fine particles of platinum or palladium are carried as said fine metal particles.

15. A gas decomposition method comprising a step of contacting a gas under light illumination for decomposition with a fullerene polymer film consisting essentially of fullerene molecules bonded together by covalent bonds.

16. The gas decomposition method according to claim 15 wherein said gas for decomposition is contacted with a reaction unit having a supplying section for said gas for decomposition and an exhaust unit; and wherein light is illuminated from a light source to said fullerene polymer film.

17. The gas decomposition method according to claim 16 wherein a light source capable of illuminating the ultra-violet light is used as said light source.

18. The gas decomposition method according to claim 15 wherein active oxygen is generated by light illumination on said fullerene polymer film and wherein said gas for decomposition is decomposed by said active oxygen.

19. The gas decomposition method according to claim 15 wherein said fullerene polymer film is a film previously layered on a substrate.

20. The gas decomposition method according to claim 15 wherein a film obtained on polymerizing fullerene molecules by electron beam polymerization, electromagnetic wave polymerization or electronic polymerization is used as said fullerene polymer film.

21. The gas decomposition method according to claim 15 wherein said fullerene polymer film is a film obtained on polymerizing C60 or C70 fullerene molecules.

22. The gas decomposition method according to claim 15 wherein a fullerene polymer film carrying fine metal particles on its surface is used as said fullerene polymer film.

23. The gas decomposition method according to claim 22 wherein a fullerene polymer film previously layered on a substrate is used as said fullerene polymer film.

24. The gas decomposition method according to claim 22 wherein said fine metal particles are carried by sputtering, evaporation or coating on said fullerene polymer film.

25. The gas decomposition method according to claim 22 wherein said fine metal particles are of a particle size of 0.5 nm to 100 $\mu$m and are distributed with an area proportion of 1000000/m$^2$ on said fullerene polymer film.

26. The gas decomposition method according to claim 22 wherein fine particles of platinum or palladium are used as said fine metal particles.

* * * * *

UNITED STATES PATENT AND TRADEMARK OFFICE
CERTIFICATE OF CORRECTION

PATENT NO. : 6,471,929 B1
DATED : October 29, 2002
INVENTOR(S) : Misao Kusunoki et al.

It is certified that error appears in the above-identified patent and that said Letters Patent is hereby corrected as shown below:

Title page,
Item [73], Assignee, "Sony Corporation, Tokyo (JP)" should read
-- Sony Corporation,Tokyo (JP) and Research Institute of Innovative Technology for the Earth, Kyoto, (JP) --.

Signed and Sealed this

Twenty-seventh Day of December, 2005

JON W. DUDAS
*Director of the United States Patent and Trademark Office*